United States Patent
McGaughy

(10) Patent No.: US 7,328,143 B2
(45) Date of Patent: *Feb. 5, 2008

(54) SYSTEMS AND METHODS FOR EFFICIENTLY SIMULATING ANALOG BEHAVIOR OF DESIGNS HAVING HIERARCHICAL STRUCTURE

(75) Inventor: Bruce W. McGaughy, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/059,056

(22) Filed: Feb. 15, 2005

(65) Prior Publication Data

US 2005/0149311 A1    Jul. 7, 2005

Related U.S. Application Data

(63) Continuation of application No. 09/969,923, filed on Oct. 3, 2001.

(60) Provisional application No. 60/237,936, filed on Oct. 3, 2000.

(51) Int. Cl.
G06F 17/50    (2006.01)

(52) U.S. Cl. ............... 703/14; 703/13; 703/15; 716/1; 716/3; 716/5; 716/6; 716/7

(58) Field of Classification Search .......... 703/13, 703/14, 15; 716/1, 3, 5–7
See application file for complete search history.

(56) References Cited

U.S. PATENT DOCUMENTS 6,134,513 A * 10/2000 Gopal ............... 703/14
6,148,433 A * 11/2000 Chowdhary et al. ........... 716/1
6,381,563 B1 * 4/2002 O'Riordan et al. ........... 703/14
6,577,992 B1    6/2003 Tcherniaev et al.
7,143,021 B1 * 11/2006 McGaughy et al. .......... 703/14
2003/0163297 A1    8/2003 Khaira et al.
2005/0143966 A1    6/2005 McGaughy
2005/0149312 A1    7/2005 McGaughy

OTHER PUBLICATIONS

Beatty, D. et al. (1988). "Fast Incremental Circuit Analysis Using Extracted Hierarchy," 25th *ACM/IEEE Design Automation Conference*, Paper 33.1, pp. 495-500.

(Continued)

*Primary Examiner*—Kamini Shah
*Assistant Examiner*—Herng-der Day
(74) *Attorney, Agent, or Firm*—Morrison & Foerster LLP

(57) ABSTRACT

A method for building a hierarchical representation of a circuit for simulation includes 1) receiving a source file containing SPICE-like netlist descriptions of the circuit in a flattened representation; 2) generating a primitive database using the source file, where the primitive database includes a geometries-describing section for storing a plurality of primitive subcircuit blocks; 3) generating an instance database using the geometries-describing section, where the instances database includes instance subcircuit blocks corresponding to explicitly-expressed primitive subcircuit blocks with predefined geometric values; 4) generating a simulation database using the instance database, where the simulation database includes simulation subcircuit blocks corresponding to fully-flattened instance subcircuit blocks; and 5) simulating the circuit using the simulation database, the instance database, and the primitive database.

27 Claims, 15 Drawing Sheets

OTHER PUBLICATIONS

Jiang, X. et al. (1999). "Optimal quadratic-time isomorphism of ordered graphs," *Pattern Recognition*, 32: 1273-1283.

Kevenaar, T. et al. (1991). "A Flexible Hierarchical Piecewise Linear Simulator," *INTEGRATION, the VLSI Journal*, 12:211-235.

Saviz, P. et al. (Jun. 1993). "Circuit Simulation by Hierarchical Waveform Relaxation," *IEEE Transactions on Computer-Aided Design of Integrated Circuits and Systems*, 12(6):845-860.

Saviz, P. et al. (1988). "PYRAMID—A Hierarchical Waveform Relaxation-Based Circuit Simulation Program," *IEEE*, pp. 442-445.

Pillage, L.T. et al. (1995). "Linear dc Nodal Analysis," Chapter 2 *In Electronic Circuit and System Simulation Methods*. McGraw-Hill, Inc.: New York, NY, pp. 27-45.

Pillage, L.T. et al. (1995). "Simulation of Nonlinear Circuits," Chapter 10 *In Electronic Circuit and System Simulation Methods*. McGraw-Hill, Inc.: New York, NY, pp. 285-314.

Saleh, R.A. et al. (1990). "Electrical Simulation Techniques," Chapter 2 *In Mixed-Mode Simulation*. Kluwer Academic Publishers: Norwell, MA, pp. 19-44.

* cited by examiner

315

317

Mostly-Flattened /Slightly-Budded Design Description

318

De-bud (Absorb) to Fully-Flatten

Heavily-Hierarchical /Highly-Budded

319

Simulation Leaders

Simulation Followers

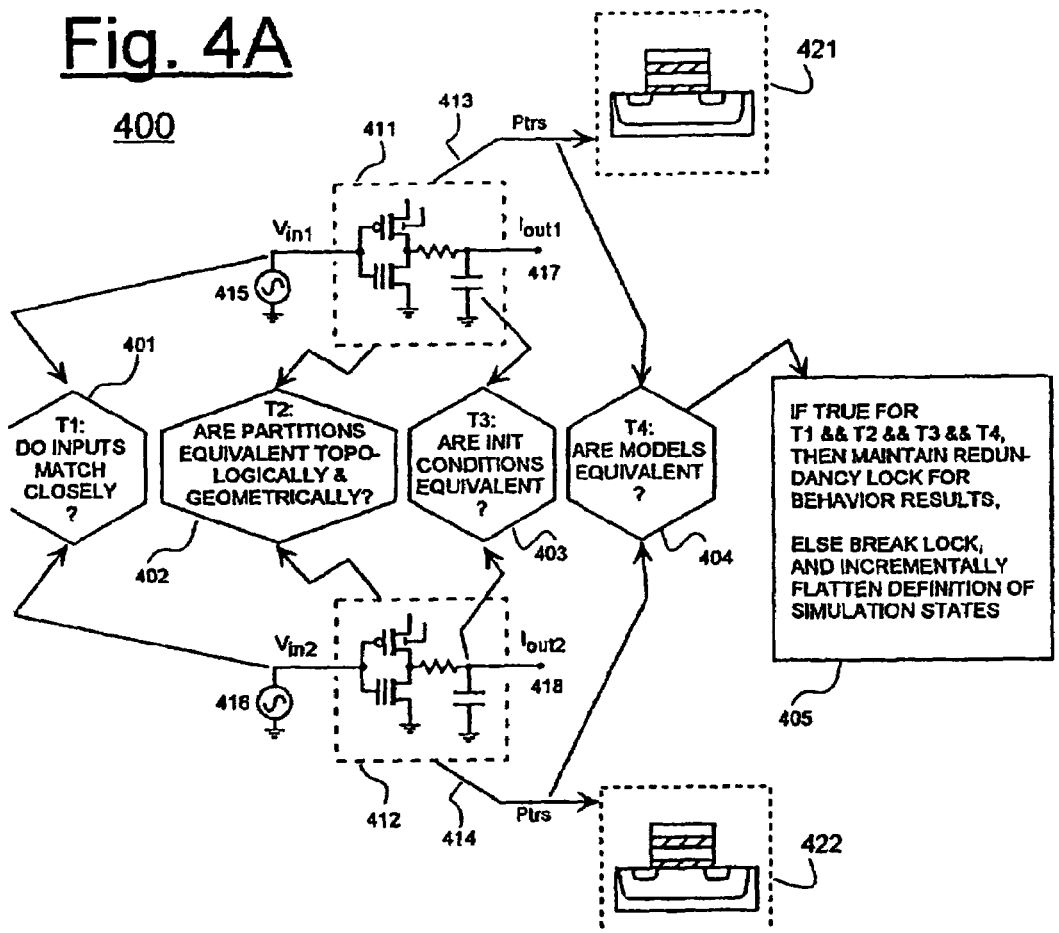
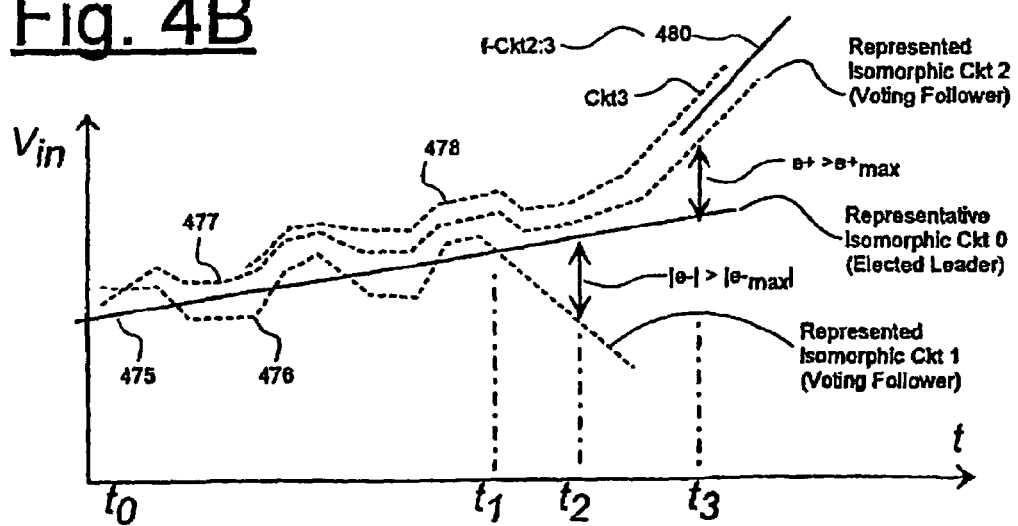

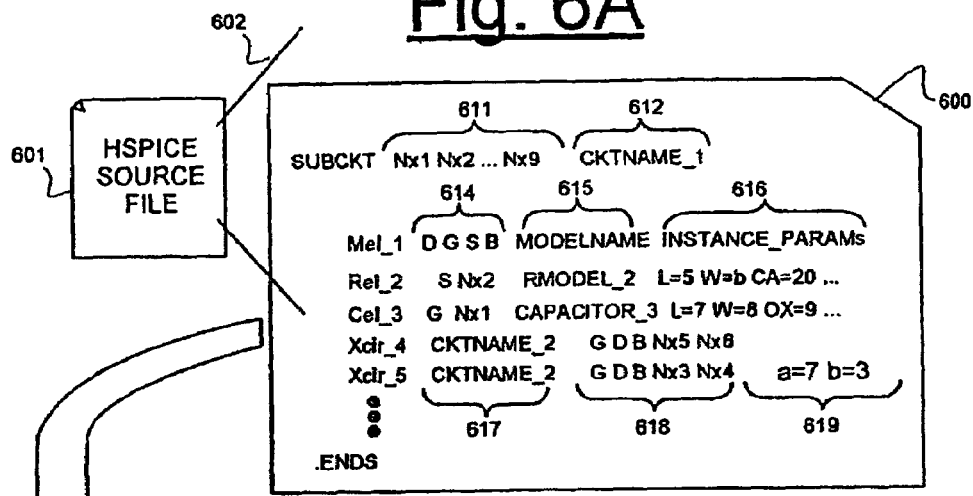
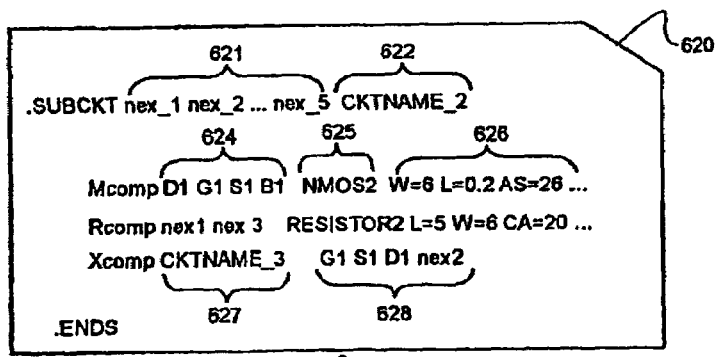
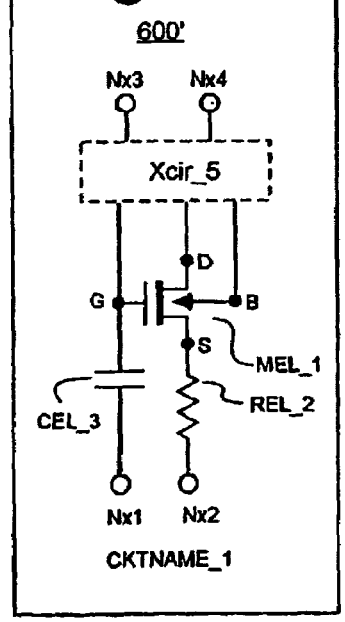

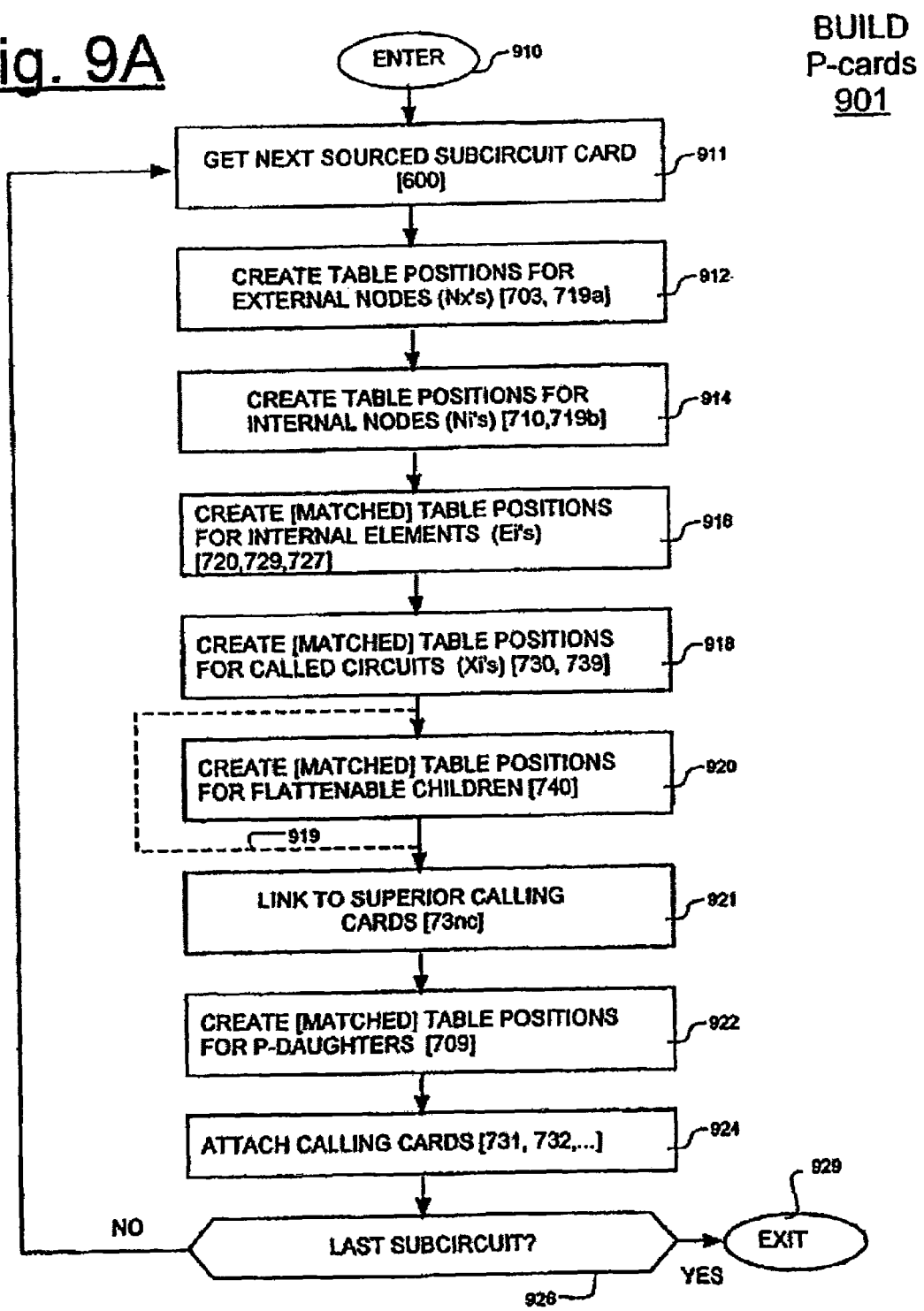

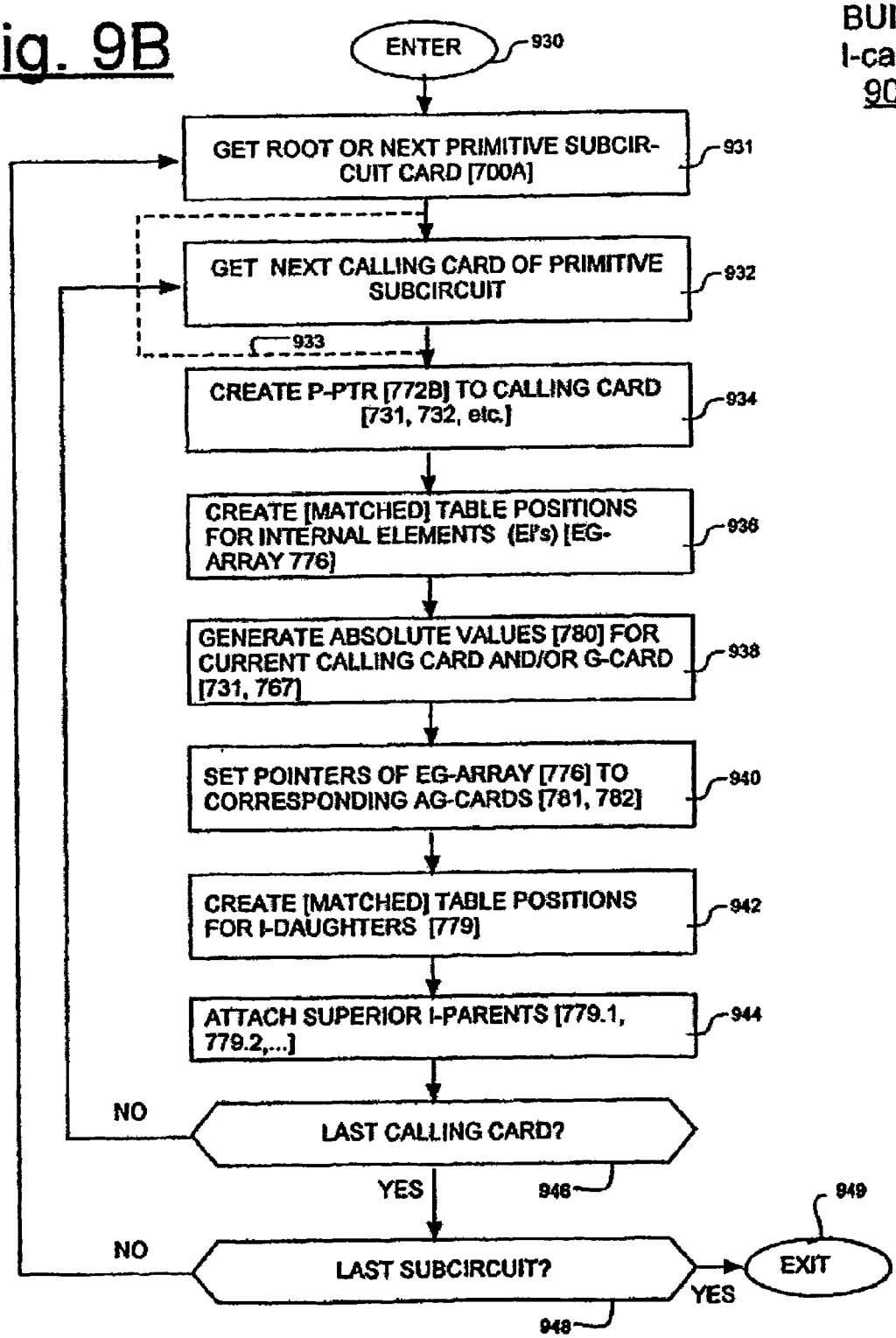

SYSTEMS AND METHODS FOR EFFICIENTLY SIMULATING ANALOG BEHAVIOR OF DESIGNS HAVING HIERARCHICAL STRUCTURE

RELATED APPLICATIONS

This application is a continuation application and claims the benefit of co-pending U.S. application Ser. No. 09/969,923, "Systems and Methods for Efficiently Simulating Analog Behavior of Designs Having Hierarchical Structure," filed on Oct. 3, 2001, which claims the benefit of application Ser. No. 60/237,936, "Systems and Methods for Efficiently Simulating Analog Behavior of Designs Having Hierarchical Structure," filed on Oct. 3, 2000, both of which are incorporated herein in their entirety by reference.

FIELD OF DISCLOSURE

The disclosure is generally directed to the problem of predicting with simulation the analog behavior of complex electrical circuits and the like. The disclosure is more specifically directed to machine-implemented simulation of electrical circuits, where the simulated circuits may have relatively high component density and may have hierarchical circuit structuring.

BACKGROUND

1. Cross Reference to Background Materials

The following publications (A)-(G) are not all from same fields of endeavor and terms used in some of them are not necessarily of same exact meanings as terms used herein because of differences in context. Nevertheless, the contents of these prior publications may be useful in assisting in understanding of the novel concepts presented herein, and thus these background publications may considered as being incorporated herein by reference for the purpose of providing additional background information:

(A) Resve Saleh, Shyh-Jye Jou, and A. Richard Newton, "Mixed-mode Simulation and Analog Multilevel Simulation", Kluwer Academic Publishers, Massachusetts, 1994, ISBN 0-7923-9473-9;

(B) Lawrence Pillage, Ronald Rohrer, and Chandramouli Visweswariah, "Electronic Circuit and System Simulation Methods", McGraw-Hill Inc., New York, 1995, ISBN 0-07-0501169-6;

(C) D. L. Beatty, R. E. Bryant, "Fast Incremental Circuit Analysis Using Extracted Hierarchy", IEEE 1988, 25th ACM/IEEE Design Automation Conference, pp 495-500;

(D) Xiaoyi Jiang and Horst Bunke, "Optimal Quadratic-time Isomorphism of Ordered Graphs", Elsevier Science Ltd, 1999, Journal of the Pattern Recognition Society;

(E) Peter Saviz and Omar Wing, "PYRAMID—a Hierarchical Waveform Relaxation-based Circuit Simulation Program", IEEE, 1988, pp 442-445;

(F) Peter Saviz and Omar Wing, "Circuit Simulation by Hierarchical Waveform Relaxation", IEEE, 1993, IEEE Transactions on Computer-Aided Design of Integrated Circuits and Systems, Vol. 12, pp 845-860; and (G) T. Kevenaanr and D. Leenaerts, "A Flexible Hierarchical Piecewise Linear Simulator", Elsevier Science Publishers B.V., 1991, VLSI Journal 12, pp 211-235.

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

GENERAL BACKGROUND

It is often desirable in the microelectronics industry to be able to implement physical solutions in as little time as possible for coping with new market opportunities and/or emerging problems. Computer-provided simulations are often used to predict the behaviors of to-be-manufactured electrical circuits or other like systems. This is preferably done before the electrical circuits are finalized so that design errors may be corrected and design parameters may be optimized prior to mass production. It is well known, for example, to use computers and software simulators such as SPICE for obtaining fairly accurate predictions of the analog behaviors of complex circuitry.

Other examples of analog-behavior simulators include HSPICE™ (available from Avant Corp. of California), SPICE-3™ (available from Berkeley University of California), SPECTRE™ (available from Cadence Corp. of California), ACES™ Adaptively Controlled Engine Simulator), and ITA™ (Interactive Timing Analysis engine). These simulators and/or simulation engines are not to be confused with digital-behavior simulators such as VHDL which predict behavior of gate-level and lower-resolution hardware descriptions (e.g., register transfer level) in the digital realm rather than at the finer resolution of transistor-level signals and in the analog realm.

SPICE-like simulations can provide fairly accurate predictions of how correspondlng circuits will be behave when actually built. The predictions are preferably made not only for individual subcircuits but also for whole systems (eg., whole integrated circuits) so that system-wide problems relating to noise and the like can be uncovered and dealt with.

However, SPICE-like simulation of whole systems becomes more difficult and problematic as the industry continues its relentless trek of scaling down to smaller and smaller device geometries as is predicted by Moore Law and of cramming more interconnected components into system. An example of such down scaling is the recent shift from micron-sized channels toward deep submicron sized transistor lengths. Because of this, circuit designers are able to cram exponentially larger numbers of basic components or 'elements' (e.g., transistors, diodes, capacitors) into a given integrated circuit (IC) or other such, mass-producible device.

Due to the shortened time-to-market pressures in the industry, the designers of these mass-producible systems (e.g., IC's) want the makers of pre-fabrication SPICE-like simulators to come up with new ways for quickly and accurately predicting the system-wide behaviors of these exponentially more dense and more complex, interconnected system designs. This is not as easily done as it may sound.

In designs that employ hierarchical structuring, however, opportunities do exist for taking advantage of the redundant behaviors that are sometimes exhibited by structurally redundant subcomponents (isomorphic subsets) of the hierarchical structure. Rather than instantiating and simulating individually, all the redundant subcomponents of a system, it is possible to pick one of many, alike subcomponents and to consider the picked subcomponent as having a behavior that is representative of the behaviors of the others. The predicted behavior results obtained for the representative one subcomponent may be duplicated for the others without repeating computationally-intense simulation processing for each of the mirror-wise alike subcomponents. As such, significant amounts of computing time and computational resources may be saved if redundant subcomponents can be identified and their behaviors can be predicted in this way.

Examples of integrated circuits which tend to exhibit hierarchical structuring include high-density memory chips such as SRAMs, DRAMs, EEPROMs, etc. Parallel data processing systems and telecommunication systems also tend to have hierarchical structures with redundant subcomponents.

Given the above, there is still the problem of how to efficiently identify redundant subcomponents and how to efficiently take advantage of their redundant behaviors during simulation of hierarchical systems. Also there are times when end users do not want to take advantage of hierarchical structuring and instead want to simulate a, so-called fully flattened model. There is the problem of how to provide end users with the capability under one system of performing both hierarchically-mapped and fully flattened model simulations.

SUMMARY OF DISCLOSURE

Systems, methods, and data structures are provided in accordance with the present disclosure of invention for efficiently simulating analog behavior of designs that can have fully hierarchical model structures and/or partially-flattened model structures and/or fully-flattened model structures.

In brief, complex and detailed SPICE-like source files may be converted into simpler and abstracted, graph-topology-defining data structures (TDB) and into model-parameter-defining data structures (GDB) and into name-defining data structures (NDB). The abstracted, topology-defining data structures may be analyzed to identify subcircuits that have alike, interconnect graphs or topologies. The model-parameter-defining data structures, may be analyzed to identify subcircuits that have alike, model-parameters (e.g., absolute geometry values). Given such identifications of alike connection-graph topologies and alike model-parameters, isomorphic instances of subcircuits can be identified. Given further identification of isomorphic instances whose external states are substantially close to one another, shared simulation of substantially isostatic and isomorphic instances may be carried out.

A tracking method in accordance with the disclosure maintains tracking between topology-defining data structures and corresponding model-parameter-defining data structures by using an updatable naming database (NDB) that assigns index numbers or like generic symbols to those of the topology-defining data structures and model-parameter-defining data structures which belong to a same instantiation. Common index numbers (or like generic symbols) may be used to implicitly keep track of the underlying physical ties between the separatable topology-defining data structures and the model-parameter-defining data structures so that these may be reintegrated after they are analyzed for identifying topologically-alike and parameter-wise-alike subcircuits.

An instantiating method in accordance with the disclosure provides a shared pool of absolute-value data structures (e.g., AG-cards) that are pointed to by instantiating pointers, where each instantiating pointer corresponds to an instantiable element or an instantiable module. A search-and-merge mechanism automatically merges alike ones of the absolute-value data structures and repoints their respective pointers to the merger result. Isomorphic elements and/or modules can be identified by the pointing of their respective, instantiating pointers to a same, absolute-value data structure (e.g., same AG-card or set of AG-cards).

A method for finding isostatic instances in accordance with the disclosure provides one or more state convergence detectors which automatically detect when external states of isomorphic instances have converged to be close enough to one another to be considered, when given predefined threshold criteria, relatively isostatic. A method for finding instances that are not isostatic, in accordance with the disclosure provides one or more state divergence detectors which automatically detect when external states of isomorphic instances have diverged to be far enough apart from one another to be considered, when given predefined threshold criteria, relatively non-isostatic.

A shared simulation method in accordance with the disclosure provides a shared combination of a simulation leader part (S-part) and a simulation driver for predicting the behavior of a plurality of tokenized, follower parts (S-handles). The method reflects the-prediction results of the simulation leader part to external nodes of the tokenized, follower parts.

Further in accordance with the disclosure, a partitioning and push-out operation (budding-out operation) can be performed on instantiated subcircuit definitions prior to allocation of simulation states to various circuit nodes and elements. This partitioning and push-out operation may be used to increase the likelihood that isomorphic instances of subcircuit definitions will be found, grouped around a leader if also isostatic, and thereby used for shared simulation. A first simulation-supporting data structure (P-circuit) in accordance with the disclosure comprises: (a) a T-circuit card and (b) a G-card; wherein the T-circuit card provides interconnect information defining interconnects between nodes, elements and called subcircuits (X-circuits) of a given subcircuit and further wherein the G-card provides formula-based instantiation information for enabling instantiation into absolute values, of model parameters of the elements of the given subcircuit.

A second simulation-supporting data structure (I-circuit) in accordance with the disclosure comprises: (a) a direct or indirect first pointer (P-Ptr) to a corresponding P-circuit data structure; (b) an array of second pointers (EG's array) corresponding to elements of the P-circuit and pointing to absolute instantiating data for those elements; and (c) an array of third pointers (Idaughters array) corresponding to hierarchical daughters of the I-circuit and pointing directly or indirectly to the I-circuit data structures of such daughters, if any.

A third simulation-supporting data structure (S-circuit) in accordance with the disclosure comprises: (a) a direct or indirect first pointer (I-Ptr) to a corresponding I-circuit data structure; (b) an array of leaf handle declarations, if any, pointing to respective S-parts; and (c) an array of nonleaf handle declarations, if any, pointing to respective daughter S-circuits.

A simulation-supporting machine system in accordance with the disclosure comprises: (a) Primitives-containing database (PDB); (b) an Instances-containing database (IDB); (c) a simulation-leaders and followers-containing database (SDB); (d) an instances building mechanism interposed between the PDB and IDB; (e) an S-parts builder and reducer for expanding and/or reducing during simulation to an on-the-fly changeable definition of what are isostatic follower parts and what are respective, an isostatic simulation-leaders in the SDB; and (f) one or more plug-in simulation drivers for driving the behavior predictions of a corresponding one or more simulation-leaders.

Other aspects of the disclosure will become apparent from the below detailed description.

BRIEF DESCRIPTION OF THE DRAWINGS

The below detailed description makes reference to the accompanying drawings, in which:

FIG. 4A schematically illustrates how a redundant-behavior lock (leader-follower relationship) may be established between isomorphic subcomponents of a design description when it is determined that the behaviors of such isomorphic subcomponents should be substantially the same;

FIG. 4B graphically illustrates how a redundant-behavior lock may be broken as input signals of isomorphic structures stray away from old, closely-following conditions and/or towards new, closely-following conditions during a simulation run;

FIG. 6A provides an introductory example of how HSPICE subcircuit descriptions may appear within a source HSPICE file;

FIG. 6B is a schematic representation of part of the subcircuit exemplified by FIG. 6A;

FIG. 9A is a flowchart of a machine-implemented process in accordance with the disclosure that may be used for converting SPICE-like source data-structures, into more abstracted, T-circuit data-structures and G-card data-structures; and FIG. 9B is a flowchart of a machine-implemented process in accordance with the disclosure that may be used for converting T-circuits and G-circuits into absolutely-instantiated I-circuit data structures.

DETAILED DESCRIPTION

Figure 1:
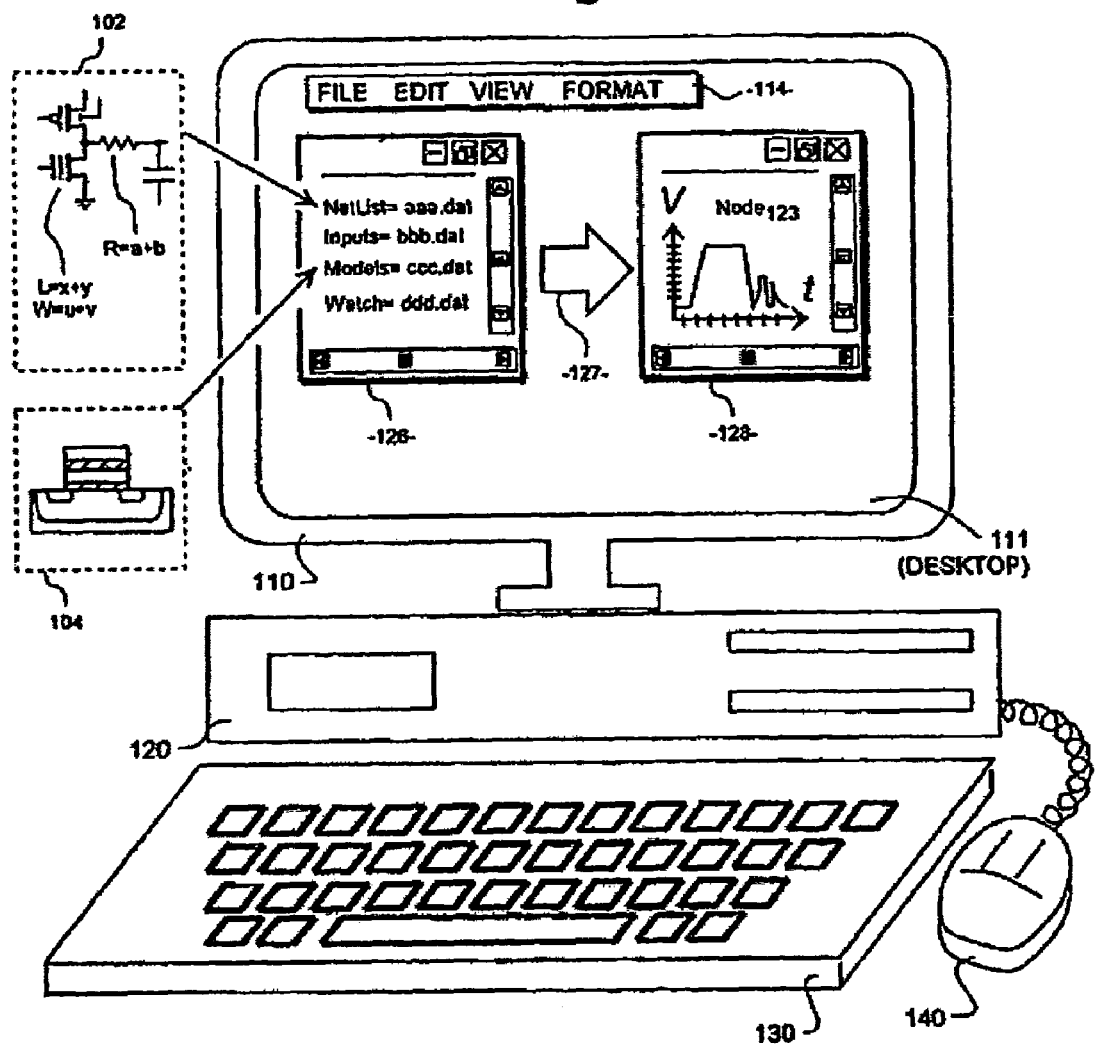
FIG. 1 includes a perspective view of a computer system that may be configured to perform simulations in accordance with the disclosure.

FIG. 1 illustrates a perspective view of an overall computer system 100 that may be programmably configured to operate in accordance with the disclosure. This view will be used to introduce basic aspects of accurately-simulating the analog behaviors of interconnected physical devices and it will be further used to explain the dilemmas that simulator designers face as the component density of simulated systems increase.

The illustrated computer system 100 includes a display monitor 110, a computer housing 120, a keyboard 130 and a mouse 140. User input and output devices 110, 130 and 140 are merely examples. Other to-user output devices, and from-user input devices may, of course, be used in addition to or in place of the illustrated peripherals.

Figure 2:
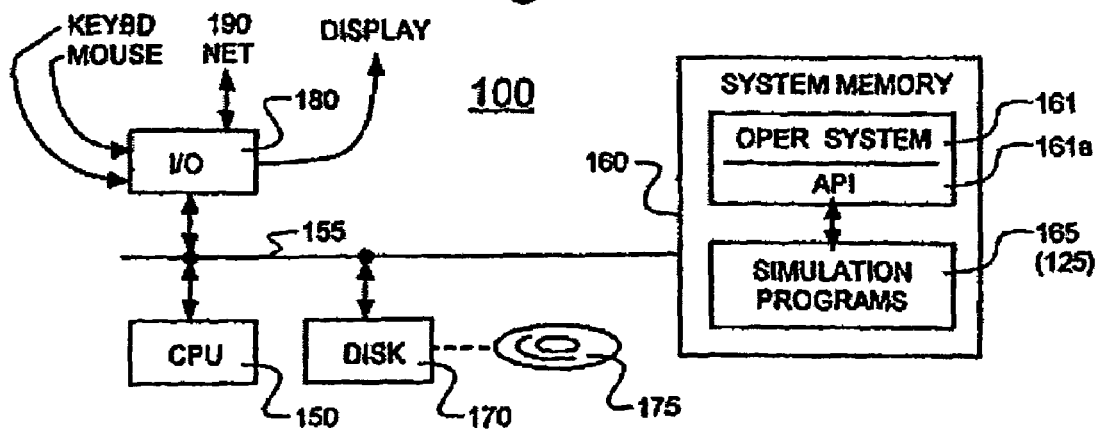
FIG. 2 is a block diagram of a computer system that maybe configured to operate in accordance with the disclosure.

Display monitor 110 includes a display screen 111 that can display a number of graphical items including a desktop layer and overlying windows generated by an opened application window 114. (Reference numbers that are braced by dashes are not part of what is displayed on the screen 1.11.) In the illustrated example, the opened application window 114 contains information belonging to a running simulation program 125 (FIG. 2). A first subwindow 126 shows a list of input or source files that may be received by the simulation program (125) while a second subwindow 128 illustrates a result that may be produced by the simulation program (125). Icon 127 is meant to represent the time consumed and computational resources used by the simulation program 125 from the time all required source files 126 are supplied to the time that desired result data 128 is produced. The simplified example in subwindow 126 shows a voltage versus time plot for a watched node identified as Node123. It is understood that the simulation-produced, result data 128 may represent many other forms of predicted physical behaviors for the electrical system that is to be built, where that built system is further used in accordance with the definitions provided by the design source files 126.

Typically, one of the design source files (126) is a net list (e.g., NetList=aaa.dat) that describes what primitive components are to be included, what geometric dimensions are to be used for such primitive components, and what interconnections (circuit topology) are to be made between the various components of the system that is to be simulated. Another design source file (e.g., Inputs=bbb.dat) may represent a set of testing vectors that are to be applied to the design for testing its behavior under given conditions. Yet another design source file (e.g., Models=ccc.dat) may define mathematical or graphical models for the various components or subcomponents of the to-be-simulated system. Yet another design source file (e.g., Watch=ddd.dat) may identify specific nodes or other parts of the simulated system that are to be watched and may describe which aspects of their behaviors are to be displayed in output window 128 (e.g., current versus time, and/or power versus time, and/or temperature versus time).

For purposes of visually providing a more concrete grasp of what may be involved here, box 102 of FIG. 1 schematically illustrates a possible portion of a source net list. In the example given by box 102, different kinds of transistors (e.g., P-channel MOSFET, N-channel floating gate MOSFET) are shown with respective interconnections being made between their respective source, drain, gate and body (substrate) terminals to one another or to other components or signal sources. The other components can include parasitic resistances and parasitic capacitances of interconnect lines. Physical attributes of the various components maybe expressed symbolically within the source net list 102. The resistance R of the illustrated resistance component may be symbolically expressed as R=a+b, where 'a' and 'b' may be variables or constants whose absolute sum value is to be resolved at compile time. In similar vein, channel length and channel width attributes of a given transistor may be respectively and symbolically expressed within the source net list 102 as L=x+y and W=u+v, where 'x', 'y', 'u' and 'v' may be variables or constants for which the absolute values of their respective mathematical combinations (e.g., sums) are to be resolved at compile time.

Each primitive component, such as a given transistor or resistor can have a respective, primitive model where the model is a software structure that may be used for predicting the local behavior of the corresponding component if the model is fed with accurate information about the physical parameters of the component (e.g., R=a+b) and with accurate information about input signals applied to the component (e.g., $V_R$ 5 Volts, $I_R$ unknown). One of the illustrated components in box 102 is a floating gate transistor and its corresponding model is represented schematically by box 104 as a stacked-gates model. Those skilled in the art will understand that a different model will generally apply to the P-transistor and yet other models may correspondingly apply to other components of box 102. Those skilled in the art will further understand that the specific models (104) can be of many different kinds, including sets of differential equations for supporting computationally-extensive simulations such as SPICE and ASX. The models (104) may also be of the piece-wise linear (PWL) type or the like as may be deemed appropriate for the speed and accuracy desired in a given simulation. It is irrelevant to the present disclosure of what specific type of models are being used and what specific simulation techniques are being utilized on a system wide or component-by-component basis.

What is relevant to the present disclosure is the stress that may be placed on the computational resources and capabilities of computer 100 due to industry trends towards using ever larger total number of components within a to-be-simulated system (e.g., a pre-silicon IC design) and/or towards increasing the numbers of different kinds of models and/or complexities of models for various components (e.g., deep-submicron transistors) and/or towards demanding faster production of simulation outputs with increased accuracies. All these demands may excessively strain or outstrip the finite storage capacity and computational capabilities of the simulation computer 100. This is not good.

In most cases, end users prefer to use a simulation computer 100 that is of a relatively inexpensive kind such as a desktop personal computer (PC) or an engineering workstation rather than being forced to use a more expensive one of main frame or like type. Fortunately, as explained above, redundancies within hierarchically structured systems may be taken advantage of to reduce storage demands and computing speed requirements placed on the simulation computer 100.

However, before our discussion plunges into the details of redundancy-based simulation, a short detour will be taken to discuss some basics of computer architecture. 100641 Referring now to FIG. 2, a possible method for interconnecting components of computer 100 is shown schematically. Computer 100 may include a central processing unit (CPU) 150 or other data processing means (e.g., plural processors), and a system memory 160 for storing immediately-executable instructions and immediately-accessible data for the CPU 150 or other processors. System memory 160 typically takes the form of DRAM (dynamic random access memory) and cache SRAM (static random access memory). Other forms of such high-speed memory may also be used. A system bus 155 may be used to operatively interconnects the CPU 150 and the system memory 160.

Computer system 100 may further include non-volatile mass storage means 170 such as a magnetic hard disk drive, a floppy drive, a CD-ROM drive, a re-writeable optical drive, or the like that is operatively coupled to the system bus 155 for transferring instructions and/or data over bus 155. Instructions for execution by the CPU 150 (or other processors) may be introduced into system 100 by way of computer-readable media 175 such as a floppy diskette or a CD-ROM optical platter or other like, instructing devices adapted for operatively coupling to, and providing instructions and/or data for operative use by the CPU 150 (or an equivalent instructable machine). The computer-readable media 175 may define a device for coupling to, and causing system 100 to perform operations in accordance with the present disclosure as further described herein.

System 100 may further include input/output (I/O) means 180 for providing interfacing between system bus 155 and peripheral devices such as display 110, keyboard 130 and mouse 140. The I/O means 180 may further provide interfacing to a communications network 190 such as an Ethernet network, a SCSI network, a telephone network, a cable system, or the like. Instructions for execution by the CPU 150 and/or data structures for use by the CPU 150 may be introduced into system 100 by way of data signals transferred over communications network 190. Communications network 190 may therefore define a means for coupling to, and causing system 100 to perform operations in accordance with the present disclosure. The instructing signals and/or data signals that are transferred through the communications network 190 for causing system 100 to perform said operations may also be manufactured in accordance with the present disclosure.

System memory 160 may hold executing portions 161 of an operating system (OS) and of any then-executing parts of application programs 165. The application programs 165 generally communicate with the operating system by way of an API (application program interface) 161 a. One of the application programs 165 may be a simulating program 125 configured in accordance with the disclosure. System memory 160 may include various data structures for causing computer system 100 to perform various operations in accordance with the present disclosure as is further described herein.

Figure 3A:
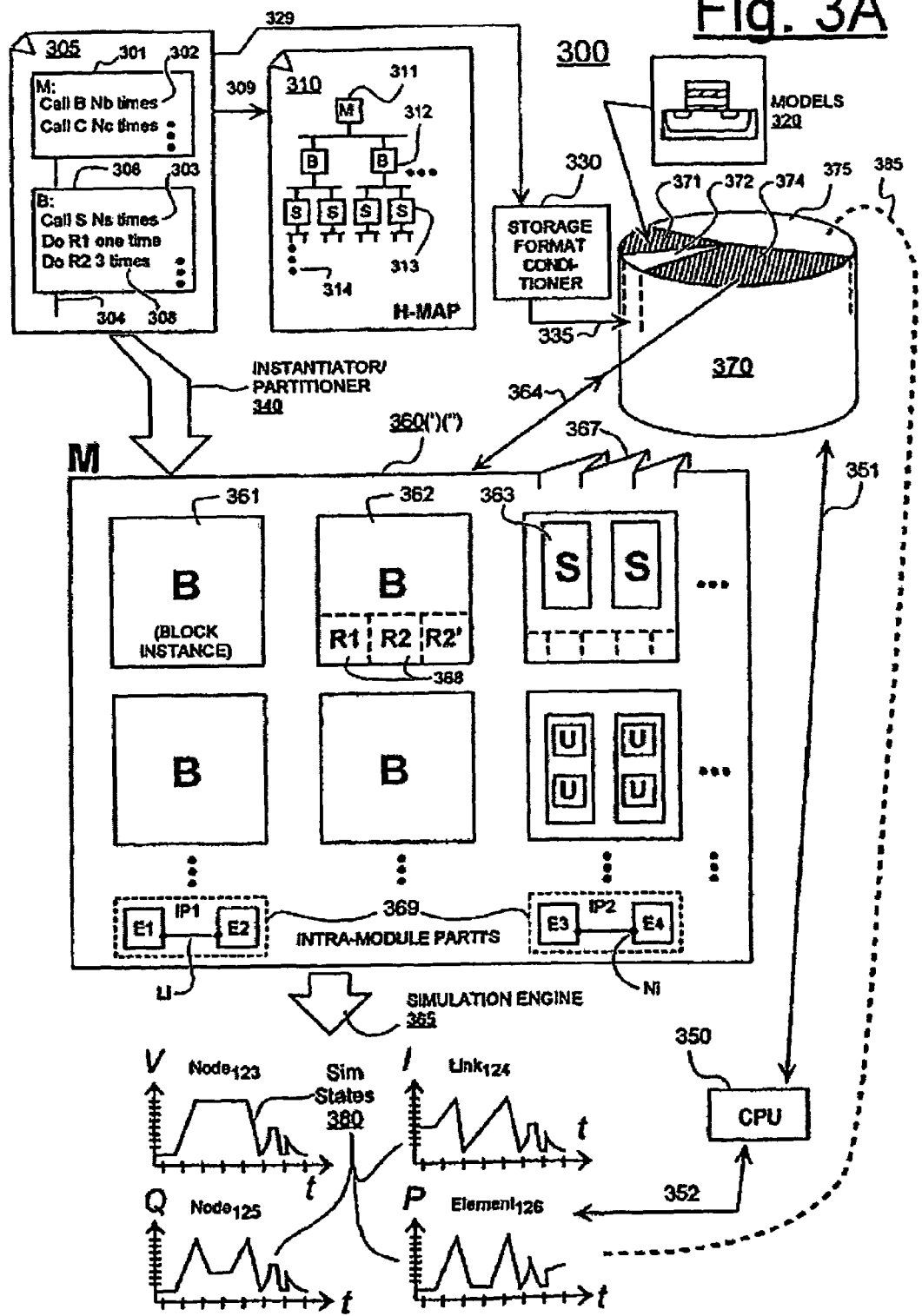
FIG. 3A is a generalized schematic of a simulation-supporting system that can be used for predicting the behavior of a hierarchically-structured and/or a flattened main circuit (M) where the simulation-supporting system includes a storage-format conditioner and a variable flattner in accordance with the disclosure.
Figure 3B:
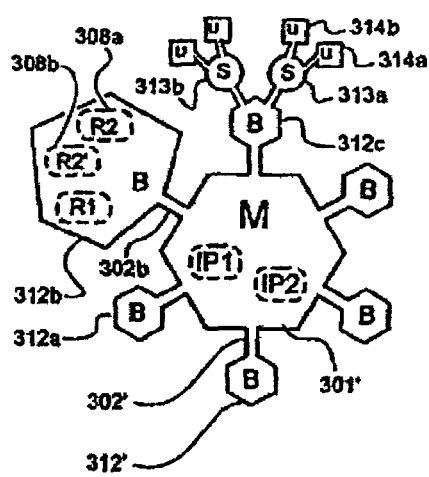
FIG. 3B is a biologically-oriented, first visualization aid that augments the hierarchy mapping tree shown in FIG. 3A.
Figure 3C:
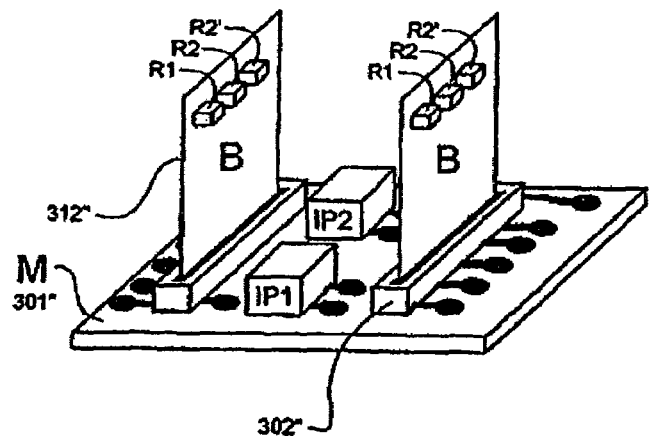
FIG. 3C is a printed-circuit board, oriented, second visualization aid that augments the hierarchy tree shown in FIG. 3A.

FIG. 3A schematically illustrates a simulation-supporting system 300 that may be implemented in accordance with the disclosure. Provided to the simulation-support system 300, there is a first file 305 containing a hierarchical design definition for part or the whole of a to-be-simulated device (not shown). A corresponding 'visualization map' of a hierarchical structuring that may be defined within the source file 305 is shown at 310. Connection 309 represents a hypothetical translation of a relevant part of the source file 305 into the corresponding, hierarchy-visualizing map (H-map) 310. In FIGS. 3B and 3C other respective visualization aids 315 and 317 are provided. There is no one exclusive way of understanding what is meant here by 'hierarchy' and other related terms (e.g., mother/daughter cards, sockets, budding, etc.). Accordingly, numerous aids are deployed herein to help in conveying various concepts. Each of the visualization aids 310 (FIG. 3A), 315 (FIG. 3B) and 317 (FIG. 3C) will be referred to as is appropriate by a given context for explaining or supplementing the ideas being then presented.

Referring to FIG. 3A, the source file 305 may include a definition for a main body structure, M (301) of the to-be-simulated device or device subportion. In FIG. 3B the main body is visualized as a biological mother cell 301' from which daughter cells 312' may bud out while remaining still-connected and communicating with the mother cell via membrane communication tubes 302'. In FIG. 3C the main body is visualized as a printed circuit mother board 301" to which daughter boards 312" connect by way of plug-in sockets 302". It should be remembered however, that the entities shown in FIGS. 3B-3C are just visualization aids. Typically the main body structure, M (301) and all its inherited or explicitly-expressed contents (e.g., children B, C; grandchildren S; U; internal organelles E1-E4, R1, R2) will be physically implemented as an integrated circuit or as part of such an IC. Of course, it can alternatively be implemented as a printed circuit board with a plurality of IC's or as a like, relatively large embodiment.

Within the main body structure definition 301 of FIG. 3A there may be found repeated (but not necessarily exclusive) 'calls' to substructure definitions such as the illustrated, Nb times repeated, calls 302 to a block structure named 'B'. In hierarchy-visualizing map 310, these multiple calls 302 may be visualized as the M body 311 having a corresponding number, Nb of B-defined children 312 all conforming to one or more aspects of a further definition 306 of what B is constituted by, where the further definition 306 maybe supplied in the source file 305. In the biologically-oriented visualization of FIG. 3B, each of 'calls' 302 may be seen as a membrane-continuing, communication tube 302' to a respective still-attached daughter cell 312'. Input and output signals can travel through the tube, but other information about what organelles (e.g., R1, R2) are inside a given daughter cell (e.g., 312b) will typically be hidden from, or encapsulated away from the mother cell 301'. In the PCB-oriented visualization of FIG. 3C, each of 'calls' 302 may be seen as a through-the-socket connection 302" to, and parameter-passing to a respective daughter board 312". Input and output signals can travel through the socket 302", but other information about what components.(e.g., R1, R2) reside on the daughter board 312" is generally hidden from, or encapsulated away from the mother board 301".

Each block structure definition 306 (B) in FIG. 3A may have within it one or more, yet deeper substructure definitions, such as shown at 303 and correspondingly mapped at 313 in H-map 310. The Ns times, called entity, S for example may be termed here as a repeated sector or section that occurs Ns times in each invoked instance of block B. Hence, S (313) implicitly repeats according to the product, Nb×Ns, within the main body construct 311 (M). In the biologically-oriented visualization of FIG. 3B, two of the 'calls' 303 are exemplified by respectively budded-out, but still-attached, granddaughter cells 313a and 313b extending from daughter cell 312c. It is to be understood that the other 'B' daughters such as 312', 312a, 312b and 312d of mother cell 301' will also have similar sets of granddaughter cells. The latter granddaughter cells are not shown in order to avoid illustrative clutter. Similarly, in the PCB-oriented visualization of FIG. 3C, it is to be understood that each daughter printed circuit board 312" will itself have plural sockets such as 302" and that respective granddaughter boards 'S' will extend from these. The latter granddaughter boards are not shown in order to avoid illustrative clutter.

In FIG. 3A the hierarchical structuring of M-definition 301 may continue to even deeper levels and more finely resolved granulations such as is exemplified by unit definitions U, subunit definitions (not shown), and so on until the finest-resolved elements within the definition are reached. Such continuances are schematically represented in the H-visualizing map 310 by ellipses 314 and in the source file representation 305 by continuance line 304. In the biologically-oriented visualization of FIG. 3B, two of such-deeper 'calls' are exemplified by respectively budded-out, but still-attached, great-granddaughter cells 314a and 314b extending from granddaughter cell 313a. It will be apparent to those skilled in the art that very large numbers of finely-resolved, primitive elements (such as transistors, diodes, resistors, etc.) may appear in a totally-flattened version of H-visualizing map 310 because multiple hierarchy levels will tend to produce large multiplication results such as Nb×Ns×Nu× etc.

Sometimes, a module definition (e.g., 306) within a source file may explicitly declare a given elementary component (e.g., R1) locally within itself rather than 'calling' (indirectly referencing) the given component (e.g., R1) as being part of an external data structure. Nonetheless, the declared elementary component (e.g., R1) may be instantiated many times in the final design if the declaring module (B) is itself instantiated that many times. There could be repeated explicit declarations of a given component within any or all modules. An example of this is shown in FIG. 3A at location 308 ('Do R2 3 times'). In the biologically-oriented visualization of FIG. 3B, two of such explicit declarations of the R2 primitive component are exemplified by not-budded-out organelles 308a and 308b.

It will be explained below that certain advantages may be obtained from forcibly budding-out or pushing-out organelles such as 308a and 308b, as individual units or as combinations. But we are not yet ready to tackle such concepts so at this part of the discussion. Instead, we here point out one problem that may accrue from multiple and explicit declarations of primitive elements within a given, non-leaf module or non-leaf cell (e.g., 'B'). The problem is that for each such, non-leaf explicit-expression of a primitive component, its physical parameter definitions (e.g., resistance of R2:=a2+b2, where a2 and b2 are variables) may have to be separately compiled (resolved into absolute values). Also for each such, non-leaf explicit-expression of a primitive component, its respective behavior prediction may end up being separately and individually simulated and thereafter transmitted for incorporation into a higher level prediction. Repeat this kind of individualized processing many times over and suddenly parameter compilation, simulation drive time, and results transmission time can begin to consume undesirably large amounts of computer time and computational/storage resources. It is desirable to avoid unnecessary consumptions of computer time and resources.

The above introduction to hierarchical structuring may be a bit obtuse. So consider a more concrete example. Assume the main body structure definition 301 represents a memory chip or a memory section within a microprocessor chip. Assume that one of the deeper and finer resolution levels of the hierarchical description for this memory device (that is, those descriptions closer to the outer leaf buds and further away from the central root or main trunk description) is occupied by memory cells and more specifically by their respective transistors, resistors, metallic interconnect lines, and other such subgate-level, basic elements. Assume that a next higher (inner) level of hierarchy is occupied by representations of logic gates contained-in each memory cell. At a yet higher hierarchy level assume there is an array of our gate-containing cells arranged as columns and rows. A next higher level of hierarchy may be defined as a memory page or a memory block that is formed by a set of cell arrays. Assume that for each hierarchical level, the corresponding unit definitions each include a description of the interconnects between either or both of the basic components inside that unit and of the terminals which can couple the unit to other units. For each hierarchical level, there may also be physical parameter expressions (compilable formulas) associated with each basic component for defining physical attributes of that component such as length, width, resistivity, etc. A modern memory design may contain millions of transistors, RC-modeled interconnect lines, and so forth. Simulating all these and their interactions on a one-at-a-time basis can be problematic because such an approach may strain the capabilities of a computer with finite speed and resources.

However, because of the significant amount of redundancy that is typically found within heavily-hierarchical structure definitions (e.g., as represented by H-map 310), the design definition in a supplied source file 305 may be compressed as is seen in FIG. 3A at 302 and 303 to indicate how many copies of a given component are called into or otherwise found at each hierarchical level rather than by explicitly describing each instance of each redundant component. Such heavily-hierarchical expression of the overall structure is to be contrasted with a completely 'flattened' definition (360). In a completely flattened definition (360), every component is separately and explicitly expressed as an individual unit definition.

If a fully individualized, and explicit expression were to be produced on a given, physical storage media 370, for each and every primitive element (transistor, resistor, etc.) of a dense design, such a fully flattened design expression 360 would tend to occupy a relatively maximal amount of computer storage space. On the flip side of the coin, if a maximally-compacted hierarchical design definition file were instead used, such as is exemplified in box 301 of FIG. 3A, it would tend to occupy a relatively minimal amount of storage space for expressing what constitutes the to-be-simulated design. Between these two extremes, it is possible to have design definitions that are to some extent, flattened for some parts of the main body M but compacted or compressed for remaining and redundant portions of the main body M.

Figure 3D:
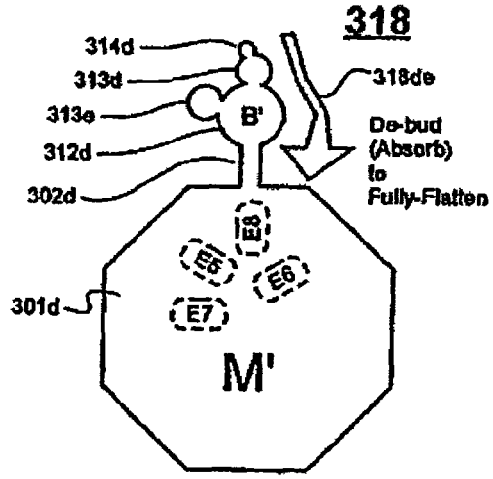
FIG. 3D is a biologically-oriented visualization aid for helping to explain what is meant by a mostly-flattened, but slightly budded, design description.

This concept of having both a partially flattened and partially compressed design definition is represented by a plane-folding or wrinkling symbol 367 in FIG. 3A. In a further, biologically-oriented visualization aid 318 of FIG. 3D, the concept is shown by having a relatively fat main body M' (301d) with many organelles (e.g., E5-E8) floating therein and just one call 302d to a daughter module 312d (B'). The daughter module 312d in turn makes two calls to granddaughter modules 313d and 313e. Module 313d calls leaf-bud 314d. In other words, visualization aid 318 shows a mostly-flattened design definition. In order to fully flatten the illustrated design definition 318, leaf-bud 314d may first be 'absorbed' into granddaughter module 313d. This absorption may be performed by converting the 'call' within 313d into an explicit expression within 313d of the contents of leaf-bud 314d. To complete the flattening out process, granddaughter modules 313d and 313e may next be absorbed into daughter module 312d; and thereafter, daughter module 312d (B') may be absorbed into main module 301d—at which point main module 301d would contain no calls to other modules. Instead main module 301d would be filled only with explicitly-expressed, primitive elements such as E5-E8. The flattening-out or debudding process is represented in FIG. 3D by symbol 318de. The recited order of debudding may be varied as desired. It does not have to start in the leaf buds.

Just as a budded definition (e.g., 318) can be fully flattened-out (318de), it is possible to go the other way and greatly increase the number of buds and hierarchy levels in a design definition by converting explicitly-expressed, elements (e.g., E5-E8) or combinations of such elements (and/ or other calls) into called modules and submodules. This concept of desorbing, or budding-out or 'pushing-out' the internals of a given mother module (e.g., M') is seen by transitioning from what is shown in FIG. 3D to the highly-budded and heavily-hierarchical design definition 319 represented in FIG. 3E.

Figure 3E:
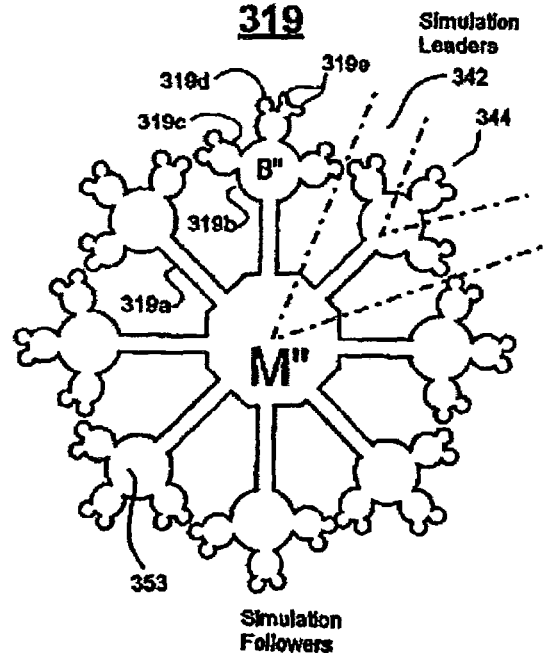
FIG. 3E is a biologically-oriented visualization aid for helping to explain what is meant by a highly-budded and heavily-hierarchal, and highly-symmetrical design description that lends itself well to leader-follower types of simulation methods.
Figure 5A:
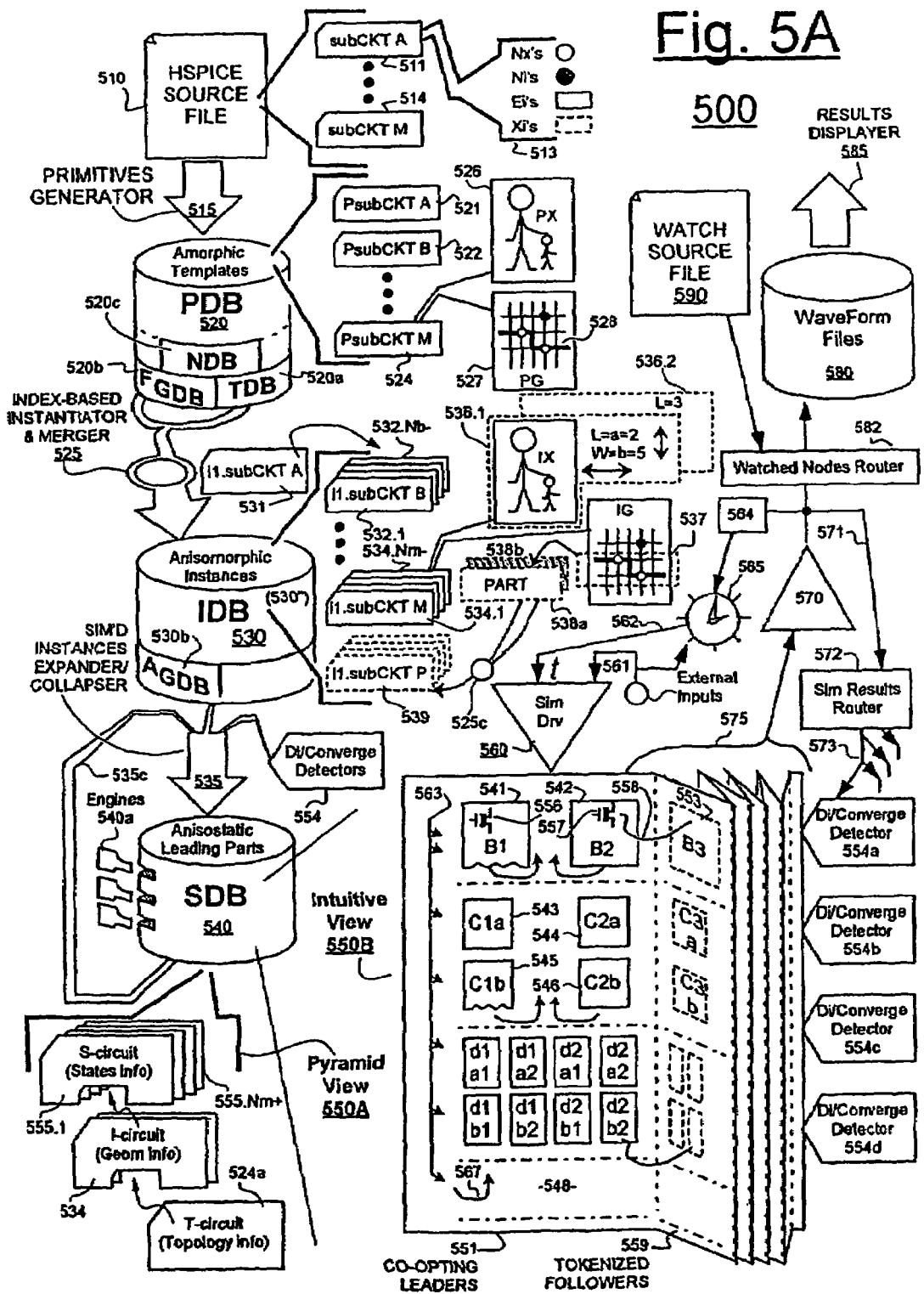
FIG. 5A is a block diagram of simulation-supporting system in accordance with the disclosure that includes mechanisms for instantiating hierarchical design definitions, and mechanisms for partitioning such hierarchical design definitions, and mechanisms for identifying redundantly-behaving, isomorphic and isostatic subcircuits on-the-fly and for collecting and routing simulation results over time.

There is something important that should be noted about the highly-budded and heavily-hierarchical design definition 319 represented in FIG. 3E. If a relatively symmetrical design definition 319 is created as is depicted in FIG. 3E, then the simulation system may be cleverly structured to choose one of redundant leaf-buds 319*e* as a representative for all the other, like leaf-buds (only one pair shown in order to minimize illustrative clutter); and to simulate just that one leaf bud 319*e*; and thereafter replicate the results for all the other, like leaf-buds (understood to extend from each of illustrated parent buds 319*d*). Similarly, for the next inner (higher) hierarchy levels, 319*d*, 319*c* and 319*b*, in that order, the same thing may be done if conditions allow. So a given slice (344 and/or 342) of the symmetrical definition 319 can serve as a role model for other like slices (e.g., 353). It will be seen later in FIG. 5A that a wide leader slice such as 342 may be viewed as corresponding to leader module 542 (B2) of. FIG. 5A, and that a narrower leader slice such as 344 may be viewed as corresponding to leader module 544 (C2*a*) of FIG. 5A, and that follower slice 353 may be viewed as corresponding to tokenized follower module 553 (B3) of FIG. 5A.

Note that by the time we get to the inner-more, mother cell (M") of FIG. 3E, after having pushed-out or budded-out all its original organelles (e.g., E5-E8), there is very little substantive processing to be done for simulating the behavior of the inner-core, mother cell (M"). Instead, the prediction-generating processing for an inner parent like M" is mostly composed of result cross-coupling between its child buds. This is so in the ideal case, because the mother cell (M") has been basically hollowed-out to consist essentially of communication pipes 319*a* and the primitive elements have been for the most part, been 'pushed-out' to the leaf buds 319*e*. This organization is to be contrasted with the mostly-flattened definition 318 of FIG. 3D wherein a bulk of the primitive elements (e.g., E5-E8) are explicitly-expressed inside the mother cell 301*d*. It will be seen below how a spectrum of possibilities can be realized between a fully flattened design definition (e.g., 360 of FIG. 3A) on one extreme and fully-budded-out definitions (e.g., 319 of FIG. 3E) on the opposed extreme. If the original design definition 305 is converted into a partially flattened counterpart instead of being fully flattened, such a partially flattened, counterpart expression is referenced herein as 360' (prime) instead of just 360.

Flowery visualizations such as those of FIGS. 3B-3E are all well and fine. But they don't teach how to specifically get from one configuration (e.g., original source file definition 305) to the other (e.g., symmetrically budded design definition 319 of FIG. 3E). One possibility is to first convert a hierarchical definition such as that of the illustrated source file 305 into a fully flattened definition 360 (or de-budded 318) and to thereafter judiciously partition the fully-flattened definition 360, and to then bud-out the partitions. After that, partitions inside each new bud are identified and these are pushed-out yet further; and so forth. However such an approach would take a lot of work and it would throw away valuable information that was provided in the already hier-archically-structured, source file 305. Practitioners would be left with the problems of how to optimally partition at each budding-out hierarchy level and how to keep track of which primitive element was pushed-out to where.

The present inventors have found it preferable to instead try to retain most of the hierarchically-structured design definitions found in the typical source file 305 and to opportunistically bud out from there. Operations of one embodiment of the illustrated simulation-support system 300 of FIG. 3A may be briefly described as follows: (1) An original design definition (305) is reformatted (330) so as to make it easier to identify instances of subcircuits with alike internal structures—more specifically, with alike interconnect topologies and alike physical attributes (e.g., transistor geometries). (2) Primitive elements in each hierarchy level are analyzed and collected into partitions that have a good likelihood of being repeated throughout the design (e.g., a partition that contains a common inverter design). (3) The formed partitions are pushed-out and replaced in their respective home sites with calls (X-circuit references) to the pushed-out buds. (4) Topologically-same ones of the pushed-out partitions (leaf X-circuits) are identified. (5) Geometrically-same ones in each group of topologically-same, pushed-out buds are identified as being isomorphic. (6) State-wise alike ones of the isomorphic buds are identified as being isostatic. A representative expression for each group of isostatic buds is instantiated (in region 360"). (7) The behavior of each so-instantiated and representative bud is predicted (365). (8) The predicted behavior of each representative bud (which is later called an S-part, see FIG. 5B) is copied or reflected so that it will be used for predicting the behaviors of other, redundantly-structured and isostatic buds that had not been fully-instantiated (they remain somewhat compressed). (9) Thereafter, the predicted behaviors (380) of all partitions are propagated through the overall definition of the simulated device in order to step it to its next event state. (10) After results have been cross-propagated, determinations are made as to which, previously alike partitions can no longer behave alike because of the cross-propagated result signals have changed their states. Immediately-above steps 6-10 are then repeated.

More specifically, a partitioning and instantiating mechanism 340 may be provided for converting the reformatted definition 335 of the supplied design definitions 301-304 of source file 305 into a more-budded-out and still hierarchical design definition 360" that is structured in accordance with the spirit of FIG. 3E. In doing so, mechanism 340 may optionally partition each of the expressed modules (e.g., 361, 362) found in the compressed definition 360'. During such partitioning, internally-interconnected basic elements (e.g., E1, E2, etc.) maybe combined inside each hierarchical module and then pushed-out to thereby define a new level of hierarchy (new leaf buds). Prior to push-out, the devised partitions are termed here, as intra-module partitions (IP's) 369. By way of an example, suppose each B module declares both an R1 unit and one or more R2 units as shown at 308 and at 368, where it turns out that the R1 element connects to at least one of the R2 element. In such a case, even though they are not called upon as external modules, the interconnected R1 and R2 elements could be combined and recognized as an integral partition that exists within each instance (e.g., 361, 362) of module B. The behavior of such a partition 368 (R1-R2) can be predicted as if it were a singularly-described unit and then copied to like partitions. To do so, it has been found advantageous to push-out such uncovered IP's 368, 369 into an outer hierarchy level. It is within the contemplation of the disclosure however, to do essentially the same things on identified partitions without formally pushing them out.

Referring to FIG. 3C, the concept of creating intra-module partitions (IP's), identifying those that are alike, and pushing-out such IP's can be appreciated using the PCB-visualization aid. Suppose mother board 301" has a large group of transistors (not individually shown) soldered to it. An astute designer may realize that these many transistors can be gathered into alike, on-board modules, IP1 and IP2. That may not yet change the way in which mother board 301" is simulated because all those transistors still individually populate the mother board 301". However, suppose our astute designer chooses to replace the IP1 and IP2 on-board groupings with respective sockets (e.g., 302") and move the circuitry of IP1 and IP2 onto two new and respective daughter boards (not shown, but similar to the 'B' daughter boards). Such a pushing-out or budding-out of the many transistors that form IP1 and IP2 can change the way in which mother board 301" is simulated in at least two ways. It would depopulate the mother board of the individualized transistors of IP1 and IP2. It would cause the behaviors of pushed-off IP1 and IP2 to be treated as 'calls' rather than as on-mother-board primitives. If the pushed-off partitions, IP1 and IP2 can be proved to behave the same way, then simulation of one may suffice for both.

Returning to FIG. 3A, post partitioning and post push-out definition (now referenced as 360"—double prime) will often end up having a plurality of redundant blocks such as 361 and 362. Each of the illustrated, blocks (B) in box 360" may correspond to one or more instances of the B module 312 shown in the H-visualizing map 310. Within each B instance (361, 362, etc.), there may be further redundant submodules such as the 'S' one shown at 363. Each of the illustrated, submodules (S) in box 360" may correspond to one or more S instances 313 in H-visualizing map 310. Within each S instance (363) there may be yet further, hierarchically-arranged levels of subunits such as indicated by the 'U' boxes within item 360". The hierarchical levels of units and subunits will ultimately stem down to foundational elements such as E1-E4. Such foundational elements may be found to be directly declared in any hierarchy level. R1 and R2 for example may be foundational elements that are explicitly expressed (368, 308) in the B hierarchy level. Analog simulations generally use the behavioral characteristics of foundational elements (e.g., E1-E4, R1-R2) as a starting point for building up a prediction of the behavior that will be exhibited by a device consisting of specific, geometrically instantiated ones of such foundational elements. Because of this, it is helpful to push-out these foundational elements into leaf-buds. (The concept of geometric instantiation will be detailed below. For now, it is sufficient to understand that even when a given transistor is defined by a corresponding model (320), and all the connections to the transistor are defined, the specific behavior of the transistor will still not be predictable until absolute values for geometric parameters such as channel length (L) and channel width (W) are specified in absolute terms for that transistor.)

Once the optionally partitioned and further-budded definition 360" is established as a computer-usable expression, its leaf buds may be supplied to an automated simulation engine 365. Engine 365 further receives definitions of initial device states and driving input signals for various elements of the design definition 360". In response, the simulation engine 365 produces a predicted sequence of simulation states 380 over time (t) for the various parts of the design definition 360". Each part within the overall design definition 360" can have many corresponding simulation states. By way of non-limiting examples, a given internal node (Ni) may have, at a given instance of time (t), an instantaneous voltage (V), an instantaneous rate of voltage change (V' or V-dot), an instantaneous charge (Q), an instantaneous rate of charge change (Q' or Q-dot), and an instantaneous capacitance (C). Moreover, each internal interconnect link (Li) that is found within the design 360" between two nodes may have a corresponding instantaneous current (I) flowing through it and an instantaneous rate of current change (I' or I-dot). Each element in an interconnect graph may have an instantaneous rate of power dissipation (P) and a corresponding temperature (T). Some of these state attributes are exemplified in FIG. 3A as state versus time graphs 380.

The operations performed by the instantiator/partitioner 340 and the simulation engine 365 do not occur in a vacuum. Data storage and processing resources are needed for supporting these operations. FIG. 3A emphasizes this point by showing as a parallel side view, a data storage means 370 into which there is stored an initial design definition (372) derived from the source file 305. In one embodiment of the disclosure, the supplied source file 305 is input 329 into a storage format pre-conditioner 330. The pre-conditioner 330 reformats the initial design definitions (305) and outputs (335) corresponding, primitive data structure definitions into region 372 of data storage means 370. The primitive data structure definitions (not explicitly shown yet) are organized to more efficiently support operations of the instantiater/partitioner 340 and of the simulation engine 365 as will be seen below. More specifically, the primitive data structure definitions are organized to assist in the identification of 'isomorphic' and 'isostatic' subcircuits as will be better explained when we get to FIGS. 4A-4B.

Besides the primitive data structures (372), there are additional data structures formed in storage means 370 of FIG. 3A. The additional data structures include a plurality of simulation models 320 which are recorded into region 371 of the storage means 370 for later use. The optionally partitioned and budded definition 360" has respective, 'instantiated' data structures which are recorded into region 374 of the storage means 370. The storage size and data structures of the 'instantiated' definitions are particularly important when it comes to considering the size and access speed of storage region 374 because repeated read and write operations will be made to storage region 374 as the 'instantiated' design definitions are used for simulating flattened parts (e.g., leaf buds) of design definition 360". Such repeated references to storage region 374 are represented in FIG. 3A by the bidirectional coupling 364 drawn between the representation 360(')(") for the partially-flattened and/or partitioned/budded design definition and the representation of region 374 of the storage means 370. Although ideally, the instantiated representation 360" should be highly partitioned and budded-out per the spirit of FIG. 3E, there may be times when end-users nonetheless prefer a completely-flattened or mostly-flattened and instantiated representation 360 (') per the spirit of FIG. 3D. The storage formatter 330 may be designed to allow for flexible choosing of what degree of flattening is desired.

Incidentally, storage means 370 can take on many forms including one or more of magnetic disk, optical disk, DRAM, SRAM and so forth. Any appropriate form of computer readable media for storing and reading out the various data structures may be used as is suitable for a given application and/or environment.

The various data structures (e.g., 371, 372, 374) which have been described thus far, and additional ones (375) of the storage means 370, may be formed by, and/or read by, and/or edited by a CPU 350 (or like data processing means) as is indicated by bidirectional coupling 351. The CPU 350 uses the supplied models 320 of region 371 to predict the respective responses of different, topologically and geometrically instantiated parts of the flexibly-flattened design 360(')(") to respective inputs and to thereby generate next-state conditions for all these various parts. Such results are then fed back for predicting the next sequential state of the system that is being simulated. These result predicting operations and feedback operations are represented by bidirectional coupling 352.

One aspect of FIG. 3A which may, but should not be overlooked is the amount of storage space consumed in storage means 370 by data structures that represent each of respective items 320; 335, 360/360'/360" and 380. Such storage consumption amounts are crudely represented at the top of the cylinder icon for means 370 by respective pie-chart slices 371, 372, 374 and 375. When relatively large, hierarchically structured designs 310 are considered, the storage space (shaded 371 pie slice) that is occupied by the data structures of the models 320 and the storage space (non-shaded 372 pie slice) occupied by the data structures which define the pre-conditioned and/or post-conditioned design definitions (329, 335) can be made relatively small and compact by comparison to the storage space that may be occupied by the instantiated data structures of a fully-flattened and/or partitioned design definition 360. The latter amount (374-shaded slice) may be crudely matched by the amount (375-nonshaded slice) consumed for representing the various simulation state variables at each expressed instance of a node (Ni), a link (Li) and/or a foundational element (Ei) if the design is fully-flattened. Dashed connection 385 is included in FIG. 3A for representing the logical connection between the elemental simulation states 380 and the storage area 375 consumed by them.

Those skilled in the art will appreciate that significant cost and performance benefits maybe obtained if the relatively large amounts of data storage space and/or relatively large numbers of data structures associated with pie-chart regions 374 and 375 can be reduced. One advantage is that the size and cost of storage means 370 may be commensurably reduced. More importantly, however, the time spent by CPU 350 in forming and editing the data structures of regions 374 and 375 may also be commensurably reduced. This can advantageously reduce the amount of time and computational resources that are consumed for system-wide simulations. Such a reduction in the amount of data storage space consumed and/or in the number of data structures associated with pie-chart regions 374 and 375 can be realized if redundant parts of a simulation can be automatically and efficiently identified and the results produced by one such part can be automatically and efficiently duplicated for the other such parts.

Referring now to FIG. 4A, a machine-implementable method 400 is shown for automatically identifying redundant parts of a simulation. Items 411 and 412 represent respectively partitioned parts or modules or buds of an overall system that is undergoing simulation. The first partition/module 411 is driven by a corresponding first input (s) source 415 (e.g., a time-varying, voltage signal source) while the second partition/module 412 is driven by a second input (s) source 416. Various components or elements within first module 411 are associated by respective first pointers 413 to corresponding models 421. Similarly, various components or elements within second module 412 are associated by respective pointers 414 to corresponding models 422.

In addition to the above, various ones of the components or elements within modules 411 and 412 may have respective initial or current states that can determine how those components will behave in response to corresponding input signals such as 415 and 416. For example, the modules may include respective capacitors that hold respective amounts of instantaneous charge. Additionally or alternatively; the respective modules 411 and 412 may include electrically programmable transistors (EEPROM) whose respective programmed states may result in comparatively different kinds of behavior. The specific circuits which are schematically illustrated inside boxes 411 and 412 are merely examples for highlighting the types of questions that should arise during a search for redundant ones of individually simulatable circuit sections. These examples (411, 412) are not to be construed as limiting what might constitute a simulation partition or simulation module or another like collection of one or-more primitive elements that conforms with the disclosure.

It can be appreciated from FIG. 4A that the output signals produced at respective output terminals 417 and 418 of simulation sections 411 and 412 may match sufficiently closely to one another so as to be considered redundant if certain tests (T1-T4) are carried out and satisfied. As is illustrated, a first test 401 (T1) asks whether the respective input signals 415 and 416 of first and second circuit sections 411 and 412 match one another in a sufficiently close manner.

A second test 402 (T2) asks whether the respective circuit sections 411 and 412 are equivalent both topologically and geometrically. By topological equivalence, we mean that the compared sections (411, 412) have substantially same interconnections being made between substantially same nodes and substantially same kinds of internal components. In the mathematical arts, the latter question concerning only topological equivalence is sometimes referred to as the problem of proving equivalence between directed graphs. One solution to such a mathematically-posed question may be found in the above-cited paper by X. Jiang and H. Bunke, entitled "Optimal Quadratic-time Isomorphism of Ordered Graphs" whose disclosure is incorporated herein by reference.

By the above further term, geometric equivalence, we mean that the respective components of the compared sections (411 & 412) further have substantially the same performance-affecting geometries and/or other performance-affecting physical attributes. For example, both sections (411, 412) might have a same NMOS transistor associated with a same model (421, 422) but the transistor channel lengths (L) and/or widths (W) might be radically different. In the latter case, behavior might be very different even though the inputs are substantially the same, the interconnections are, topologically-speaking, substantially the same, and the models are substantially the same. (It is to be noted that some geometry values and/or other physical attribute values may not substantially affect behavior. Hence, second test T2 may focus on the substantial equivalence of the performance-affecting geometries and/or other performance-affecting physical attributes as opposed to requiring all geometry or other attribute parameters to be the same.)

If two or more partitions or modules are both topologically (graph-wise) equivalent and their respective components are geometrically and/or other attribute-wise equivalent, the partitions or modules may be said to be 'isomorphic'. If either the geometry/other instantiated, performance-affecting parameters or the interconnect topologies (graphs) of the two compared modules/partitions differ substantially, then the compared modules/partitions may be deemed to be 'anisomorphic'.

A third test 403 (T3) asks whether instantaneous or initial conditions within various components of the respective partitions or modules are substantially equivalent. Behavior might be very different even though the inputs are substantially the same, the circuit topologies (graphs) and geometries/other-attributes are substantially the same and the models are substantially the same, if for example, one EEPROM transistor is programmed to be continuously turned off while its counterpart in the other section is switchable into a conductive state. If the instantaneous state conditions and input conditions for two compared modules/partitions differ, then the compared circuit sections may be deemed to be 'an-isostatic'.

A fourth test 404 (T4) asks whether the models used by the respective counterpart components of respective sections 411 and 412 are also equivalent.

As is indicated in test step 405, if the results are true (affirmative) for each of the first through fourth tests (401-404), then the respective output signals at terminals 417 and 418 may be deemed to be substantially equivalent. In this case, a logical redundancy lock may be established for the behaviors that are to be predicted to be found at output terminals 417 and 418. By way of example, the observed output behaviors of interest may be the magnitudes of output currents $I_{out1}$ and $I_{out2}$ at specific time points (e.g., $t_1$, $t_2$, $t_3$, etc.) in response to respective input signals $V_{in1}$ (415) and $V_{in2}$(416). The behaviors for which redundancy locks may be established may of course include other attributes of interest such as voltages at various nodes of the modules, average or other power dissipations by various elements, temperatures, and so forth.

If it is found, on the other hand, that at a given time point, a result for any one of the first through fourth tests 401-404 is false (negative), then it may be determined that the output behaviors of the respective simulation modules (sections) 411 and 412 will probably be different and the logical redundancy lock between those sections should be broken. In the latter case, each of the respective first and second simulation sections, 411 and 412 should then be simulated individually rather than on a leader-follower basis.

By contrast, if a redundancy lock is present (T1-T4 test true) between two or more sections (e.g., 411, 412), then it is possible to fully simulate the behavior of only one (e.g., 411) of the locked sections rather than all. The per-tick, simulation results of the simulated one circuit section may then be copied as the predicted results for the other circuit sections (e.g., 412) without having to individually perform full simulation for those other circuit sections. This helps to reduce simulation time and to reduce the computational resources consumed by simulation.

Of the four tests, 401-404 shown in FIG. 4A, the first test 401 is the one that usually needs to be repeated most often because input conditions can change substantially on a per-tick or per-event basis during simulation. The fourth test, 404 is one that usually needs to be repeated the least often because models tend to be relatively fixed in comparison to the other factors of tests 401-404. The other two tests, 402 and 403 may generally be performed on an intermediate frequency basis, but should be performed at least once before or near the beginning of a simulation run. In particular, the behavior-affecting, geometry/other-attribute factors of test 402 may change from one simulation run to a next as device designers try to tweak the geometry parameters (e.g., L & W) or other physical attribute parameters (e.g., implant depth, doping concentration, etc.) of a design even after its interconnect topology has been frozen. If a geometry or other attribute tweak is made to one of previously isomorphic modules or partitions, the tweaked module/partition may become an isomorphic with respect to the others. The relevance of this will become clearer when we discuss an Instances-containing DataBase-(IDB) 530 as shown in FIG. 5A. In one embodiment, every simulation run starts afresh from the SPICE-like input file 305 (or 510 in FIG. 5A) and does not assume that some results of prior simulation runs may be used. In an alternate embodiment, topology-identifying and geometry-identifying results are re-used if the circuit designer indicates to the simulator that these have not changed.

Tests 401-404 may be viewed from yet another perspective, namely, what proportion of 'instances' of a given subcircuit are likely to satisfy each of these tests. Consider a large number of CMOS inverters (say there are 1000 of them) distributed across an IC. In many cases (say 950 out of the 1000) the inverters may be each formed of a single NMOS transistor having a respective first associated model and of a single PMOS transistor having a respective second associated model. The topologies of most of these hypothetical inverters (say 900 out of the original 1000) will be the same, namely, the gates of the PMOS and NMOS transistors (not shown) are tied together to the inverter's input node, the drains of the NMOS and PMOS transistors tie together to the output node of the inverter, and power rails connect to the respective sources of the two transistors. The geometries of the 900 hypothetical and topologically-same inverters may not be the same however. A hundred of them may have extra-wide PMOS transistors, while a different group of 100 may have extra-wide NMOS transistors, and while a bulk of the inverters (say 500) have default-sized PMOS and NMOS transistors. Even in the last group of topologically-same and geometrically-same inverters, during simulation some may be in a steady low or high state, some may have outputs that are ramping up, some may be-alternatively ramping down. So test 401 (T1) is the one that is likely to most often differentiate among subcircuits while test 404 (T4) and the topologic part of test 402 (T2) are the ones that are least likely to differentiate among subcircuits. This observation will be seen to affect below, the order in which information-providing DataBases are built up. In FIG. 5A, a topologies-differentiating TDB structure 520a is developed before a geometrically-differentiating (IDB) structure 530 is developed. The IDB 530 is developed before a states-wise-differentiating SDB structure 540 is developed.

Referring first however to FIG. 4B, a set of simultaneous voltage versus time plots are shown for illustrating how input conditions at different circuit sections (e.g., 411 & 412 of FIG. 4A) may closely track one another during a first part of simulation (e.g., time span $t_0$-$t_1$) and then diverge from one another during a second part of simulation (e.g., time span $t_2$-$t_3$). Here, a set of four isomorphic, and to-be-simulated circuit sections, Ckt0 through Ckt3 are assumed. The long, upwardly-ramping, solid and straight line 475 represents an input voltage, $V_{in0}$ for simulated circuit section Ckt0 in the simulation time span $t_0$ through $t_3$. A first dashed curve 476 represents the input voltage $V_{in1}$ of isomorphic circuit Ckt1. As seen, the latter voltage curve 476 stays close to the ramping voltage line 475 at least during the time period $t_0$-$t_1$. By time point $t_2$, however, the difference, $V_{in1}$-$V_{in0}$ represents a negative-going error, $|e^-|$, which has an absolute magnitude exceeding a pre-specified maximum magnitude $|e^-_{max}|$ for such an error. As a result, in one embodiment of the disclosure, second curve 476 is no longer considered to be closely tracking the reference curve 475, and accordingly, the result for lock-maintenance test T1 (401) will be False as between circuit sections Ckt0 and Ckt1.

In similar fashion, a second dashed curve 477 is drawn in FIG. 4B to represent the input voltage, $V_{in2}$, of the second isomorphic, circuit section Ckt2. As seen, curve 477 closely tracks the reference ramp 475 at least from time $t_0$ through $t_2$. However, by time point $t_3$, the difference $V_{in2}-V_{in0}$ is such that a positive error develops, e+. In one embodiment, when this positive error (e+) exceeds a predefined maximum amount ($e+_{max}$) for such positive error, then Vin2 is no longer said to be closely tracking the reference signal 475. And accordingly, the result for lock-maintenance test T1 (401) will be False as between Ckt0 and Ckt2. (It is within the contemplation of the disclosure to also have a unified, maximum amount of allowed absolute error or relative percentage of error for both positive and negative tracking errors. FIG. 4B illustrates one possibility where positive and negative error measurements are treated differently.)

The voltages versus time plots of FIG. 4B include yet a third dashed curve 478 which is seen to closely track the second dashed curve 477 at least through the time span $t_0$-$t_3$. The third dashed curve 478 represents the respective input voltage Vin3 of the third isomorphic circuit section, Ckt3.

It can be easily recognized from FIG. 4B that at least between the initial time point t0 and first time point t1, that there will be no need to separately simulate all four of the isomorphic circuit sections Ckt0-Ckt3. Instead, according to one embodiment of the disclosure, a first of the circuit sections (e.g., Ckt0) is designated as a 'representing' or 'representative' or 'leader' isomorphic circuit while the others (e.g., Ckt1-Ckt3) are designated as 'represented' or 'following' circuits. Simulation computations are carried out for the leader/representative circuit (e.g., Ckt0) while such model-based analyses are not individually carried out for the represented/follower circuits (Ckt1-Ckt3) during the time span $t_0$-$t_1$, this being the span in which their inputs are deemed to closely match. During this time span, the behavior results that are computed for the representative, isomorphic circuit section (e.g., Ckt0) are copied or mirrored to become the simulation results of the represented circuits (Ckt1-Ckt3) without going through the process of individually and fully performing appropriate simulation analyses for each of the represented circuit sections. Storage space and/or computational resources may therefore be conserved.

At second time point t2, the input conditions of the first isomorphic circuit Ckt1 have diverged to an extent where Ckt1 may be said to have 'broken away from the pack'. Nonetheless, Ckt0 may continue to be the simulation representative for Ckt2 and Ckt3. However, the breaking-away Ckt1 now needs to find a new representative or to become its own, individually simulated leader.

At third time point $t_3$, the input voltages of Ckt2 and Ckt3 have formed a breaking-away pack of their own that diverges from the input conditions of their initial leader, namely simulated isomorphic circuit Ckt0. At this point (e.g., $t_3$), Ckt2 and Ckt3 should find a new isomorphic representative whose input conditions closely match those of this breaking-away pack, or alternatively Ckt2 may become designated as a new representing leader while Ckt3 becomes its represented follower.

In one embodiment of the disclosure, no one isomorphic circuit section (e.g., 411 and 412) is itself directly simulated. Instead, a 'fictitious' or 'fabricated' representative is created for a 'pack' of one or more isomorphic and essentially-isostatic ones of 'handled-instances'. For example, if at third time point $t_3$, isomorphic 'instances' Ckt2 and Ckt3 are considered to be a closely-marching pack, then a corresponding and 'fabricated' simulation leader, f-Ckt2:3 (represented by solid line 480) is created for that pack. The represented members of the pack vote on what the input (s) should be for their fabricated leader, f-Ckt2:3. The vote maybe carried out so as to provide a least squares error or some other minimized error function between the vote-defined input (s) of the fabricated leader; f-Ckt2:3 and the simulation-defined input (s) of the followers; Ckt2 and Ckt3. Thus, in the case of the pack formed by Ckt2 and Ckt3, at time point $t_3$, the input voltage for the fabricated new leader, f-Ckt2:3 of the pack may be caused by voting to be line 480. As seen line 480 is situated between the input voltage waveforms of Ckt2 and Ckt3 so as to minimize error in a least squares or other sense, as may be appropriate.

Similarly, and under this embodiment of the disclosure that has voting-followers and an elected/fictitious leader, the isomorphic 'instances' of Ckt0-Ckt3 would vote on what error-minimizing input voltage should be provided for their fabricated leader (f-Ckt0:3, not shown) during time span $t_0$-$t_1$. When the individual error between a given follower and the leader exceeds a predefined threshold, such as it does at $t_2$ for instance Ckt1, that breaking-away instance leaves the pack and looks to join another pack of isomorphic and substantially-isostatic (closely-matched in state) instances or to form its individual new pack. The circuit instances that remain in the old pack then vote on the inputs for modified leader, f-Ckt0, 2:3 (not shown). This modified voting is now free of the error-increasing pressure that the breaking-away instance (Ckt1) would have imposed. As a result, the modified voting produces a representative input for their so-modified leader, f-Ckt0,2:3 (not shown) where that representative input better minimizes the representation error for their respective pack. Such voting-based embodiments of the disclosure will be further detailed below.

A brief word is in order about terming the created leader (e.g., 480) as a 'fabricated' one. It is easier to first think of the created leader (e.g., 480) as being a 'fictitious' leader. However, as will be seen in the below description for the embodiment of FIG. 5A, in that embodiment it is the many 'follower' circuit sections within each pack who are relatively 'hollow' or 'tokenized' and it is the one fabricated leader of the pack who is explicitly-expressed as a full-bodied circuit card (with internal nodes) for purposes of predicting behavior for its respective pack of tokenized (hollow) followers. So during simulation, it is the fabricated leader (e.g., f-Ckt2:3 480) who becomes more 'real' and full-bodied than its followers (e.g., Ckt2 and Ckt3). On the other hand, when the simulated device (e.g., an integrated circuit) is ultimately built, it is the 'tokenized' followers (e.g., Ckt2 and Ckt3) that are realized as full-bodied circuits in the built device. And contrastingly, the 'fabricated' leader (e.g., f-Ckt2:3 480) is the one that may not be instantiated in the built device. Accordingly, the term 'fabricated' as used in the phrase 'fabricated leader' generally refers to an explicitly-expressed and full-bodied data-structure (e.g., the 'S-Part' in FIG. 5B) that is fabricated in the simulation process even though an ultimate instance of that leader does not necessarily appear in the ultimately fabricated device (e.g., integrated circuit).

FIG. 5A is a block diagram of simulation-supporting machine system 500 that is organized in accordance with the disclosure. Simulation-supporting system 500 includes a plurality of layered mechanisms for respectively performing the following enumerated functions: (1) Separating integrated components of a SPICE-like source file (510) into Topology-related definitions (520a), Geometry-related definitions (520b), and Name-related definitions (520c). (2) Compiling the separated-out Geometry-related definitions 520b into absolutely-valued definitions (530b). (3) Merging redundant ones of the compiled geometry-related definitions. (4a) Optionally partitioning explicitly-expressed, element-containing parts of the Topology-related definitions to thereby define partitioned sub-subcircuits 537. (4b) Optionally pushing-out the explicitly-expressed and partitioned sub-subcircuits to thereby define, called but childless, leaf daughters 538 for each partitioned Topology-definition (T-circuit), where the pushed-out leaf daughters define a new set of hierarchy levels (539) for the overall design definition. (4c) Optionally merging (525c) redundant ones of the pushed-out and Topology-defining leaf daughters. (4d) Optionally identifying topology-wise and geometry-wise redundant ones of non-leaf subcircuits based on the merger of their respective leaf daughters and merging instantiated definitions of such, accordingly isomorphic subcircuit definitions. (5) Identifying amongst the isomorphic leaf daughters (e.g., pushed-out partitions), those that should be behaving the same by virtue of their similar input states. (6) Grouping together, redundantly-behaving modules and/or leaf daughters on an on-the-fly basis each for inclusion in a respective pack of followers. (7) Creating a fabricated leader (e.g., 542/B2) for each pack of redundantly-behaving circuit sections (e.g., 553/B3). (8) Collecting (575) and routing (572) simulation results over time. (9) Identifying (554) represented followers who are leaving, or who are threatening to leave a led pack. (10) Transferring (535c) insurgent followers to respective new packs. (11) And identifying (582) and outputting result data of to-be-watched circuit sections or nodes.

The basic layers of system 500 maybe identified respectively in a start to finish order, as including: (1) a first means for receiving a SPICE-like source file 510; (2) a second means (515) for generating from the received source file, a Primitives-containing DataBase (PDB) 520 having: a Topologies-describing DataBase (TDB) 520a, a separated, but element-by-element tracking, Models/geometries-describing DataBase (F-GDB) 520b, and a separated but further element-by-element tracking, Naming/re-naming DataBase (NDB) 520c; (3) a third means (525b) for generating from the F-GDB, a geometries-instantiating library (A-GDB) 530b of element descriptions for incorporation in an Instances-containing DataBase (IDB) 530; (4) an integrator 525 for merging, on an element-by-element tracking basis, the geometrically instantiated parts of the IDB, thereby causing the IDB to express an isomorphic instances of the overall design definition; (5) a fifth means (535) for generating and thereafter maintaining on-the-fly (535c), a Simulations-containing DataBase (SDB) 540 that keeps track of anisostatic versions of the anisomorphic instance definitions; (6) a sixth means (570) for collecting simulation results belonging to tokenized followers of fully-instantiated, leader modules/partitions and routing the results back for feedback (573) and/or observation; and (7) a waveforms-collecting storage 580 for collecting the results data of watched portions of the under-simulation device.

We now study the illustrated, simulation-supporting system 500 under a more detailed level of scrutiny. The SPICE-like source file 510 that is supplied as an input may be formed on computer readable media (and/or maybe input as a manufactured electromagnetic signal) and may be constructed to provide either a flat or a hierarchical or a mixed definition of a to-be-simulated system. Such SPICE-like constructions are known to those skilled in the art. A yet-more detailed example of a SPICE-like structure will be discussed below in conjunction with FIG. 6A. For now, it is sufficient to understand that the design-defining source file 510 typically includes a plurality of 'subcircuit'-defining expressions such as 511 through 514. Each subcircuit descriptor (e.g., 511) explicitly defines for its respective subcircuit, at least one or more externally-exposed nodes (Nx's, each of which, may be alternatively termed as being an external 'port'). The Nx's provide an interface by way of which the corresponding subcircuit and its other internal components may interact with yet other described-subcircuits of the to-be-simulated system and/or with the outside world. (It is of course within the contemplation of the disclosure to distribute the subcircuit definitions 511-514 over a plurality of files rather than obtaining them from one file. Reference to a single file 510 is made herein for sake of simplified explanation. Likewise, references herein to singular storage means or singular databases or such other constructs may be understood to extend to embodiments with multiple such items as would become apparent to those of ordinary skill in view of the present disclosure, unless the contrary is otherwise expressly indicated.)

Besides the at-least-one external node (Nx), each subcircuit definition 511-514 may further explicitly define: one or more internally-contained nodes (Ni's) of the respective subcircuit. Information about the numbers of Ni's present and the names of such internally-contained nodes is often encapsulated in-the subcircuit definition and thus usually not intended for outside use. Additionally or alternatively, each subcircuit definition 511-514 may further explicitly define: one or more internally-contained and directly-expressed, primitive elements (Ei's) of the subcircuit such as transistors, resistors, capacitors and so forth. Additionally or alternatively, each subcircuit definition 511-514 may further explicitly define: one or more internally-called, but externally expressed and thus indirectly-referenced daughter-subcircuits (Xi's). It is possible for source descriptors 511-514 to contain descriptions of other kinds of internal primitives (e.g., wires) and to still be within the spirit of the present disclosure. The given list of possible contents of a subcircuit definition, namely, Nx's, Ni's, Ei's and Xi's; is given as an example and is summarized in braced region 513 of FIG. 5A. For purpose of graphic illustration, the following legend is used in some, but not all drawings Nx's— hollow circles; Ni's—filled circles; Ei's—solid rectangular icons or solid other element-representing icons; and Xi's— dashed rectangular icons. See for example, FIG. 6B.

A primitives-generating mechanism 515 is provided for receiving the source subcircuit definitions 511-514 and for automatically generating therefrom a corresponding plurality of primitive-subcircuit defining data-structures 521-524. The generated PsubCKT's (521-524) are stored within the Primitives-containing DataBase (PDB) 520. Each PsubCKT definition may be divided into a topology-describing section 520a (TDB), a formulas-based geometry-values defining section 520b (F-GDB), and an element/subcircuit naming or renaming section 520c (NDB).

In the F-GDB, geometry-values may be expressed as formula-like combinations of variables (e.g., L=x+y, W=u+v) and/or as absolute definitions. All of these are initially assumed to be formula-based even if they provide absolute expressions of physical value (e.g., Oxide thickness=0.5 nm) Instantiation of the formula-based geometry information into absolute values (e.g., L=2, W=5) may occur further downstream in the processing, when a below-detailed, instances generating mechanism 525 builds the EDB 530 (the Instances-containing DataBase). The separation of the PDB (520) data structures into a TDB portion 520a, a F-GDB portion 520*b*, and a NDB portion 520*c* is optional, but as will be seen, it can help to reduce the amount of data that will be used downstream for copying, tracking and representing different instances which share a same interconnect topology but may have different geometry parameters and/or different state values.

After the PDB 520 is initially built from the source system description 510, a one-for-one correspondence should exist between the subcircuit definitions 511-514 found in the source file 510 and the explicitly-expressed, primitive subcircuit data structures 521-524 generated by the primitives-generating mechanism 515. The PsubCKT's (521-524) preferably have a format (e.g., an index-based format) that will allow them to be each duplicated many times over while utilizing a relatively minimal amount of computational resources. It will be seen below that a PsubCKT such as 524 may be viewed as being an 'amorphic' template or stamp for producing a large number of explicitly-expressed, and geometrically instantiated, and state-wise instantiated circuit-defining data structures (I-circuits and S-circuits respectively). However, as it initially sits in the PDB 520, each such stampable and 'amorphic' template (PsubCKT) may generally fail to yet explicitly-express a specific instance of a subcircuit where the subcircuit 'instance' has a specific set of geometry values and state values. (It is possible to have a PsubCKT whose performance-affecting geometry descriptors are already fixed to absolute values, but that is not common practice for how to formulate a SPICE-type descriptor. More often such absolute values are 'passed' through a declarations library and/or through a subcircuit call rather than being locally fixed in the subcircuit definition.) Because in the general-case, the PsubCKT data structure does not yet tie to absolute and specific body-defining geometry values, the general-case PsubCKT (521-524) may be termed as being 'amorphic'—meaning it generally does not have specific body-defining values yet attached to it.

By contrast, an example of 'anisomorphic' instances is shown in FIG. 5A as a set of instance subcircuits positioned downstream in IDB 530. These 'anisomorphic' instances include an Mth set of geometrically-instantiated subcircuits denoted as: i1_subCKT_M {534.1 } through iNm_sub-CKT_M {534.Nm−}. Here, the number, Nm− is generally less than the total number (Nm++) of ultimate instances of the Mth set of circuits that will appear in the ultimately-built device (e.g., an integrated circuit) and that will correspond to the ancestral template, PsubCKT_M {e.g., 524}. One point being made here is that the Mth primitive subcircuit, PsubCKT_M {524} can serve as a stamp-like template for an Mth plurality of, downstream created, instantiated subcircuit descriptors (IsubCKT's 534.1-534.Nm−). Another concept being established here is that Nm− can be a fairly large number, say, 100, 1000 or even greater. Although Nm− is usually substantially less than Nm++ (and that is one of the advantages obtainable from practice of this embodiment of the disclosure), Nm− can nonetheless be a fairly large number in its own rights. So it is advantageous to form each PsubCKT template with an easily duplicatable (easy to stamp) format. That may be achieved with index-based, implied linking as will be seen below.

It will be further seen below that each of the explicitly-expressed 'anisomorphic' instances in IDB 530 may itself become a template or stamp for producing a plurality of explicitly-expressed, 'anisostatic' simulation-leading parts (leaf S-circuits or S-parts—see FIG. 5B). One further example of a plurality of 'anisostatic' simulation-leading data structures is shown in FIG. 5A, in the 'Pyramid View' 550A below SDB 540 as the set of S-circuits, 555.1 through 555.Nm+. Here, the number of state-instantiating S-circuits, Nm+, is generally greater than the corresponding number, Nm− of geometry-instantiating I-circuits; but this number Nm+ can still be less than the total number (Nm++) of ultimate instances that will correspond to the ancestral; primitive template for those S-circuits, (e.g., PsubCKT M 524). Even though Nm+ is usually substantially less than Nm++ (and that is one of the advantages obtainable from practice of the illustrated embodiment of the disclosure), Nm+ can nonetheless be a fairly large number in its own rights. So it is again advantageous to form each ancestral PsubCKT template with an easily duplicatable format. That may be achieved with index-based, implied linking as will be seen below. It is not absolutely necessary, however, to re-condition the format of the source file 510 into an index-based primitives structure 520, as is done by the primitives-generating mechanism 515 in order to practice the here disclosed invention. Various facets of the disclosure may be practiced without such re-conditioning. However, such pre- or re-conditioning can help to significantly speed the simulation process along and is therefore preferable at least for the reasons given above and others as will be seen below.

We now turn our focus back to the formation of the PDB 520. The uppermost of the illustrated, primitive subcircuit blocks, 521 (also identified as PsubCKT A) may correspond to a so-called 'top' or 'main' or 'mother' circuit 511 of the input source file 510. Although it is a 'main' circuit, by convention it is still referred to as a subcircuit. This main subcircuit 511 may indirectly reference (or call) daughter-subcircuits in a tree-like hierarchical manner as was demonstrated by item 302 (Call B) of FIG. 3A. If that example is used, the interconnect graph (310) of the design definition 510 of FIG. 5A maybe such that PsubCKT B (522) becomes a called-child (a daughter cell) of the main subcircuit A (521). In similar fashion, the illustrated PsubCKT M (524—not to be confused with the top 'M' or 'mother' structure of FIGS. 3A-3E) may be a called-child of the main, 'A' subcircuit 521 or it may be a child or Nth generation grandchild of the secondary subcircuit B (522) or of another such PsubCKT. The ellipses between items 522 and 524 indicate that any number of primitive subcircuit data structures (PsubCKT's) may exist within the PDB 520 and that the parent-child relationships between these primitive subcircuits may be as complex as that which may be defined in the input source file 510.

In order to aid the understanding of certain concepts presented herein, a first graphical icon 526 is shown in FIG. 5A next to the PsubCKT's 521-524. Icon 526 represents a given parent-child relationship (PX) as may be explicitly expressed in a given PsubCKT (e.g., 521) by its calls to one or more daughter subcircuits. Each of the primitive subcircuit data structures, 521, 522, etc., can include data representing such a primitive-wise expressed, parent-child relationship (PX, 526). One exception however, are those primitive subcircuits (e.g., 524) which form the leaves of the hierarchical tree, where such a tree is defined by the source file 510. (This hierarchical tree roots from the top or main subcircuit 511/521 and expands into branches, subbranches, and finally leaves. By definition, a leaf subcircuit has no called children.)

A second graphical icon 527 is further illustrated in FIG. 5A to represent the primitive connectivity graphs (PG) that may be expressed in each primitive subcircuit 521-524. Each PG 527 may define connections between the various nodes (Nx's, Ni's) and internal elements (Ei's) of that primitive subcircuit. Those skilled in the art will appreciate that the whole of a given connectivity graph 527 may be artificially partitioned into subparts. (See partition 538a of the below-described, 'instantiated' connectivity graph IG.) One possible partitioning algorithm looks for transistor or like current-conducting elements that share a common channel implant. Such an algorithm is sometimes referred to as channel-connected partitioning. Broad-lined item 528 in icon 527 represents a set of channel-connected (or otherwise connected) set of elements as may be found by a machine-implemented, partitioning algorithm that is operating on a corresponding PsubCKT. By way of a more concrete example, the channel-connected elements 528 may include the PMOS and NMOS transistors of a simple CMOS inverter. Another possible partitioning algorithm that may be used is one that looks for transistor elements that are connected according to predefined, gate-forming or other circuit-forming templates. These are nonlimiting examples. Other partitioning algorithms may be employed depending on what kind of leaves a budding-out process seeks to develop. As will be ultimately seen herein, we want to employ partitioning algorithms that have a good likelihood of isolating structures that have many like-isolated and isomorphic partner structures in the overall design definition. The isomorphic partner structures (e.g., 538a and 538b) may then be merged (525c) to form a many-times shared and instantiated leaf-circuit descriptor such as below-described, IsubCKT-P (539). Then the symmetric, simulation-results replication concepts of FIG. 3E may be carried out to one extent or another as may be desirable.

Like their sourced and spawning subcircuit definitions (511-514), the PsubCKT's (521-524) generally do not explicitly express every detail of the design definition 510. This is so because an 'instance' of each detail is not yet necessarily expressed explicitly at the PsubCKT stage. Instead, such details may be implicitly defined by repeated calls (X-references, see FIG. 6A) within one PsubCKT to a once-expressed, other PsubCKT. Such details may be further implicitly defined by variable-based, formula expressions of geometric values such as $L=x+y/z$, where x, y and z are variables or call-passed parameters and where the variable-based expressions can resolve differently in different areas of a fully-flattened design description. It is possible (but not necessary) for the PDB 520 to have only one explicit-expression for the main subcircuit (A) and just one explicit-expression for each iteratively-called subcircuit (B, C, . . . , M), and yet the same could define a very large and complex system when ultimately flattened.

Figure 7A:
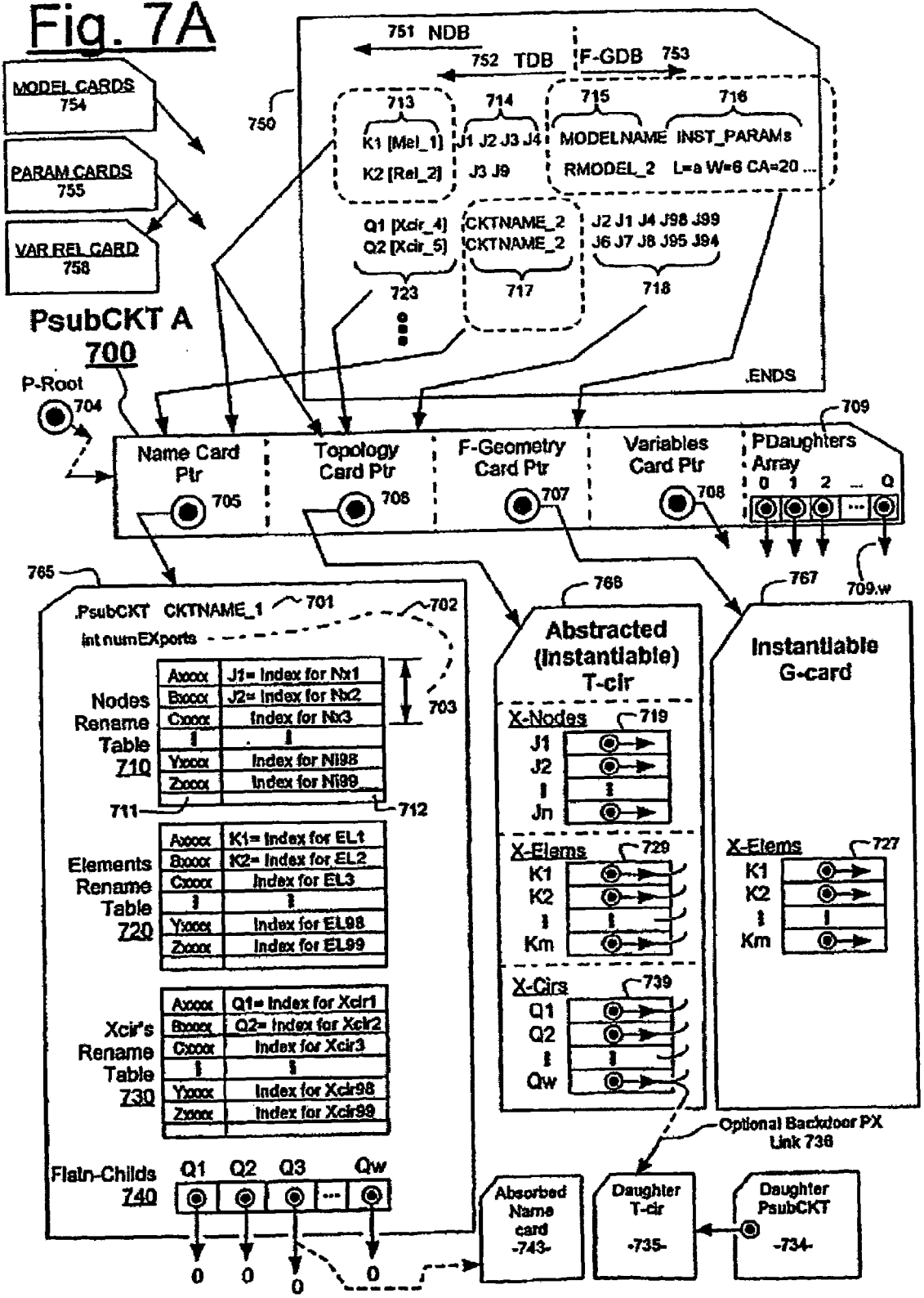
FIG. 7A illustrates a first data structure in accordance with the disclosure for implementing a primitives database (PDB) and further illustrates how topology-describing data can be isolated by formation of T-circuit descriptors so that iso-topological components can be more easily found and how geometry-describing data can be isolated by formation of G-circuit descriptors so that iso-geometric components can be more easily found.

Building of the IDB 530 proceeds after the Primitives-containing DataBase (PDB) 520 has been built, with the P-cards (521-524) of the PDB each divided to include a corresponding topology-describing portion (T-card, one shown at 524a in 'Pyramid View' 550A, see also 767 of FIG. 7A) and a corresponding, formula-based geometry-describing portion (G-card, not shown in FIG. 5A, see 773 of FIG. 7A). An instances generating mechanism 525 is actuated to produce a set of 'instantiated' I-cards 531-534 (plus optional 539, discussed below) from respective ones of the P-cards 521-524. In so doing, the instances generating mechanism 525 usually 'expands' the design definition by converting the implicit subcircuit definitions in the PDB 520 into a more detailed set of instantiated subcircuit definitions 531-534 (I-cards) that have absolute geometry expressions (A-GDB 530b) associated with them.

The instantiated subcircuit definitions (I-cards) may differ from the primitive subcircuit definitions (P-cards) in several ways. Instead of having a roughly one-to-one correspondence with the subcircuit definitions of the source file 510, the relationship is generally of a many-to-one kind. An exception to this may be had in the top or main subcircuit definition 511/521 which will not need to be instantiated more than once. For each of the deeper-level subcircuits (e.g., B, C, D, etc.), there will generally be many instantiated subcircuit definitions. So taking the PsubCKT B card 522 as an example, its geometrically instantiated counterparts (I-cards) 532 in the IDB may be numbered as i1 through iNb−, where Nb− is a whole number that is typically less than the final number Nb++ of ultimately-instantiated counterparts (361, 362, etc.) that will be seen in the fully-flattened circuit (e.g., 360 of FIG. 3A or fully-debudded representation 318 of FIG. 3D). Nb− can still be a fairly large number if the primitive main (mother) subcircuit expression 521 includes many calls to daughter subcircuit 522 with each such call passing a respectively different set of geometry parameters (and/or other physical attribute parameters) to the called PsubCKT 522.

By way of a more concrete example for FIG. 5A, assume that the top PsubCKT A (521) includes dozens of calls to primitive subcircuit B (522), with many, but not necessarily all, of these individual calls passing different geometry-defining formula expressions and/or different parameter variables and/or different other model parameters to the called subcircuit B. As an example, a first set of B-calling expressions in PsubCKT A (521) may specify the length, L of a given transistor (Mel-1) as being defined by the compilable formula expression, '$L=x-y/z$'. In such a case, even though there is just one primitive subcircuit definition 522 expressed in the PDB for the multiply-called PsubCKT B (522), when the L parameter is instantiated for each call, the L parameter may take on different absolute values depending on how the variables x, y and z are locally resolved under the HSPICE or SPICE-like other language that is being used for source file 510. The instances generating mechanism 525 should therefore test each of the calls expressed in A to the PsubCKT B and determine what geometrically instantiated parameters are ultimately being passed to each called instance of PsubCKT B. If a substantially same set of geometry parameters are being passed to a given first group of calls to PsubCKT B, it can be concluded that the ultimate instances (fully-flattened counterparts) of those first calls will be isomorphic. (See test 402 of FIG. 4A.) In such a case, rather than generating separate instance cards (I-cards) for each member of such an isomorphic first group, the instances generating mechanism 525 preferably merges them into just one IsubCKT card for the group, say for example I-card 532.1 (which corresponds to instance number one of a PsubCKT B call).

If a substantially different set of geometry formula expressions and/or parameters is being passed to one or more members of a given, second group of calls to the PsubCKT B (consider a further call to the transistor model of Mel-I which passes a different, compilable formula expression, such as: '$L=x+y/w$') then, it may be concluded that the ultimate instances of those second calls will be isomorphic with respect to each other, but it may also be concluded that they are either anisomorphic or isomorphic relative to the ultimate instances of the first PsubCKT B calls depending on whether their respective absolute values resolve to be different or the same. (Consider the cases where $y=0$ and/or $w=-z$ for both of formula expressions, $L=x+y/w$ and $L=x-y/z$, then the absolute values may resolve to be the same.) In the case of different resolutions of absolute values, the instances generating mechanism 525 preferably generates a single new IsubCKT card for each group of one or more instances that share a same set of absolute geometry definitions, say for example card 532.2 (geometry-differentiated, instance number two of a PsubCKT B call). Although not explicitly shown, card 532.2 is understood to be within the stack of IsubCKT cards denoted as 532.1 through 532.Nb–. The same is repeated for further calls to PsubCKT B until a collection of Nb– cards is built in the IDB 530 for the one PsubCKT B card (522) of the PDB 520. In the general, the number Nb– will be less than the absolute number Nb++, of ultimately-realized instances of PsubCKT B that will exist in the fully-flattened design. It should now be seen from the above that, because of the merging of geometrically same instances, each IsubCKT B card in the collection 532.1 through 532.Nb– should, generally speaking, be geometrically anisomorphic with respect to another such card in the 532.1-to-532.Nb– collection. (Of course, in a less efficient embodiment it will be possible to have some redundant cards present in the 532.1-to-532.Nb– collection.)

The term 'card' incidentally, is understood here to refer to a data structure that is stored in computer-readable media or is conveyed over a communications link to a processor that can usefully recognize the data structure as constituting circuit-representing information in terms of interconnect topology, model parameters (e.g., geometry), names of circuit-contained entities or various combinations of such. Historically, physical subcircuits were built on individual printed-circuit cards and interconnected modularly via a supporting frame or a mother board. See the PCB-visualization of FIG. 3C. Each such physical subcircuit had external terminals or ports (Nx's) for connecting to the mainframe or mother board. Each such physical subcircuit had internal elements (Ei's) such as transistors, resistors, etc., and internal nodes (Ni's) at which internal interconnections were made. The term 'card' apparently stuck when the transition was made to expressing and simulating such arrangements with software. A 'call' to a further subcircuit may be thought of as an insertion of a daughter board into a respective socket position of the calling, mother card.

It will be understood by extension of the above example for the PsubCKT B card (522) that each further primitive card will be similarly instantiated based on what instantiating model parameters (e.g., geometry values and/or formulas) are passed when the primitive is called. As such, the expressed instances of leaf primitive 524 (PsubCKT M) in the IDB may be enumerated as 534.1 through 534.Nm–, where Nm– is an integer defining the number of anisomorphic calls made for the instantiated subcircuit I.subCKT M. Although PsubCKT M (524) may initially be a leaf daughter by virtue of M not calling yet another PsubCKT, it will be seen now that PsubCKT M may be caused to give birth to new child (P) by way of a partitioning and push-out process.

Again, to aid in the understanding of certain concepts, a first graphical icon 536.1 is shown in FIG. 5A next to the IsubCKT's 532-534. (Note that there is only one instantiated definition of the top IsubCKT A as shown at 531.) Pictorial icon 536.1 indicates that a given, instantiated subcircuit definition (e.g., 532.1) may contain not only the instantiated parent-child relationship definitions (IX) and interconnect topology definitions (IG), but also instantiated definitions for passed model parameter formula expressions such as transistor length (e.g., L=a) and transistor width (W=b), where after compilation of these formula-based expressions, 'a' turns out to have an absolute value of 2 and 'b' turns out to have a value of 5. Geometry parameters can also be passed as absolute numbers (e.g., L=2) within a call. Second graphical icon 536.2 indicates that a second instance card in a given IsubCKT's stack may have differently resolved geometry parameters, such as L=3 instead of L=2. (Length can be expressed in terms of microns or in terms of other like measurement standards.)

Another pictorial icon 537 is provided to indicate that each instantiated subcircuit may further have associated therewith, more detailed information concerning its internal, instantiated connectivity graph (IG). In other words, each instantiated IsubCKT should respectively have a instantiated and partitionable definitions such as 537 of the connections made between its various nodes and its internal elements.

At this stage of our discussion, the primitive and instantiated connectivity graphs (PG's and IG's) have, generally-speaking, been described as defining pretty much the same connectivity definitions as did the original subcircuits 511-524 of the spawning source file 510. However, that does not have to be so. Prior to, or during the stamping of PsubCKT's into IsubCKTs, a transition may take place in which the topology-describing parts (T-cards) of at least some of the PsubCKT's may be partitioned, and one or more of the partitions may be pushed-out as called children of the PsubCKT from which they where pushed out (budded-out). See also, FIG. 8A. In the partitioning phase, certain ones of the nodes and internal elements of T-cards will be logically re-associated to correspond with an instantiating partition such as 538a or 538b in FIG. 5A. (See also FIG. 7C.) The partitions 538a, 538b will then be 'pushed-out' of their home T-card, to in essence, define a new hierarchical level 539 that did not inherently exist in the hierarchical design definitions of the source file 510. The interconnect topology-definitions and geometry-definitions for pushed-out elements will follow their respective elements as those are pushed out. (See again FIG. 8A, discussed below.)

We will now describe in more detail one embodiment in accordance with the disclosure where the partitioning and push-out operations creates 'childless partitions' and where each such 'childless partition' (or 'leaf daughter') is a childless data structure which can be considered as a special species of a generic X-call. (Such X-calls will be better described when we get to FIG. 6A.) A childless partition cannot have internal X-calls or internal partitions of its own. Such a 'childless partition' therefore consists of only nodes (Nx's, Ni's) and fundamental circuit elements (Ei's). This is a locally-flattened and fairly simple design definition that can, by itself, be used or easily modified or adapted for optimized, behavior-prediction by an underlying simulation engine/algorithm. A same one or different ones of simulation engines-and/or simulation algorithms may be assigned to respective one's of pushed-out partitions for predicting the behavior of that childless partition (leaf daughter). For example, one leaf daughter may have its behavior predicted by an ACES engine (Adaptively Controlled Engine Simulator) while another leaf daughter has its behavior predicted by a WR or NRL engine. Different engines may be respectively plugged in to predict the behaviors of different kinds of leaf daughters as the user may desire. This concept is represented in FIG. 5A by the modularly, pluggable-in drive engines 540a that attach to SDB 540. It will be better explained when we get to FIG. 5B.

Although piece-wise simulation of hierarchical leaf daughters and/or use of specifically-adapted drive engines 540a for each such daughter is desirable under certain situations, it is within the scope of the disclosure to allow for full or partial flattening of the PsubCKT's by way of selective or blanket debudding and to use just one or a few simulation drive engines 540a respectively for such a fully or partial flattened rendition of the PsubCKT's 521-524. As was explained with respect to FIG. 3D, flattening or debudding may be carried out by converting one or more respective calls into explicitly-expressed declarations of the respectively called daughter subcircuits. A mother circuit in essences re-absorbs the internal elements (Ei's) and nodes (Ni's) of her previously called child. In such a case the driving simulation engine has to deal with a more complicated (flattened) mother cell instead of with the simpler leaf daughters. It is also within the scope of the disclosure to allow for re-partitioning and subsequent re-budding of flattened subcircuit definitions as may be desired by a user. The differently partitioned and rebudded expression of the subcircuit and its children may facilitate certain kinds of simulations. Accordingly, various complex schemes for creating pushed-out partitions are contemplated, where the latter partitions are allowed to have one or more, limited number of levels of children or grandchildren. The 'childless partition' is the easiest construct to work with because, in the final analysis, the simulation engine/algorithm builds its predictions on foundational constructs that have just nodes (Nx's, Ni's) and fundamental circuit elements (Ei's) in them.

In one embodiment of FIG. 5A, construction of the Instances-containing DataBase (IDB) 530 is preferably a multi-step, and parallel-steps process. First, the source-file's design definitions 510 are preferably split into interconnect topology definitions (T-circuit cards 520a) and geometry definitions (G-circuit cards 520b) and name-tracking cards (520c). Elements of the T-cards are preferably linked implicitly to corresponding geometry expressions for such elements in the G-cards by use of a common indexing system. Other methods for logical linking may be used if desired. The combination of initial T-cards and initial G-cards form the primitive subcircuit definitions (PsubCKT's) 521-524 of the PDB 520. The PsubCKT cards each form a sort of template or stamp whose image is then copied (stamped) by inheritance into the IDB 530 and further qualified (detailed) by instantiated geometry data. More specifically, during the stamping process, initial T-cards may be morphed into partitioned and budded T-cards by process 525 as each such initial T-card is copied into the IDB stack 532-534. Also during the stamping process, initial G-cards may be duplicated as respective ones of passed-parameters are converted from formula expressions into absolute value expressions. See also FIG. 7B. The duplicated and resolved G-cards (G-cards with absolute values) are each logically associated with a respective T-card to thereby define a respective, I-card (geometrically-instantiated, circuit describing card). There will typically be a plural number of unique (anisomorphic) instances of I-cards for each spawning P-card.

During the instances stamping process, each to-be-copied instance of a subcircuit definition (P-card) or post-copying I-card may be examined or organized such that isomorphic, internal substructures (partitions) of two or more I-cards can be recognized as being essentially redundant by virtue of their having substantially same interconnect topologies (T-parts) and substantially same geometry values (G-parts). If found, such redundant partitions may be merged into a single, instantiated partition definition. This merging of redundant partition descriptions is schematically represented to a limited extent in FIG. 5A by the transfer of information from box 537 to dashed boxes 538a and 538b, and then by merger 525c of the two redundant parts, 538a and 538b as they flow into new hierarchy layer 539 or after they are already in layer 539. More details concerning partitioning, push-out, and merger will be given below when we get to FIG. 5C.

For now, and in less abstract terms suppose that prior to partitioning and push-out, the level-M instances, I.1subCKT M (534.1) and I.2subCKT M (534.2), where the latter is understood to be in the stack 534.1-534.Nm-; each contain a plurality of internal, CMOS-implemented NAND gates and/or INVERTERs, all respectively of a same isomorphic structure but each explicitly-expressed as a set of fundamental circuit elements (e.g., P and N-channel transistors). A connected-channel partitioning algorithm or the like could be used to find these isomorphic gates or at least power-to-ground, current-carrying subsections of them (common channel implant subsections). Then, in order to reduce the internal complexity of each IsubCKT M (534.1-534.Nm-), each explicit-expression therein of the isomorphic gate structure (or subsection thereof) can be converted into a call to a commonly-shared and childless partition structure such as 538a and 538b. The definitions of the pushed out children, 538a and 538b, will actually reside in new hierarchy layer 539 rather than in their spawning hierarchy layer 534. The old hierarchy layer 534 will call on one or more instances of an IsubCKT P in new layer 539 rather than explicitly-expressing the elements of that called IsubCKT P. The fundamental circuit elements (e.g., P and N-channel transistors) are in essence pushed-out of their home IsubCKT M, thereby leaving behind an eviscerated home IsubCKT M that may be left with no more than merely nodes, signal-routing wires, and calls to outside entities (external circuits and externalized partitions). This approach follows the spirit of FIG. 3E wherein the organelles (e.g., E5-E8) of mother cell M" are pushed-out so that mother cell M" consists essentially of calls (pipes) 319a to its budded-out children 319b, and of signal coupling, external nodes (Nx's, not shown in FIG. 3E). Because of the partitioning and push-out steps which may take place in FIG. 5A during creation of the IDB, the IDB 530 may be structured so that isomorphic subcircuits thereof can be more readily identified and further merged to thereby reduce redundancy of circuit expression. The topological and geometric equivalence tests 402 of FIG. 4A can be optionally extended after merger step 525c, by looking for level-M IsubCKT's (534) that call a merged and therefore same level-P IsubCKT (534) or a same group of such level-P IsubCKT's. Then that merger process can be taken further up the hierarchy tree as may be desirable. It will be seen below that information for proving model equivalence in accordance with test step 404 may be provided at the same time that geometry equivalence is proven (see FIG. 7B). Once two level-M IsubCKT's (534) are proven to have a same internal interconnect structure (same T-circuits) and to similarly call same level-P IsubCKT's (539), the isomorphic level-M IsubCKT's (534) can be merged. This isomorphic proofing process and merging process can propagate back up the hierarchy tree, from the level-P leaf buds (539) to the level-A mother card (531). Once all morphology-wise same instantiations of various subcircuits have been found and merged, the post-merger IDB 530" may consist of essentially, anisomorphic (not same) instance descriptors 531-539.

Mechanism 535 copies the instantiated and optionally partitioned/out-pushed and optionally merged/compressed database (now reference as 530"-double prime) expression of anisomorphic instances 531-539 into the Simulations-containing DataBase (SDB) 540. For each IsubCKT card (531-539) there will initially be one corresponding Sim.sub-CKT card or 'S-card' (e.g., 555.1). An assumption is implicitly made by this one-to-one correspondence between IsubCKT cards and the S-cards. It is that all the ultimately-realized instances (in the fully-flattened design) of each IsubCKT card are isostatic and thus satisfy tests 401 and 403 of FIG. 4A. This is a fair assumption because simulation has not yet begun and all input signals can be assumed to be at a ground state. However, as simulation proceeds, each IsubCKT card may have associated with it, several S-cards. IsubCKT card 534.1 may have associated with it, S-cards 555.1 through 555.7 because seven distinct states have developed for instances of that-one representation, of otherwise isomorphic subcircuits.

Now we are ready to begin driving a simulation. For this endeavor, an 'Intuitive View' 550B of the Simulations-containing DataBase (SDB) 540 is provided in FIG. 5A. It will be understood later that the same SDB 540 may be alternatively represented by a 'Pyramid View' 550A in which I-circuits 534 inherit topology-definitions of respective T-circuits 524a and S-circuits 555 inherit geometry-definitions of respective I-circuits 534.

The intuitive view 550B has a 'full-bodied' flattened portion 551 and a 'tokenized' or 'thinned' and thus, compressed, followers portion 559. The reasons for these names will become apparent as the simulation process is explained. Full-bodied portion 551 is filled with co-opting, simulation leaders. Compressed portion 559 is filled with hollowed-out or tokenized followers. These introductory characterizations will become clearer when we discuss FIG. 5B.

At the start of simulation, an initial 'event' will be posted onto an event queue 565 of the one or more simulation engines 540a. For the sake of simplicity, we refer collectively to simulation engines 540a as if they were a single simulation driver 560. Initial conditions will now be applied to fundamental circuit elements such as transistors and capacitors while, changing, external input signals are now being applied to one or more external nodes of the overall circuit (typically to the Nx's of subcircuit A (521/531)). The applied, external input signals 561 will generally propagate (563) out, at the given event time 562, across the various hierarchy levels of the under-simulation system (551/559) by way of an interconnect topology-expression that will be detailed later. We assume here that one of the state-changing signals 563 flows into the B hierarchy level, and more specifically to the gate of a first NMOS transistor 556 that happens to be represented (instantiated) in a simulation-ready form within a first, full-bodied module which is identified here as B1, 541.

The one state-changing signal (563) does not however flow to a corresponding gate of a second NMOS transistor 557 that happens to be represented (instantiated) within a second, full-bodied module, where the latter is identified here as B2, or 542. Moreover, the one state-changing signal (563) does not flow to a corresponding gate of a third, but fictitious NMOS transistor (not shown) that is implied to reside inside a third, but-tokenized module, where the latter is identified here as B3, or 553. It is understood that behind B3, and within the folds of the compacted part 559 of the intuitive view 550B of the under-simulation system, there will be yet other tokenized modules; B4, B5, B6, etc. (not shown) that are currently situated in a same state as the third tokenized module, B3. Because of this, the second, full-bodied module, B2 (542) can operate as a leader or representative for tokenized followers, B3, B4, B5, B6, etc. The simulation results for second NMOS transistor 557 can be deemed to be the representative results for the corresponding, but fictitious NMOS transistors (not shown) in the tokenized followers, B3, B4, B5, B6, etc.

Once simulation result calculations are completed for full-bodied or nonfictitious elements, such as transistors 556 and 557, and once results obtained for full-bodied modules such as B2 are copied or mirrored (this operation being represented by redundancy-lock line 558) to the corresponding, tokenized followers, B3, B4, B5, B6, etc., the results may be collected by a collecting unit 575 and routed 572 through the interconnect topology (573) of the under-simulation system (551/559) for use in the next event tick 562.

Although the leader/followers process has been described for just modules B2, B3, etc., it should be understood that it applies at every level of hierarchy. Stimuli will be applied to elements (e.g., transistors) in full-bodied modules such as 543-546. Simulation results for a leader such as module C2a (544) may be copied/mirrored into a same-state follower such as C3a. Leader C1b (545) may have a different state and/or set of instantiated model parameters (e.g., geometry values) and may have its own set of tokenized followers; module C3b for example. Due to interconnections between the various hierarchy levels, the simulation-determined responses 567 to the various stimuli, 563 and 573, may propagate across all parts of the system, from the lowest, leaf levels 548 of the hierarchy tree to the uppermost hierarchy modules (541, 542, 553, etc.).

During this signal-propagating process, a conflict may arise for one or more of the followers (B3, C3a, C3b, etc.). The new state of a given follower (e.g., C3b) may no longer be in close proximity to that of its appointed leader (e.g., C2b/546). If this happens, the old leader/follower relationship should be broken and a new one should be established between more closely in line leaders and followers. Alternatively, a tokenized follower (in region 559) which cannot find an existing leader (in region 551) may instead spawn the creation of an additional, full-bodied module to represent that highly-divergent follower.

Additionally during the signal-propagating process 567, a situation may arise where the states of two isomorphic leaders (say 545 and 546), and the states of their respective followers (say C3a and C3b) have drifted into close proximity with one another. If this occurs, it may be advantageous to tokenize one of the leaders and have both groups of followers follow the remaining leader.

It should be apparent from this discussion about the intuitive view 550B, that when new, full-bodied modules are added to the full-bodied portion 551, the SDB 540 is being correspondingly 'expanded'. (In one embodiment, new S-cards are being added to the stack of cards 555.1-555.Nm+.) When pre-established, full-bodied modules are removed from the full-bodied portion 551, the SDB 540 is being correspondingly collapsed. (In one embodiment, S-cards are being deleted from the illustrated stack of cards 555 1-555.Nm+.)

The SDB-building mechanism 535 has further mechanisms 535c for carrying out such expanding and collapsing in respective response to detection of state divergence and convergence among representatives of isomorphic subcircuits. A set of divergence/convergence detectors 554 are provided and operatively coupled to the SDB builder/collapser mechanism 535/535c for causing the builder/collapser mechanism to appropriately add leaders to, or subtract leaders from the SDB 540. More specifically, in one embodiment, divergence/convergence detectors such as the illustrated 554a through 554d are each respectively attached to a respective group of one leader (e.g., B2 module 542) and corresponding followers (e.g., B3, B4, etc.) at least for monitoring the amount of state divergence between each follower and its appointed leader. If the measured divergence between a given follower and its leader exceeds pre-specified limits, the follower may be re-assigned to a closer leader, or a new leader (new S-part) may be created for servicing that divergent follower. As a result of the latter, leader-adding operation, the intuitive view 550B changes. Where initially there may have been only one or a few leaders (say 543-546) in a given hierarchy level of the full-bodied portion 551, now a new, further leader (not shown) is added and the full-bodied part 551 of the intuitive view 550B grows larger in that hierarchy level (e.g., the C level). Correspondingly, in the pyramid view 550A, new S-circuit cards 555.*j* (where 1>j<Nm+) are added with respectively different S-parts associated to them (see items 505'/" in FIG. 5C).

In terms of a more concrete example, suppose that the top, A subcircuit (represented by IsubCKT 531) contains a set of 20 interface nodes (Ni's) named DATA0 through DATA19. Suppose further that subcircuit A calls subcircuit B twenty times, each time passing a respective one of the signals DATA0:19 to a DATABIT external node of called subcircuit B. As simulation starts, all of the DATA0:19 signals at first are at zero volts in this example. Later, however, the DATA1 signal diverts from the pack by beginning to ramp up to 5V. Under this situation, a separate S-card should be added for this diverging instance. One of the divergence/convergence detectors 554 should detect the state divergence and cause the expander/collapser mechanism 535*c* to add the new S-card with its respective S-parts to the SDB 540.

Suppose that later during our example the DATA1 signal returns back to the 0V state and other signals, DATA0,2:19 have stayed grounded. In some situations, the separate S-card that had been created in the SDB 540 for the DATA1 signal may now become superfluous because the relevant isomorphic subcircuits have again become isostatic relative to one another. A single leader will suffice. The divergence/ convergence detectors 554 may detect this change and responsively cause the expander-collapser mechanism 535*c* to remove the superfluous S-card for the DATA1 signal and re-assign the subcircuit that gets the DATA1 signal back to the old S-card.

We now refocus our attention to the whole of the intuitive view 550B and its surrounds. As we have seen, external input signals 561 are passed through a simulation driver (560) and are topologically mapped to respective internal nodes of simulation circuit cards (S-circuits, see FIG. 5C). Those signal-receiving nodes can be explicitly expressed within both the full-bodied portion 551 and the compacted part 559 of the intuitive view. But the compacted part 559 does not explicitly-interface with element simulating engines such as represented by transistor icons 556 and 557. Only the full-bodied leaders (e.g., B1, C1*a*, D1*a*1) do. Simulation driver 560 next drives the full-bodied subcomponents of the full-bodied portion 551 to a next simulation state based on the stimuli presented to those leaders. Also used in the simulation drive are the models (320) for predicting the behaviors of those elements and the instantiated model parameters (e.g., geometry values) assigned to the otherwise, anisostatic leading parts. The results of the simulation drive are mirrored from the output-nodes of the leaders (551) to the corresponding output nodes of their respective followers (559). Then the totality of the results 575 is picked up by a results-collecting mechanism 570 and propagated by a results router 572 so that appropriate system nodes receive their respective new stimuli in accordance with an interconnect topology (573) defined by the source file 510 for the system —and which interconnect topology is also defined (perhaps in a slightly different way depending on flattening and re-budding) by the T-circuit cards 520*a* of the PDB. If stimuli divergence is detected by the divergence/ convergence detectors 554, new leaders are created and/or followers are re-assigned to more-representative leaders. The simulation driver 560 is then activated again for establishing the next set of states for the next simulation event tick 562. The illustrated, simulation clocking mechanism 565 is responsible for determining what the next simulated time tick 562 (t) of the next event will be. It is often desirable to adaptively vary the time periods between simulation events based on the rate at which result signals 575/571 are changing. Accordingly, an inter-event timing means 564 is provided for responding to result signals 571 obtained by the collecting means 570 and for adjusting the next event parameters of event-declaring mechanism 565 as deemed appropriate by internal software of the simulation engine or engines 540*a*.

Some of the result signals produced by unit 570 are associated with node or element instances whose states are to be watched during simulation. A watched-nodes/elements router 582 is provided and coupled to the output of resulting-collecting means 570 for identifying result signals that map to watched nodes/elements. A watch source file 590 connects to means 582 for allowing users of the simulation system 500 to programmably define which nodes and/or elements are to be watched. The filtered results of means 582 are supplied to a waveforms files storage means 580 for collection therein. A results displaying means 585 may be provided and coupled to the waveforms storage means 580 for generating state versus time waveforms or other types of displays as may be useful to the end users of the simulation system 500.

Several advantageous features should now be apparent. Because its simulation engine(s) 540*a*/560 drive(s) only the modules (e.g., 541-548) in the full-bodied portion 551, the simulation system 500 is not burdened with performing separate, individualized computations for all the follower modules (B3, B4, etc.). It can instead perform one common computation on a pack leader (e.g., B2) and the results can be copied or mirrored 558 to the corresponding followers (e.g., B3). Also, because only the leaders (e.g. B2) need to be fully instantiated (by expressing their internal states as well as their geometries) during simulation, storage space can be efficiently conserved for implementing the SDB 540. Storage space does not need to be wasted for storing S-cards (555.1-555.Nm+) for representing state-wise redundant subcircuits that are also isomorphic.

Another feature to be noted is the sequencing of the PDB-build up (515), followed by IDB-build up (525) and then followed by the SDB-build up (535) and subsequent expansion/contraction (535*c*). The generic interconnect topology information of one T-card (e.g., 524*a* of the pyramid view 550A) can be inherited by many, geometry instantiating, I-cards (e.g., 534). In turn the isomorphic subcircuit information that one corresponding I-card represents can be inherited by many, state instantiating, S-cards (e.g., 555.1-555.7—others of cards 555.7-555.Nm+ may inherit geometry and inherited topology from yet other I-cards). Thus an efficient, inverted pyramid scheme 550A is established where the most shareable information (topology 524*a*) is at the apex and the least shareable information (current state 555.1) is at the base of the inverted pyramid.

It is, of course, within the contemplation of the disclosure to have somewhat less efficient embodiments wherein certain percentages of redundancy are permitted among T-cards, or I-cards, or S-cards even though such an allowance may cause the simulation to consume more storage space and run slower. The illustrated simulation-supporting system 500 can also run in a fully-flattened mode wherein there is just one T-card for expressing the interconnect topology of the whole of the flattened mother cell, and wherein there is just one I-card for expressing the geometries for all the internal organelles in the whole of the flattened mother cell, and wherein there is just one S-card for expressing the states of all the internal organelles in the whole of the flattened mother cell. The illustrated simulation-supporting system 500 can also run in a partially-flattened mode wherein some parent modules have absorbed some or all of their respective childern and/or grandchildern. Thus the full spectrum of possibilities represented by morphing from FIG. 3D (fully or mostly flattend) to FIG. 3E (fully budded-out and highly hierarchical) can be handled by the illustrated simulation-supporting system 500.

Refering now to FIG. 6A, a brief and introductory tutorial will now be given respecting SPICE-like design defining languages. Much of this is well known to those skilled in the art. However, certain naming nomenclatures will be established here and afterwards used for describing novel data structures and methods that are in accordance with the disclosure. Accordingly, skilled practitioners may nonetheless wish to skim along with this description of FIG. 6A.

A sample HSPICE™ source file is shown at 601. Opening symbol 602 exposes some of the internal data structures within the source file 601. At the gross level, it is seen that source file 601 may contain a plurality of expression 'cards' including subcircuit-expressing cards such as 600, 620, etc., model-defining cards such as 630, 631, etc., and parameter-defining cards such as 640, where the latter may be distributed locally among the other kinds of cards or provided in a global definitions part of SPICE™ source file 601. The inter-parameter relationships defined by the parameter-defining cards (e.g., 640) project according to various global, local and passed-parameter scoping rules of the SPICE™ language.

The expressive bounds of a subcircuit card such as 600 may be delimited by language-reserved, start and stop words such as '.SUBCKT' and '.ENDS' (end of subcircuit card). After the opening delimiter (.SUBCKT), names may be set forth as shown at 611 for what constitute external connection nodes (Nx's) of the subcircuit 600. These Nx names can be arbitrarily chosen. For convenience, we show the names of external nodes as having 'Nx' prefixes in example 611. By convention, an arbitrary name for the corresponding subcircuit of card 600 should be provided at the end of the subcircuit declaration line, as is shown at 612 (CKTNAME 1).

The body of the subcircuit card 600 may include declared names for fundamental electronic components or elements (e.g., Mel_1, Rel_2, Cel_3). It may also include declarations of names for externally-defined and here-called-upon subcircuits (e.g., Xcir_4, Xcir_5, etc.). By convention, the names of transistors should start with the letter 'M'. Thus, the component name, Mel_1, is understood to refer to a transistor. See the schematic drawn in FIG. 6B.

Each declared element name (e.g., Mel_1) should be followed by a naming of its respective, external nodes. In the example provided at 614, the external nodes of Mel_1 are conveniently named as D, G, S and B and these here-chosen names respectively refer to the drain, gate, source and body (substrate) terminals of the transistor. It is the order in which these external nodes are named rather than their arbitrarily-assignable names that counts. Any arbitrary set of unique names could have been assigned to each of the ordered nodes, as will be seen shortly.

Following the declaration of the component's external nodes at 614, it is conventional to then identify a corresponding model for the element as is indicated by the notation 'MODELNAME' shown at 615. The model name declaration 615 is often followed by a declaration 616 of instantiating parameters that are to be 'passed' to a simulation engine that is simulating the named model 615.

A more concrete example is seen in the next line wherein a particular resistor element is named Rel 2, its corresponding model is declared as being named 'RMODEL 2' and the model parameters which are passed to that model include geometry parameters which are declared as L=5, W=b and CA=20. Further, instantiating parameters may be passed to the named model depending on the nature of the model. In this particular example, it is assumed that the named RMODEL_2 requires that length (L), width (W) and cross-sectional area (CA) values should be passed, as constants, or variables, or formula-based expressions of combined variables and/or constants, to the model simulator. The declared resistor Rel_2 apparently has two external nodes which connect to the S internal node of the CKTNAME_1 subcircuit and to the Nx2 external node of this same subcircuit. The length and cross-sectional areas of this declared resistor are fixed by the given absolute numbers. However, its width is a variable, b, whose value may be, passed in from a subsuming and calling other circuit card.

In the next line of example 600, a capacitor element is declared and named as 'Cel_3' and its corresponding model is named as 'CAPACITOR_3'. Instantiating constants for the capacitor plate length and plate width as well as oxide thickness are passed to the named model. One terminal of the capacitor is connected to the G internal node of the subcircuit while the other is connected to the Nx1 external node of the subcircuit. This is shown in the schematic of FIG. 6B.

By convention, the prefix letter 'X' is reserved in HSPICE for indirectly referencing or 'calling' external subcircuits into the present subcircuit. An arbitrary name (prefixed by the 'X') may be given to each called instance of a given other subcircuit. Thus, the illustrated Xcir_4 and Xcir_5 are two differently named instances which indirectly call in, a number of times, the one subcircuit defined by the next subcircuit card shown at 620. As seen in the example 620 drawn for the called subcircuit, it is named CKTNAME_2. The latter subcircuit name appears at 617 and also at 622. In the example given at 618, it is assumed that CKTNAME_2 has five external nodes of its own. In example 618, these five external nodes are respectively connected to the G, D, B, Nx3 and Nx4 nodes of subcircuit 600. (See also the representation of Xcir_5 in FIG. 6B.) At 619 it is shown how instantiated parameters may be passed from the calling subcircuit 600 to the called subcircuit 620. The X-called subcircuit may have default, local values that are overridden by the passed values 619 when the passed values 619 are present.

In FIG. 6B it is seen that an indirectly-called subcircuit such as Xcir-5 may be thought of as a daughter board which plugs into the calling mother card 600'. Information about the internal structuring of the indirectly-called daughter card (Xcir_5) is generally not provided within the specification 600 of the calling card (CKTNAME_1). Instead, the internal contents of the called subcircuit card 620 must be fetched and compiled in order to determine the actual nature of the daughter board (Xcir_5) which will be plugged in mother/parent board 600'.

Referring to box 620 (FIG. 6A), it is seen in region 621 that the external nodes of this X-called subcircuit (CKTNAME_2) can be differently named from what was provided at 618 of the calling card. Moreover, in region 624 it is seen that arbitrarily chosen, local names may be assigned to internal nodes of the second subcircuit 620. Different models may be used as is indicated at 625 and different geometric parameters maybe passed as is shown at 626. Moreover, the called subcircuit 620 may itself further call yet another subcircuit as is indicated at 627. The connections to the third-level called subcircuit may be internally defined as is indicated at 628. Thus, it is seen how a hierarchy of substructures can be easily defined within an HSPICE-like source file such as 601.

In the example of model card 630, it is seen that, following a model-introducing, reserved word of the language ('.model'); a specific model name (e.g., 'MODEL_NAME') can be declared after and various parameters (Param1, Param2, etc.) may be declared for, or passed to that model. In the more specific example of card 631, it is apparent that an N-channel FET transistor is being modeled and that it has a default gate oxide thickness of 3 microns. Other parameters such as channel width and length may be passed as variables into this model specification 631. (It is common practice to also pass Tox when calling a transistor model.) In parameter card 640 it is shown that various geometric or other parameters may be declared locally or globally and their values may be converted to absolute ones at the time the definition is compiled by an appropriate compile tool through the use of variable-defining expression rules similar to those used in the C++ language. (In our below described embodiments, absolute values for geometry expressions are compiled as the A-GDB 530*b* is being built.) The above concepts concerning FIG. 6A are generally known to those skilled in the art. In higher numbered figures such as 7A-7C we will build on top of these concepts.

First some observations. There are problems associated with conventional data structures such as shown in FIG. 6A. Information about different kinds of attributes such as interconnect topologies, subcircuit hierarchies, models and their parameters are all interwoven into a complex, tangled, and seemingly-unextractable scheme. The arbitrary names which may be assigned to various local and called elements (e.g., Mel_1 and Xcir_5) of each subcircuit (e.g., 600) can be arbitrarily, long and complex. Similarly, the names assigned to nodes can be arbitrarily long and complex. This does not bode well for a simplified, build-up processes such as is contemplated in FIG. 5A for forming the hierarchical pyramid of topology-describing information (524*a*), geometry-describing information (534), and states-X8—describing information (555.1-555.Nm+), which goes into defining the Simulations-containing DataBase (SDB) 540.

We will begin in FIG. 7A to explain how a complex, tangled, and seemingly-unextractable, design defining scheme such as that shown in FIG. 6A for SPICE-like languages may be taken apart and put back together into a new format so as to more easily support the hierarchical information pyramid (524*a*-534-555) used in FIG. 5A. The extraction process will be easier to understand if we first understand what end-goal we are heading towards.

Figure 5B:
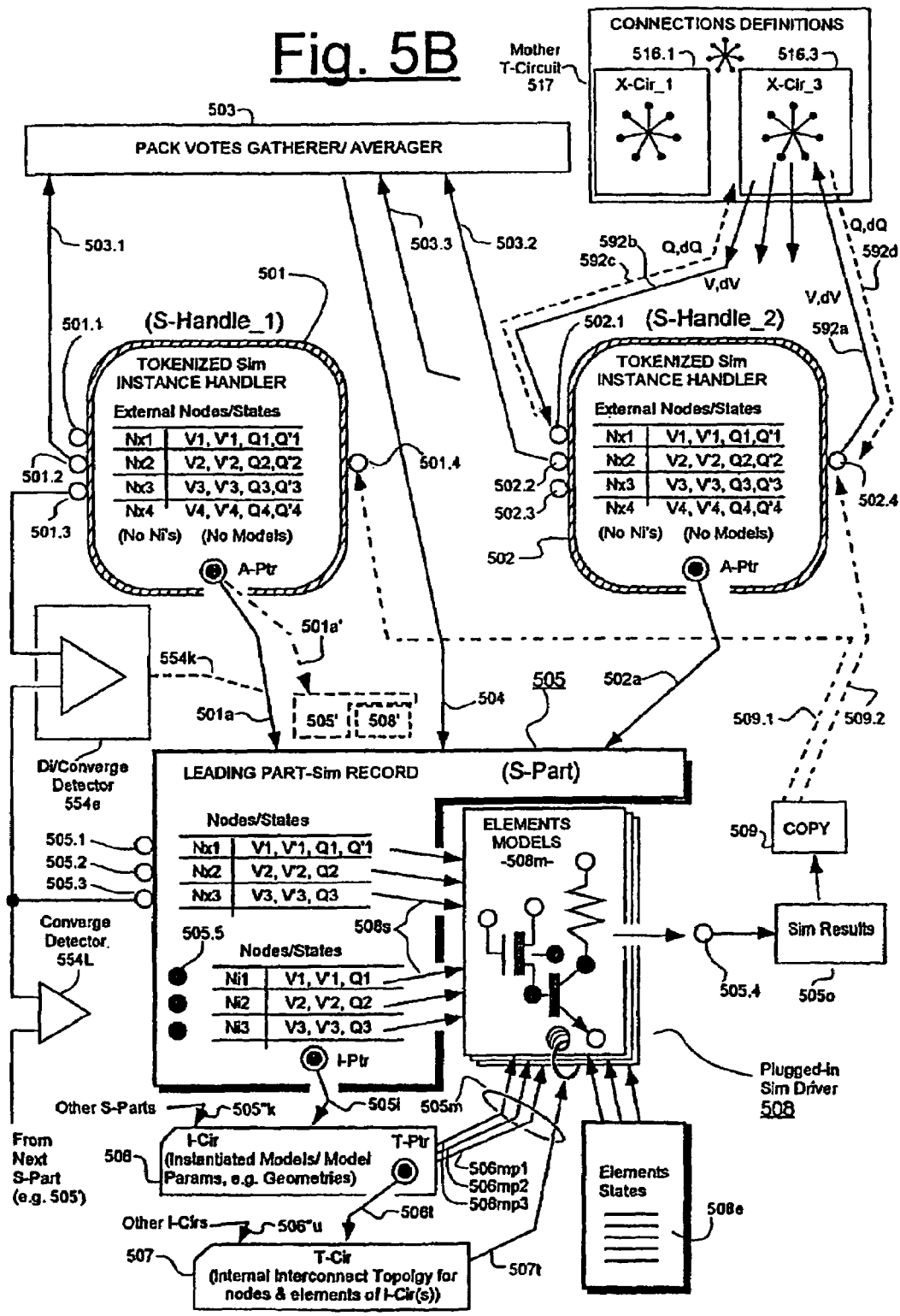
FIG. 5B illustrates how divergence/convergence detectors may operate to determine which of multiple and full-bodied leaders (S-Parts), a set of one or more tokenized and following subcomponents (S-Handles) should follow.

FIG. 5B shows that end goal. In it we see first and second follower structures 501 and 502 as well as a leader structure 505. The follower structures 501, 502 can be thought of as hollowed, shell representations or tokens for respective first and second, ultimately-fabricated circuit instances of a subsuming design definition that we here refer to as an S-circuit (see 555.3 of FIG. 5C). Such an S-circuit can represent any point in a spectrum of possibilities from representing a fully-flattened whole system (e.g, debudded 318 of FIG. 3D) to representing a small and internally flat leaf daughter (e.g., 319*e* in FIG. 3E) in a budded-out part of a hierarchically-expressed whole system.

As seen in FIG. 5B, the first follower 501 is a relatively simple data structure that includes a pointer (A-Ptr) 501*a* to its current leader, S-part 505. First follower 501 also includes current, external state records 501.1-501.4 for its respective external nodes. In the illustrated example, each of the first and second follower structures 501, 502 as well as leader structure 505 has four external nodes, respectively denoted as Nx1-Nx4. The nodes can be bidirectional. For sake of simplicity here, Nx1-Nx3 are shown as subcircuit input nodes while the Nx4 ones are shown as output nodes. (These could be bidirectional if desired.) The tokenized followers do not need to have any data items representing internal nodes (Ni's) or internal elements (Ei's) or internal interconnect topologies or internal element models or corresponding model parameters (e.g., geometry values). Instead, they can merely store current state values such as V, V-dot, Q, and Q-dot for their respective Nx's (501.1-501.4 and 502.1-502.4). The specific ones of the external-port, physical attributes that are stored (e.g., instantaneous voltage, instantaneous rate of change for voltage, etc.) can vary depending on the specifics of a plugged-in simulation engine 508. Those skilled in the art can appreciate from this disclosure that any one different drive engines (540*a*) can be plugged in, where the choice of drive engine types can include ACES, NRL, WR and so forth. Each such different type of drive engine may have a different set of physical attribute inputs that it may find useful for accurately predicting the next state of its respectively modeled circuit (505 plus 506 plus 507).

In contrast to the relatively-hollow followers (501, 502), the leader (a so-called 'S-part') 505 is more complicated and full-bodied because it inherits into itself the absolute geometry definitions of an I-circuit card 506, where the latter inherits into itself the interconnect topology definitions of a T-circuit card 507. For the external nodes (Nx's) expressed by the inherited T-circuit card 507, the S-part 505 publicly declares a corresponding set of external node states 505.1-505.3. For the internal nodes (Ni's) expressed by the inherited T-circuit card 507, the S-part 505 internally declares a corresponding set of internal node states 505.5-etc. The combination of the publicly-expressed, external node states 505.1-505.3 and the privately-declared, internal node states 505.5-etc. are transmitted as indicated by 508*s* to the plugged-in simulation driver 508.

Each S-part 505 includes an I-pointer 505*i* by way of which the S-Part can acquire physical attribute definitions for its respective element models 508*m* from a pointed-to I-circuit 506. By inheriting such an I-circuit, the S-part 505 also indirectly inherits a respective T-circuit 507 because the I-circuit has a T-pointer 506*t* by way of which the I-circuit can acquire interconnect topology definitions for its respective elements from T-circuit 507.

More specifically, in the illustrated embodiment of FIG. 5B, the S-part 505 acquires absolute geometry values from I-circuit 506 because this inherited I-circuit 506 points to absolute geometry cards (see below-detailed FIG. 7B) that each associate a model name and instantiating model parameters with a corresponding one of the elements (e.g., transistors, resistors, etc.) belonging to the S-part 505. In the illustrated embodiment, it is assumed that there are 3 internal elements declared for S-part 505 by its I-circuit 506, namely, a MOSFET, a bipolar transistor, and a resistor. The corresponding model identifying, and parameter-passing records for these three elements are identified as 506*mp*1, 506*mp*2 and 506*mp*3. The corresponding interconnect topology between these identified 3 elements is identified as 507*t*. An ordered, logical association between these model/parameter records 506mp1-3 and interconnect topology 507t is indicated by lasso 505m. In one embodiment, current internal states of each of the elements of the S-part are maintained in an elements states storage region 508e of the plugged-in simulation driver 508 rather than by the S-part data structure 505.

At the same-time that S-part 505 inherits the model identifying, and parameter-passing records of I-circuit 506, other S-parts (not individually shown) may simultaneously and similarly inherit the same information for their respective, internally-declared elements from I-circuit 506 as is indicated by pointer (s) 505"k. These other S-parts will typically have node states (internal and/or external) and/or internal element states 508"e (not shown) that are different from those 508e of the illustrated, leading S-part 505. And because of that, the other S-parts (e.g., 505') will be 'anisostatic' relative to S-part 505 and will have anisostatic simulation drivers such as 508' plugged-in to them. All the S-parts 505, 505', etc., that point to I-circuit 506, however, will have same geometry instantiations and same internal interconnect topologies. This iso-geometric and iso-topological inter-relationship is created because I-circuit 506 further includes a T-Pointer 506t that points to a topology-describing, T-circuit 507. All S-parts (505, 505', etc.) that point to I-circuit 506 are inherently isomorphic even if they are not iso-static.

Because T-circuit 507 is further downstream along the set of inheritance pointers 505i, 506t; the T-circuit 507 does not itself know what specific elements reside inside any one of its pointed-from S-parts (where 505 can be one of many such S-parts), or what models and model parameters/geometry values are being used to instantiate those elements, or what current, node-state values 508s are being passed to the models, or what internal element states 508e the plugged-in simulation driver 508 (or 508') holds. But the T-circuit 507 does define how the terminals of those elements interconnect via the internal and external nodes (Ni's & Nx's) of the S-part 505. Schematic link 507t and lasso 505m therefore represent the logical tying together of the element terminals and Ni's and/or Nx's of S-part 505 and the internal and external node states of S-part 505, and the reflection of these behavior-affecting aspects into a counterpart behavior-predicting mechanism (e.g., a differential equations solver) of the plugged-in simulation driver 508.

At the same time that I-circuit 506 inherits the interconnect topology defining information of T-circuit 507, other I-circuits (not individually shown) may simultaneously and similarly inherit the same interconnect topology definition for their respective, and internally-instantiated elements, from the same T-circuit 507 as is indicated by pointer (s) 506"u. These other I-circuits will typically have different model parameters/geometry values and will thus be anisomorphic with respect to I-circuit 506 even though they all have a same, internal interconnect topology in common by virtue of pointers 506t and 506"u pointing to the same T-circuit 507.

The combination of S-part 505 and plugged-in simulation driver 508 may be thought of as an internally-flattened and complete subcircuit description because all the information needed for predicting the behavior of the underlying instance is present within this combined set of data structures 505/508 either through direct declaration (e.g., node states 505.1-505.5 and element states 508e) therein or through inheritance from instantiating data structures 506 (I-circuit) and 507 (T-circuit). This internally-complete set of subcircuit descriptions and drive engine 505/508 can therefore be run by itself to obtain corresponding, next-state-prediction results 505o for the underlying instance of circuitry. (If the overall system description were fully-flattened as hinted to in FIG. 3D, then combination 505/508 would describe the entirety of the fully-flattened mother cell M' (301d, after debudding) and there would be only one S-Handle such as 501 pointing to this one combination 505/508 and there would be only one I-circuit 506 and only one T-circuit 507, the latter describing the full interconnect within the fully-flattened mother cell M'. The example of FIG. 5B is not that of a fully-flattened system because we show at least two S-Handles, 501 and 502.)

In our relatively simplified example of FIG. 5B, it is assumed that all the next-state results 505o of S-part 505 develop only at output node 505.4. In the more general case, such next-state results 505o may develop at any or all of the external nodes 505.1-505.4 of the engine-driven S-part combination 505/508.

Although the S-part/engine combination 505/508 has been described here as an encapsulating pair of data structures 505/508 that publicly show their external node states 505.1-505.4 for interaction with other such S-part/engine combinations and for observation by users who designate one or more of the external node states 505.1-505.4 for recordation into waveforms storage means 580, it is also within the contemplation of the disclosure to allow selective routing of locally internal states of the S-part/engine combination 505/508 (namely, Ni Is 505.5-etc. and element states 508e) to the waveforms storage means 580 so that end-users can observe these S-part internal states if so desired.

Machine-implemented process 509 (COPY) copies or routes or reflects the engine-produced, next-state results 505O of the leading S-part 505 to corresponding nodes of the respective, but tokenized followers, 501 (S-Handle 1) and 502 (S-Handle 2). For sake of illustrative brevity, dashed copy lines 509.1 and 509.2 indicate such copying to only the respective output nodes, 501.4 and 502.4 of the exemplary followers. However, in the more general case, the next-state results 505o may be copied from any relevant or all of the external nodes 505.1-505.4 of the engine-driven S-part 505 to the corresponding Nx's (501.1-501.4 and 502.1-502.4) of those followers which have S-part 505 appointed as their leader. The results mirroring or copying process 509 may use the A-pointers (501a, 502a) of the followers to determine which followers (e.g., 501, 502) are to receive simulation results from what leaders.

After next-state results 505o are copied or routed from leader 505 to its followers 501, 502, etc. (there can be more than two, or alternatively there can be just one follower), the copied next-state results are then propagated from their respective follower nodes to other followers (or even back to themselves) by way of a higher level (parent), interconnect definition 516/517. The latter definition 516/517 represents an interconnect that surrounds the ultimate instantiations of the followers. This is to be distinguished from the internal interconnect 507 (T-circuit) that is to exist inside of each ultimately instantiated follower. In FIG. 5B we show a simple example wherein the copied next-state results of node 502.4 (of S-Handle 2) propagate via a first path 592a to a corresponding external node point (not shown) of a corresponding X-circuit 516.3 in subsuming T-circuit 517. S-part 505 is in essence a flattened leaf daughter which the mother T-circuit 517 calls into play when the mother T-circuit 517 declares X-circuit 516.3 as part of its (517's) interconnect topology. See also FIG. 5C wherein a corresponding mother T-circuit 517' is shown declaring within its array 584a, a set of leaf X-circuits 516' (X-cir3, 4, 5). The behaviors of these leaf X-circuits 516' (when instantiated by the geometry values of I-circuit 518' and the node states of mother S-circuit 555.3) are predicted by leader S-part/engine combination 505"/508". The mother T-circuit 517' of FIG. 5C should not be confused with a daughter T-circuit such as 507" (leaf T-cir) because each T-circuit can define a respectively different interconnect topology. Similarly, in FIG. 5B, mother T-circuit 517 should not be confused with a daughter T-circuit such as 507 (leaf T-cir defining internal connections within S-part 505).

Each X-cir called within mother T-circuit 517 has a corresponding one S-handle. Illustrated S-handle 502 is the one assigned to leaf X-circuit 516.3 The other illustrated S-handle 501 is the one assigned to leaf X-circuit 516.1. The mother T-circuit 517 may also have additional leaf and non-leaf X-circuits each of which is assigned a respective one S-handle. (Non-leaf X-circuits are not shown in FIG. 5B, but see arrays 584*b* and 587 in FIG. 5C).

Still referring to the reflection in FIG. 5B of the S-handle result data (502.4) back to the external nodes of its corresponding X-circuit (516.3) in the mother T-circuit 517, these child-to-parent, propagated results may include the reporting of a voltage change (ΔV) and/or of a change in V-dot (LdV/dt). When reflected back to the parent subcircuit (to mother T-circuit 517) these state changes may be routed by the mother's interconnect topology to one or more, subsequent nodes in the mother T-circuit 517. From there, the changes propagate, as routed by respective S-handles to yet other, leaf S-parts and/or to non-leaf S-circuits (see 555.6 and 555.9 in FIG. 5C). The non-leaf S-circuits may have their own S-parts which ultimately receive the propagated change signals by way of respective S-handles (by way of voting from respective, follower S-handles). So in the end, a result signal (e.g., 592*a*) output from one S-handle may finds its way to an input of another, or even the same S-handle. In order to reduce illustrative clutter, the FIG. 5B example assumes that the mother T-circuit 517 has a feedback path which couples node 502.4 back to node 502.1. As such the delta-V or delta-dV/dt change signal 592*a* flows through the subsuming T-circuit 517 and continues via path 592*b* from another node of same X-part 516.3 and thus get reflected back to node 502.1 of the same S-Handle-2. It is understood that the same result signals 592*a* can also flow via another path in mother T-circuit 517 to say, node 501.1 of S-Handle 1; and/or to another node of yet another S-Handle data structure or can terminate at a node of a parent T-circuit.

While feedback signal 592*b* is reflecting back to node 502.1,—and let us assume it also reflects into node 501.1— each of the other nodes of followers 501, 502 can simultaneously receive other simulation result signals which move to them by reflection from the mother T-circuit 517. In one embodiment, charge signals (Q and dQ) flow backward along paths 592*c* and 592*d* to compensate for voltage changes invoked by the result flows along paths 592*a* and 592*b*.

When simulation result signals reach a node such as 501.3 of S-Handle-1, the state of the receiving S-Handle changes such that the receiving S-Handle 501 might no longer be considered to be isostatic with its earlier appointed leader combination 505/508. A divergence/convergence detector such as the one illustrated at 554*e* measures the amount of divergence, if any, between nodes (e.g., 501.3) of the results-receiving S-Handle 501 and corresponding nodes (e.g., 505.3) of its earlier-appointed leader 505. If the measured divergence exceeds a predefined limit or fails to satisfy a predefined criteria, control output 554*k* of the divergence/convergence detector modifies the A-Ptr 501*a* of the diverging follower 501 so that the A-Ptr appoints a new leader combination of an S-handle and plugged-in simulation driver: 505'/508'. This shift of allegiance is indicated by dashed version 501*a'* of the A-Ptr. If the divergence/convergence detector mechanism 554*e* cannot locate a pre-existing, new but more closely matching leader for diverging follower 501, it creates a new such leader combination 505'/508 by copying old leader combination 505/508 and by thereafter modifying the external node states of the new leader 505'/508' to more closely match those of the insurgent follower 501. In response to the modified external node states of the new leader 505'/508', the internal element states 508*e'* (not shown) of the new leader 505'/508' can thereafter diverge away from the internal element states 508*e* of the old leader combination 505/508. It is assumed that the internal element states 508*e* of the old and new plugged-in simulation-drivers 508/508' are essentially the same at the moment of replication.

If a leader combination (say, 505/508) has two or more followers, then the next-state values at the respective nodes (e.g., 501.1-501.4 and 502.1-502.4) of the followers are gathered by a pack-votes gathering mechanism 503 and the gathered values (votes) are combined by averaging or other error-reducing algorithms (e.g., least squares) to arrive at voted, next external-state values for the pack leader (S-handle) 505. By way of illustrative example, collection lines 503.1, 503. and 503.3 are shown collecting next-state votes from nodes 501.2, 502.2 and a like external node of yet another, unseen follower. The voted-upon next state or combined result is returned by way of path 504 and stored into corresponding node 505.2 of the pack's leader. It is now seen from this mechanism how the basic concepts of FIG. 4B may be carried out in an automated machine system.

On occasion, the external states of leaders such as 505 and 505' may drift back into close proximity with one another. If it is determined that the internal states (e.g., 505.5-etc.) of these externally-wise converging leaders are also converging, it may be desirable to erase one of the converging leaders and let the survivor take over as leader for both of the original packs of followers. To this end, a leadership-convergence detector 554L is shown to be provided for detecting converging leaders and for invoking the leadership merger operation.

Figure 5C:
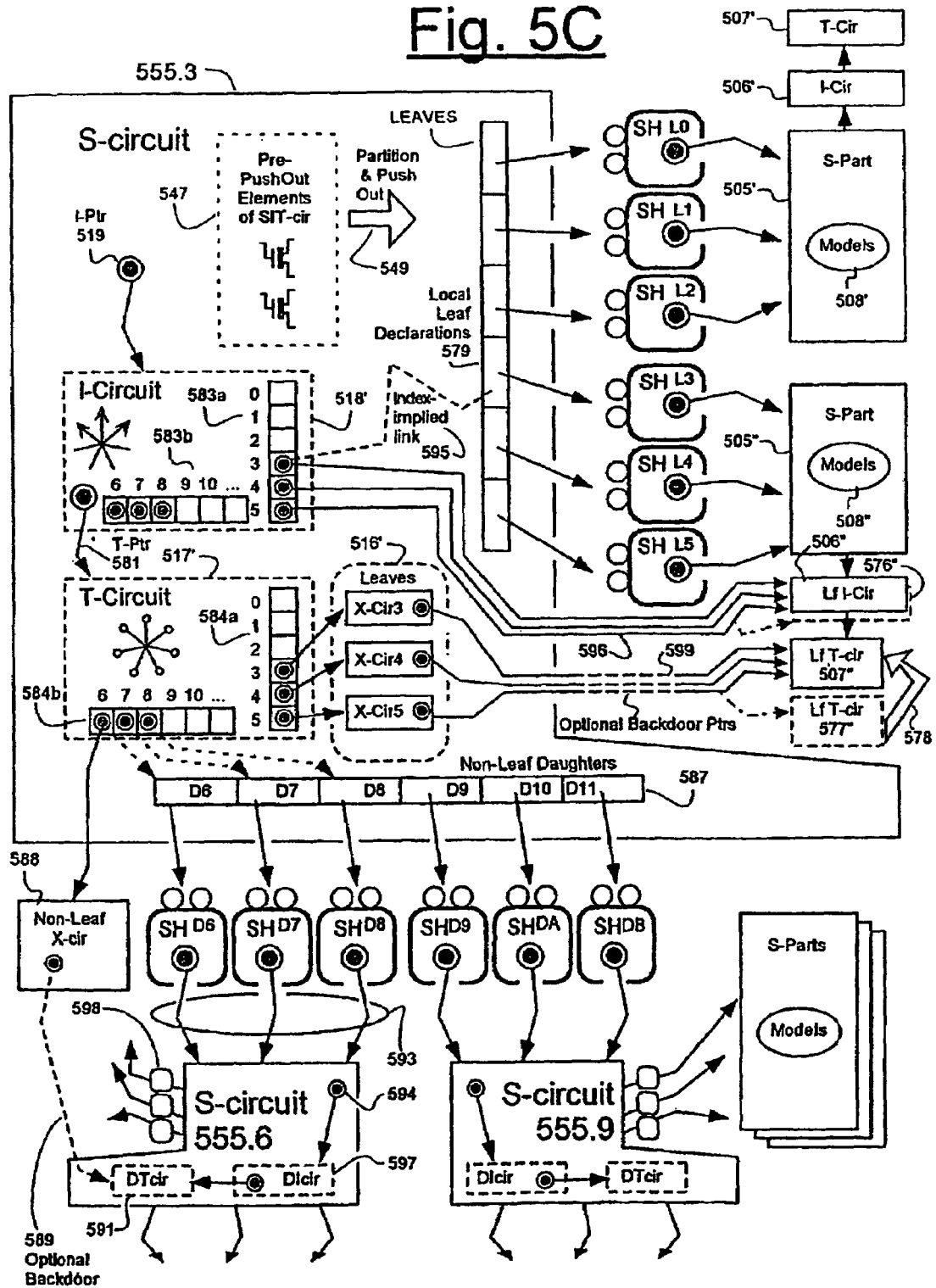
FIG. 5C illustrates how tokenized components (SH's) in an S-circuit (in the SDB) can tie in to representing S-Parts and how respective, iso-topological and iso-geometric T-Parts and I-Parts may be grouped together; as well as how respective, iso-topological and iso-geometric X-circuits may be grouped together.

FIG. 5C provides more of a bird's eye view of a set of simulation leaders, namely, S-parts 505', 505"; and of their respective groups of followers, SH-LO through SH-L2, and SH-L3 through SH-L5. The 'L' in the generic designation, SH-Ln, indicates that the handle is a 'leaf' member of a corresponding S-circuit 555.3 and that such a SH-Ln handle has a corresponding leaf daughter X-circuit (e.g., 516') declared in its corresponding T-circuit 517'. The same S-circuit 555.3 can have non-leaf members such as the illustrated SH-D6 through SH-DB. The 'D' in the generic designation, SH-Dn, indicates that the handle is a 'non-leaf' member of the corresponding S-circuit,555.3. and that such a SH-Dn handle has a corresponding non-leaf daughter X-circuit (e.g., 588) declared in its corresponding T-circuit 517'. Leaf daughter handles such as SH-L0 through SH-L5 appoint S-parts such 505' and 505" as their leaders. Non-leaf daughter handles such as SH-D6 through SH-DB appoint daughter S-circuits such as 555.6 and 555.9 as their respective leaders. The latter, daughter S-circuits (e.g., 555.6, 555.9) are daughters of mother S-circuit 555.3.

Although they are drawn as being outside of S-circuit 555.3, the tokenized follower structures, SH-LO through SH-L5 actually are embedded in a local, leaf-member declaring and calling region 579 of S-circuit 555.3. Daughter following structures, SH-D6 through SH-DB actually are embedded in a local, non-leaf-member declaring and calling region 587. Each S-Handle (SH structure) has an A-pointer to either a leaf S-part (505', 505") or to a nonleaf, daughter S-circuit (556., 555.9). Moreover, as seen in FIG. 5B, each S-Handle declares local states for its external nodes (Nx's such as 501.1-501.4). As a consequence, each S-circuit defines the states of its respective leaf (579) and nonleaf (587) members. Each members-containing S-circuit (e.g., 555.3) has an I-pointer 519 to a respective, members-containing I-circuit 518' just as each S-part has an I-pointer 505$i$ to a respective, leaf I-circuit (506 in FIG. 5B or 506" and 576" in FIG. 5C). The members of I-circuit 518' can include leaf I-circuits 506', 506" and 576" of FIG. 5C as will become apparent shortly.

Each members-containing I-circuit (e.g., 518') has a T-pointer 581 to a respective, members-containing T-circuit 517' just as each leaf I-circuit (506 in FIG. 5B) has a T-pointer 506t to a respective leaf T-circuit (507 in FIG. 5B or 507', 507" and 577" in FIG. 5C). The members of T-circuit 517' are defined by an ordered array of leaf pointers 584$a$ and nonleaf pointers 584$b$. Leaf pointers 584$a$ point to respective, leaf X-circuits 516'. The latter. X-cir's are associated with, and may optionally point (by way of optional backdoor pointers 599) to one or more leaf T-circuits such as 507', 507" and 577". T-circuit 517' defines how its respective members, X-cir3, X-cir4, X-cir5, X-cir6, etc. connect to one another. Leaf T-circuits 507" and 577" define how elements within each of X-cir3, X-cir4, and X-cir5 interconnect. If they are iso-topological inside, each of X-cir3, X-cir4, and X-cir5 may be associated with a common leaf T-circuit such as 507" and their optional backdoor pointers 599 may all point to common leaf T-circuit 507". If X-cir5 is originally associated with leaf T-circuit 577" and an analysis-and-merge step 578 shows that T-circuits 507" and 577" are equivalent, then X-cir5 may be re-associated with common T-circuit 507" and redundant T-circuit 577" maybe erased due to the equivalence finding and merger step 578 (the memory space of 577" is deallocated to free space).

Initially, the corresponding T-circuit 517' of S-circuit 555.3 may have a set 547 of locally-declared elements within its data structure. However, during a partitioning and push-out operation 549, interconnected elements within an established partition are assigned to a respective and new X-circuit, say X-cir5, and information about internal details of such a 'pushed out' partition are transferred into new T-circuit 577". The locally declared elements 547 of the T-circuit 517' are replaced with a call to X-cir5. If the equivalence finding and merger mechanism 578 finds that T-leaf 577" can be merged into T-leaf 507", it does so. The reassociation of X-cir5 to T-leaf 507" occurs in a primitives data structure which will be further discuss when we reach FIG. 7B.

A few words of precaution are worthwhile here concerning search-and-merge operations on T-circuits (such as T-leaves 577" and 507") and/or on P-circuits (see 700A of FIG. 7B) and/or on I-circuits (e.g., 576" and 506" of FIG. 5C). When we reach FIG. 7A, we will see that in some embodiments, T-circuit elements may be index-wise or otherwise each associated with a respective element name (e.g., Zxxx of EL99) and/or a respective element-instantiating card entry (e.g., Km of table 727) and that T-circuit daughter calls (X-circuits) may be index-wise or otherwise each associated with a respective reference (see pointer 709.1 of FIG. 7B) to a daughter T-circuit. However, within two topologically-equivalent, and about-to-be merged, T-circuits and their subsuming P-circuits, the index-wise ordered, or otherwise implemented associations between names and/or instantiations of elements and/or X-circuits and/or nodes may not be defined in exactly the same way. In other words, the about-to-be merged, T-circuits may be out of synchronization with-one another. During merger, one T-circuit may be deemed as a dominant, surviving one because it is not erased, while the other of the to-be-merged T-circuits may be deemed as the subordinate and non-surviving one because it will be erased. If it is found that the about-to-be merged, T-circuits are out of synchronization with one another, then the index-wise ordered, or otherwise implemented associations between names and/or instantiations of the subordinate and non-surviving T-circuit should be reshuffled (or otherwise recorded for tracking purposes) during or prior to merger so the structuring of its respective associations can be synchronized with those of the dominant, surviving T-circuit. Such resynchronization should be carried out for all data structures whose elements are synchronized with the subordinate and non-surviving T-circuit. Those skilled in the art will know how to do this for index-based or other such associations. Typically, the T-circuits and their subsuming PsubCKT's will be built and merged before corresponding I-circuits are built. As a result, I-circuits will automatically be in synchronization with their underlying T-circuits and will not have to be resynchronized (and neither will the afterwards built S-circuits). If I-circuits and/or S-circuits are built before their respective T-circuits are merged, then appropriate steps should be taken to maintain synchronization among all such pre-built data structures if a merger operation is being performed on them.

Referring still to FIG. 5C, it should now become apparent that, either because of the way it is originally formed, or because of a partitioning and push-out operation 549, the nonleaf T-circuit (e.g., 517') of each S-circuit (e.g., 555.3) should be devoid of elements and instead should contain only an internal interconnect topology description and calls to externalized X-circuits such as 516' and 588. As indicated by the dashed lines around it, seen the nonleaf T-circuit 517' associated with S-circuit 555.3 is not part of that S-circuit but is instead inherited via T-pointer 581 into the models-and-parameters instantiating, I-circuit 518' of that S-circuit. As is further indicated by the dashed lines around it, seen the-nonleaf I-circuit 518' associated with S-circuit 555.3 is not part of that S-circuit but is instead inherited via I-pointer 519 into that S-circuit.

Logical association between leaf I-circuits and leaf SH's may be implied by use of same of a same index value into indexed arrays 579 and 583$a$. For each of the leaf-type, Simulatable Handles (SH-L0 to SH-L5)'s in the leaf declaring array 579, there is a corresponding, model/parameters-instantiating pointer disposed in the I-leaf tracking table 583$a$ provided within corresponding I-circuit 518'. More specifically, index values 0-5 of leaf table 583$a$ match with respective index values 0-5 of leaf table 579. So SH-L3 corresponds with the one pointer of group 596 that emanates from position 3 of leaf table 583$a$. SH-L4 corresponds with the one pointer of group 596 that emanates from position 4 of table 583$a$ and so on. (Horizontally extending table 583$b$ keeps track of nonleaf daughters of the I-circuit 518'. Those will be discussed when we reach item 779 of FIG. 7B.)

Like the case for the T-leaves, 507" and 577", there is another automated, equivalence-finding and merging mechanism (not shown, but like 578) that looks for redundant, leaf I-circuits such as 506" and 576", and merges these together. The illustrated example assumes that the pointer of position 5 in I-tracking table 583$a$ originally pointed to I-leaf 576". After merger, it points to I-leaf 506" as do the pointers of positions 3 and 4 in I-tracking table 583a. That inherently tells us that the underlying subcircuits of SH-L3, SH-L4 and SH-L5 are isomorphic. This is so because they share same geometry values by virtue of their respective I-tracking table entries 583a.3 to 583a.5-pointing (596) to the same leaf I-circuit 506". The underlying subcircuits of SH-L3, SH-L4 and SH-L5 are also inherently iso-topological because their shared I-leaf 506" points to shared T-leaf 507".

Isomorphism, however, is not enough to justify having SH-L3, SH-L4 and SH-L5 all point to the common S-part 505" (where 505" here inherits I-leaf 506" and T-leaf 507") because these Simulatable Handles must further be deemed to be essentially isostatic to do so. If an external node state of one of SH-L3, SH-L4 and SH-LS diverges from the pack, then the divergent SH may be assigned to a new S-part/engine, where the new S-part/engine is copied from original S-part/engine 505"/508" and thereafter modified by vote, or it is already pre-existing.

As seen in FIG. 5C, the T-circuit data structure includes an indexed, leaf X-circuits tracking table 584a whose entries align with the pointers provided in the I-leaf tracking table 583a. The indexed X-circuits tracking table 584a may be dedicated for tracking only leaf X-circuits such as 516' or it may be continue into table 584b which tracks non-leaf X-circuits such as 588. Table parts 584a and 584b are shown separately so that the difference between leaf SH's and non-leaf SH's can be better seen. It is also within the contemplation of the disclosure to provide separate tracking tables for leaf and non-leaf X-circuits. It is also within the contemplation of the disclosure to provide separate tracking tables for leaf X-circuits that were originally declared in the source file 510 (FIG. 5A) and leaf X-circuits that were created by the partition and push-out process 549. Other variations of this sort for keeping track of which leaf or non-leaf members belong to what original or afterwards created declarations may be had, including maintaining tracking between T-circuits, I-circuits and SH's by means other than implied index matching (595).

Just as isostatic, leaf SH's (e.g., SH-L3, SH-L4, SH-L5) may be grouped together to point to a leading S-part/engine combination 505"/508", isostatic, nonleaf SH's (e.g., daughter handles, SH-D6, SH-D7 and SH-D8) may be similarly grouped together as indicated by lasso 593 to thereby appoint a leading S-circuit (e.g., 555.6). The appointment of a leading S-circuit for daughter SH's and the switching of a daughter SH from one follower pack to another is essentially the same as that described in FIG. 5B for leaf SH's that appoint S-parts as their leaders. The difference is that an appointed S-circuit (e.g., 555.6) will not directly generate simulation results. Instead, the appointed S-circuit may have its own leaf SH's 598 that appoint respective, daughter S-parts (e.g., like ones to right of S-circuit 555.9). Alternatively or additionally, the appointed, daughter S-circuit may have its own nonleaf SH's (like SH-D6) that appoint granddaughter S-circuits and so on. Inside the appointed, daughter S-circuit (e.g., 555.6) there will be a corresponding, I-pointer 594 pointing to a respective daughter I-circuit 597. The latter will point to a respective, daughter T-circuit 591. The latter DT-cir 591 will define the internal interconnect topology of non-leaf X-circuit 588. In the illustrated example, entry 6 of part 584b of the X-cir tracking table(s) 584a/584b of mother T-circuit 517' points-to the non-leaf X-circuit 588 associated with DT-cir 591. If desired, an optional backdoor pointer 589 may be included in X-circuit 588 for pointing to daughter T-circuit 591 and thereby supplementing the logical connection that is already established by virtue of SH-D6 appointing S-circuit 555.6 as its leader.

Among the possible alternatives to use of pointers for grouping together isostatic instances such as that of group 593, grouping may be accomplished by physically shuffling the respective data objects in tracking tables such as 579, 583a, 584a and 584b; or by forming such associations with linked-lists; or by forming other associating constructs as are known to those skilled in the art of computer programming. The basic points are that S-circuits (e.g., 555.3, 555.6, 555.9) may be organized so as to simplify the finding of those S-circuits, or those internal parts (S-parts) of such S-circuits that have same topology-definitions (e.g., a common leaf T-circuit 507") and same geometry-instantiations (e.g., a common leaf I-circuit 506") and same external node states (see 554e of FIG. 5B) so that it can be determined automatically that such S-circuits (or S-parts) are both isomorphic and iso-static and can therefore have their behavior predicted by a shared simulation engine (see 508 of FIG. 5B) or by a shared set of plural simulation-engines (e.g., those appointed by the leaf SH's of daughter S-circuit 555.6).

Having explained some of our end objectives in FIGS. 5A-5C, we are now ready to discuss how a SPICE-like subcircuit data structure (FIG. 6A) may be converted into data structures that respective define Primitive subcircuits (PsubCKT's), T-circuits, G-cards, I-circuits, S-circuits, S-parts, and so forth.

Referring to FIG. 7A, a sample, SPICE-like and partially-transformed subcircuit card is shown at 750 and is internally drawn to correspond with the drawing in FIG. 6A of source subcircuit card 600. At the end of the transformation process, subcircuit card 750 along with model cards 754 and parameter cards 755 will have been used to create a first data structure in accordance with the disclosure, namely, a primitive subcircuit structure 700 or a 'PsubCKT'. Such a PsubCKT 700 may include: (1) a first pointer 705 to a respective first set 765 of renaming tables denoted as 710, 720 and 730; (2) a second pointer 706 to a second set 766 of interconnect topology defining tables denoted as 719, 729 and 739; (3) a third pointer 707 to a third set 767 of model/geometry defining data structures, including an X-elements defining table 727; (4) a fourth pointer 708 to a variables relationships defining card 758; and (5) an indexed array 709 of pointers to daughter PsubCKT's, where such PDaughters (709) may be considered children of the illustrated, parent PsubCKT 700. Each such PDaughter is understood to have a structure similar to that of parent PsubCKT 700 and to have a corresponding suite of data structures similar to those of PsubCKT 700, including the renaming card 765, the T-circuit card 766 and the instantiable G-card 767.

As seen in the rendition of input card 750, the arbitrarily long names of nodes (Nx's, Ni's), elements (Ei's) and X-circuits (Xi's) of the corresponding SPICE-like subcircuit (e.g., 600 of FIG. 6A) are being replaced by grouped sets of index values (e.g., integers). A first sequence of unique index values denoted as J1, J2, . . . , Jn are being assigned to the nodes. A second sequence of unique index values denoted as K1, K2, . . . , Km are being assigned to the locally-declared elements. And a third sequence of unique index values denoted as Q1, Q2, . . . , Qw are being assigned to the locally-declared X-circuits. Each respective set of internally unique index values is mapped to a respective one of the source file names it replaces. In one embodiment, the arbitrarily long names of nodes, elements and X-circuits are converted into unique, but generally shorter, hashed names by passage through an appropriate one-way, hashing function. The hashed names (e.g., Axxx, Bxxx, . . . , Zxxx) are sorted alphabetically, numerically or otherwise for enabling quick lookup. A unique index number is then assigned to each respective one of the hashed node names and/or each of the hashed element names and/or each of the hashed X-circuit names thereby defining a hash map by way of which the index value of each long-named item can be looked up.

It is seen in column 711 of the nodes-renaming that hashed and alphabetically ordered names such table 710 as Axxxx and Bxxxx, etc., have been substituted for the proper names (e.g., nex_1, nex_2, G1) that may have been assigned to various nodes of a given subcircuit originally such as 600 of FIG. 6A. In an alternate embodiment, the original names may be used. It is further seen in column 712 of the nodes-renaming table 710 that an ordered sequence of unique index values (e.g., integer numbers) have been mapped or otherwise assigned to respective ones of the hashed, node names. For purposes of generality here, it is assumed that an index number J1 is assigned to the hashed (or plaintext) name associated with external node Nx1, J2 is assigned to the name associated with external node Nx2, and so forth. Additional ones of such index values are similarly assigned internal nodes (Ni's) such as Ni98 and Ni99 as is seen in the index-holding column 712. Because there are two different kinds of nodes, external (Nx's) and internal (Ni's), the nodes renaming table 710 is preferably divided into two parts. A top part 703 contains all the name-to-index mappings for the external nodes (Nx's) while the remainder of table 710 services internal nodes (Ni's) A field 702 near the top of the renaming card 765 defines the number of external ports and thus the size of region 703.

Figure 7B:
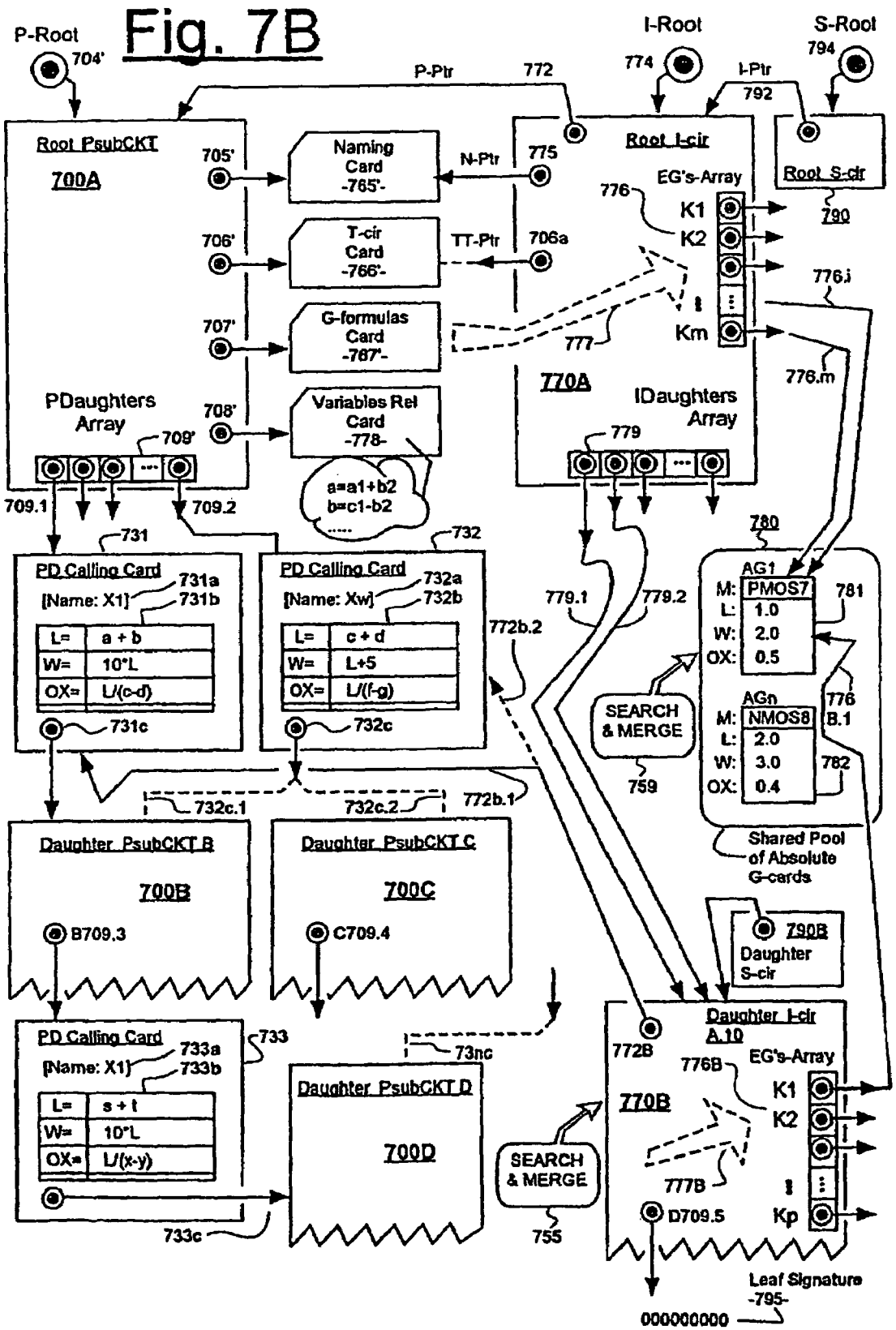
FIG. 7B illustrates how parent and child PsubCKT's (P-circuits) and how parent and child I-circuits can logically interrelate with one another for finding isomorphic instances.

As seen in the elements-renaming table 720, a similar strategy is used for mapping renaming-index-values to the internal elements (Ei's) of the original subcircuit. Here, the index number representatives are denoted as K1, K2, etc. instead of J's so that the reader can easily see how simple index values have replaced proper names and which index values come from which renaming-table. If desired, an overlap may occur between the index values (e.g., integers) assigned to the K series of indices and to the J series of indices. It is further seen that in the X-circuits renaming table 730 a similar approach is taken for renaming the X-circuits of the subcircuit with index values. This time the index values are referenced by Q designations. FIG. 7D illustrates in legend form, in portion 769 thereof, how nodes that are now named by J-series index numbers form the vertices of interconnect graphs that are, populated by explicitly-expressed elements (EK's) and/or called X-circuits ($X_Q$'s) where the latter two are respectively named by K-series and Q-series index numbers. The graph links are also implicitly denoted as $L_{JK}$ and $L_{JQ}$. A similar concept is further shown in portion 768 of FIG. 7C wherein nodes $N_1$ and $N_2$ are assumed to be external ones (Nx's), nodes $N_3$ and $N_4$ are assumed to be internal ones (N 's), and elements $E_1$ and $E_2$ plus nodes $N_1$-$N_3$ are interconnected such that these portions of the subcircuit 768 could be pushed-out as a partition 768a and re-expressed within 768 as an X-circuit ($X_3$).

Later, when we discuss FIGS. 8A-8B, we will see how a 'partition' data structure (PR 863) may be converted into an X-circuit call (864), where the latter X-circuit call references a new, budded-out T-circuit (870) and the new T-circuit is added to subcircuit definitions as part of a new daughter PsubCKT (869). It will also be appreciated that a reverse, debudding or flattening process may take place. What used to be an X-circuit 864, may be converted into a pushed-in partition 863 while the corresponding daughter PsubCKT 869 is absorbed into the mother PsubCKT 860. In order to accommodate such absorption, an additional data structure 740 is provided in each PsubCKT, and this further data structure is referred to as a Flattened Children array 740 as seen in FIG. 7A. If all the pointers, Q1, Q2, Q3, etc. of the Flattened Children array 740 are each a null or each points to a null (0) indicator, that condition is understood by the software to indicate that there are no PDaughters (e.g., 869) that have been absorbed and that the renaming card 765 is complete as is for the corresponding PsubCKT 700. On the other hand, if a given one of the pointers, (e.g., Q3), in the Flattened Children array 740 points to another renaming card (743), that condition is understood by the software to indicate that the corresponding PDaughter of index-wise matched array 709 has been absorbed or re-absorbed into the mother PsubCKT 700, and that during simulation, the corresponding Qi-th (e.g., Q3) call to an X-circuit in table 739 of the mother T-circuit 766 is to be treated, not as an X-circuit, but instead as a flattened part of T-circuit 766 (as an extension to tables 719 and 729). The renaming card (743) of the absorbed PDaughter is structured the same as the mother renaming card 765 and thus may itself have a Flattened Children array (740' not shown) with a non-null pointer to a granddaughter primitive circuit card (PsubCKT) and so on. Thus a hierarchy of absorptions may be supported. And of course, a hierarchy of de-absorptions (debuddings or partition pushing-outs) may also be supported wherein the number of PDaughters (non-null pointers in arrays 709 and 740) assigned to a given PsubCKT 700 will have increased rather than decreased.

As part of the process of generating a PsubCKT data structure 700 from an input source description such as 750, a generically-searchable topology-describing data structure or T-circuit 766 may be produced. In FIG. 7A, the T-circuit data structure is shown crudely as including a nodes pointers table 719 (or an equivalent therefor), an elements pointers table 729 (or an equivalent therefor) and an X-cir pointers table 739 (or an equivalent therefore). In FIG. 8B we will show in more detail how such tables may be used to describe an interconnect topology. The T-circuit 766 of FIG. 7A is preferably devoid of model names, model parameter expressions, and long, complicated names for nodes, elements and X-circuits. Instead, it may be comprised of simple descriptors for defining a directed graph or its equivalent. In one embodiment, positions in indexed tables 719, 729 and 739 (e.g., positions identified by index numbers) are used for representing respective external and internal nodes (X-nodes), for representing locally-declared elements (X-elements) and for representing called and externally-disposed, other subcircuits (X-circuits). Similarity of topology between two or more T-circuits may be established by determining automatically or otherwise that two T-circuits such as 766 (only one shown) have a same number of table positions in table 719 for identifying their external and internal nodes and have topologically equivalent ways for identifying which terminals of symbolically represented X-elements of table 729 and X-circuits of table 739 connect to which Nx's and Ni's. General methods for proving equivalence amongst directed graphs are known to those skilled in that art and as such they will not be repeated herein. Of course, other symbolic methods besides table positions may be used to represent nodes, elements and called subcircuits. For example alphabetic letters may be used in place of the indexed table positions to represent such items. The point is to strip away the complexities associated with the assigning of proper names to nodes, elements and X-circuits; and to replace those with more generic or pronoun-like names (e.g., index numbers) and to thereafter use equivalence proving methods from the art of directed graphs to determine which two or more T-circuits such as 766 are graphically equivalent to one another. Finding equivalence of interconnect topology is one of the requirements for proving isomorphism as was explained for FIG. 4A. If a same T-circuit card 766 is to be used for two PsubCKT's like 700 whose names are ordered differently, then of course, the entries in one of the renaming cards 765 will have to be shuffled so that the table positions of the names of nodes, elements and X-circuits in card 765 align with the positions of the same items in a shared T-circuit card 766.

One should note what is happening when a T-circuit card such as 766 is formed as a generic substitute for the interconnect topology information originally provided in a source file description of a corresponding subcircuit Intermediate circuit card 750 corresponds to circuit card 600 of FIG. 6A except that all the proper names for nodes, elements and X-elements have been replaced by index numbers (or in an alternative embodiment, by other like, generically-usable renaming symbols). Thus it is seen in region 713 that the transistor which used to be called Mel_1 is now simply referenced by index number K1. (The square brackets around Mel_1 indicate that the text 'Mel_1' has been deleted.) This index number K1 is understood to corresponding to the K1-th table entry in each of elements renaming table 720, elements pointers table 729, and elements instantiating pointers table 727 (to be described shortly). Similarly, in region 714 of our transition-illustrating card 750 it is seen that the internal nodes which used to be properly named as D, G, S and B are now instead generically called out by respective index numbers J1, J2, J3 and J4.

In this particular embodiment, the full proper names for the model name 715 and the instantiating parameter expressions 716 are maintained and transferred as such into instantiation cards (see FIG. 7C) that are pointed to by the elements instantiating pointers table 727 of G-card (Geometry card) 767. It is, however, within the contemplation of the disclosure to further map model names to index numbers and/or to map parameter names and/or parameter-defining expressions (formulas) to index numbers and to use such index numbers as referencing substitutes if so desired.

It is implied by region 717 of FIG. 7A that the proper names for external subcircuits are kept and copied into X-circuit naming positions such as 701 of the called, daughter PsubCKT even though in the calling PsubCKT 700 an index number such as Q2 replaces the called proper name, Xcir-5 of the calling instance of region 723. In an alternate embodiment, one could map each proper name (e.g., CKT-NAME-2) to a pointer, where the latter pointer points to a nameless PsubCKT (one not having a field 701). However, in the illustrated embodiment, each PsubCKT 700 includes a name field 701 which identifies it by its proper circuit name. It is, however, within the contemplation of the disclosure to also re-map these into index numbers or pointers if so desired.

Advantages of the index-numbers based, primitive subcircuit card 700 include the characteristic that it and it various parts (particularly the G-card 767) can be made relatively small in size because these data structures rely on indexed table positions for establishing cross-correspondence between names (765), interconnect topology definitions (766) and model/geometry instantiating information (767) instead of requiring searches through arbitrarily long names and traces through complex pointer schemes for nodes, elements and X-circuits. When we get to FIG. 7B, we will see that a G-card (767') can act as template for stamping out (777B) many daughter I-circuits with their respective, element instantiating arrays (776B). The index-based form of correlating element instantiations with T-circuits avoids addressing problems that would crop up with pointer-based forms of cross correlation. On the other hand, it is within the contemplation of the disclosure to use other forms of cross correlating elements with their proper names and their places in an interconnect topology and their geometric instantiations, including using mapping trees, linked lists, or the like.

To briefly summarize what we have described thus far, the naming information within a source, subcircuit defining card (e.g., 510, 750) is preferably separated away from topology and geometry defining information; and moved as indicated by arrow 751 into an index-based or other form of Names-holding DataBase (NDB 765). The interconnect topology information within a source, subcircuit defining card is preferably separated away from naming and geometry defining information; and moved as indicated by arrow 752 into an index-based or other form of Topology-defining DataBase (TDB 765). The model calling and parameter-passing information (e.g., 715, 716) within a source, subcircuit defining card is preferably separated away from topology and geometry defining information; and moved as indicated by arrow 753 into an index-based or other form of Formula-based, Geometry-defining DataBase (F-GDB 767).

The Formula-based, Geometry-defining DataBase (F-GDB 767) can include not only the index-based, elements-instantiating pointers table 727, but also additional model cards 754 for defining various default settings for respective models, and parameter cards 755 for defining various interrelationships between variables that are passed between called and calling cards. Some of this interrelationships defining information is transferred into one or more variables interrelationships defining cards 758, where the latter are used during instantiation of variables to resolve formula-based expressions (e.g., a=a1+b2 as shown for card 778 of FIG. 7B). As already explained, pointer 708 of mother PsubCKT 700 may point to a respective one or a linked list of variables interrelationships defining cards 758.

For each X-circuit that is defined in table 739 of T-circuit 766, there should be a corresponding, daughter T-circuit 735 subsumed within a corresponding, daughter PsubCKT 734. Pointer 736 is optional, but is shown in FIG. 7A to clarify the relationship between the X-cir calls 739 of a mother T-circuit 766 in a mother PsubCKT 700 and the called daughter entities 735 and 734. Each PsubCKT (e.g., 700) may include an index-based, PDaughters array 709 whose pointers (e.g., 709.w) point to a respective daughter PsubCKT (e.g., 734) called by its mother 700 (e.g., as non-leaf X-cir number Qw of table 739). FIG. 7A therefore indicates that a hierarchy of mother and daughter PsubCKT data structures (e.g., 700, 734) may be built, and also that a hierarchy of mother and daughter T-circuits (e.g., 766, 735) may be built, and also that a hierarchy of mother and absorbed daughter renaming cards (e.g., 765, 743) may be built. Under the data structures shown in FIG. 7A, the original SPICE-like subcircuit definition (e.g., 600 of FIG. 6A) can be reconstructed from the now-parsed, naming data 765, topology data 766 and geometry data 767, for purposes of verification. However, the data structuring in FIG. 7A is different in that topology-describing data 766 and separated geometry-describing data 767 are now in a search-friendly form. The search-friendly form allows search-and-merge mechanisms (e.g., 578 of FIG. 5C) to more easily find descriptions which define topologically equivalent subcircuits and which further define geometry-wise equivalent subcircuits, thereby identifying isomorphic instances.

FIG. 7D illustrates the concept in a simplified form. A topology-describing data structure 766" (T-circuit) has been created which explicitly-expresses the interconnect graph as a simple collection of index-wise identifiable nodes ($N_j$'s), index-wise identifiable elements ($E_K$'s), and 'index-.wise identifiable X-circuits ($X_Q$'s). Geometry definitions ($G_{EK}$'s) for respective elements ($E_K$'s) are provided in a separate, geometry-describing data structure 767" and an instantiation pointer 772" (P/T-Ptr) is provided for linking a respective set of index-wise identifiable $G_{EK}$'s to a respective set of index-wise identifiable $E_K$'s (only one index-wise linked pair shown). The index-wise association of specific elements with specific geometry formulations is indicated by dashed link 771".

Figure 7C:
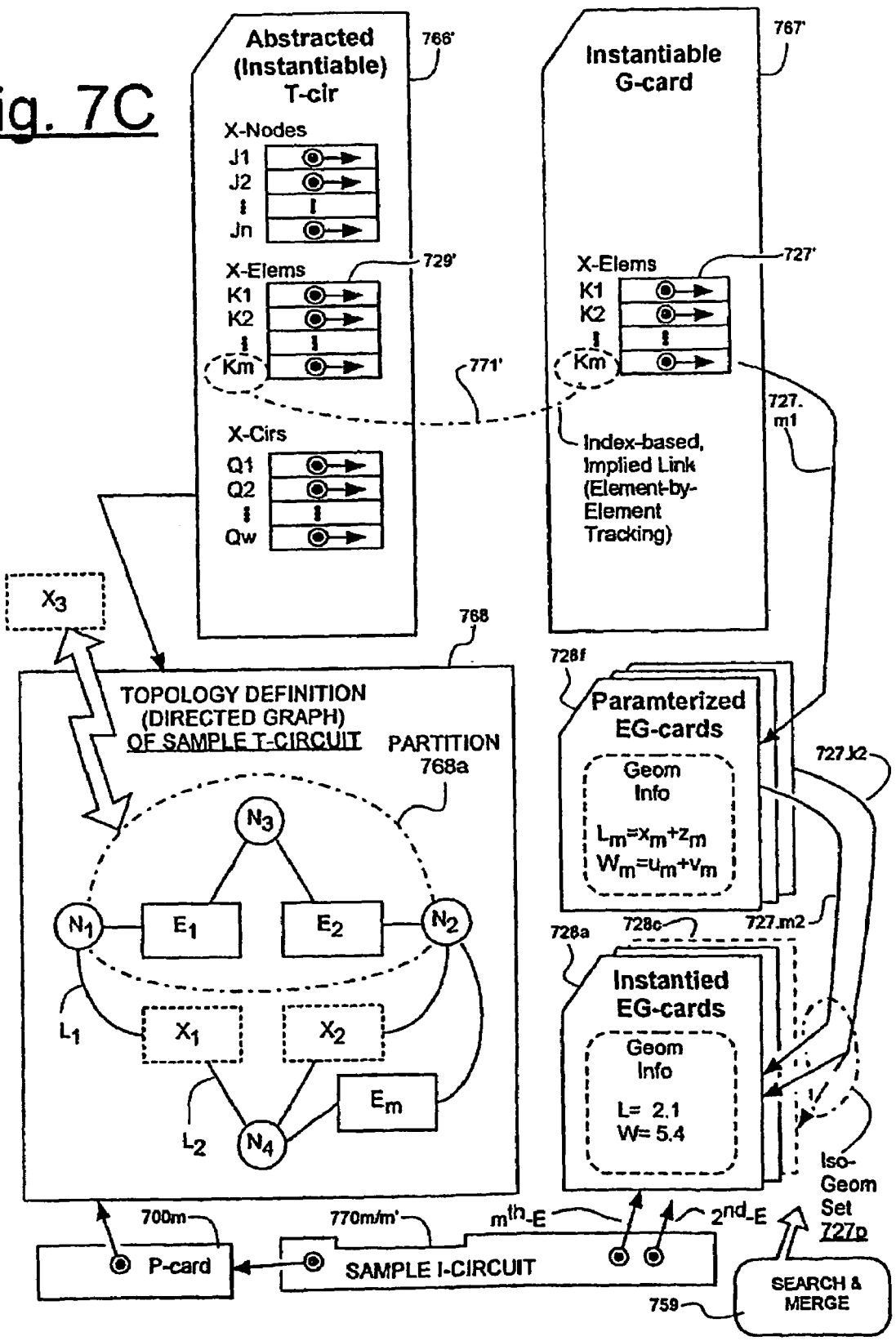
FIG. 7C illustrates how topology-describing data may be re-united with instantiated geometry-describing data by virtue of sets of pointers provided in the corresponding I-circuit (instantiated subcircuit description)
Figure 7D:
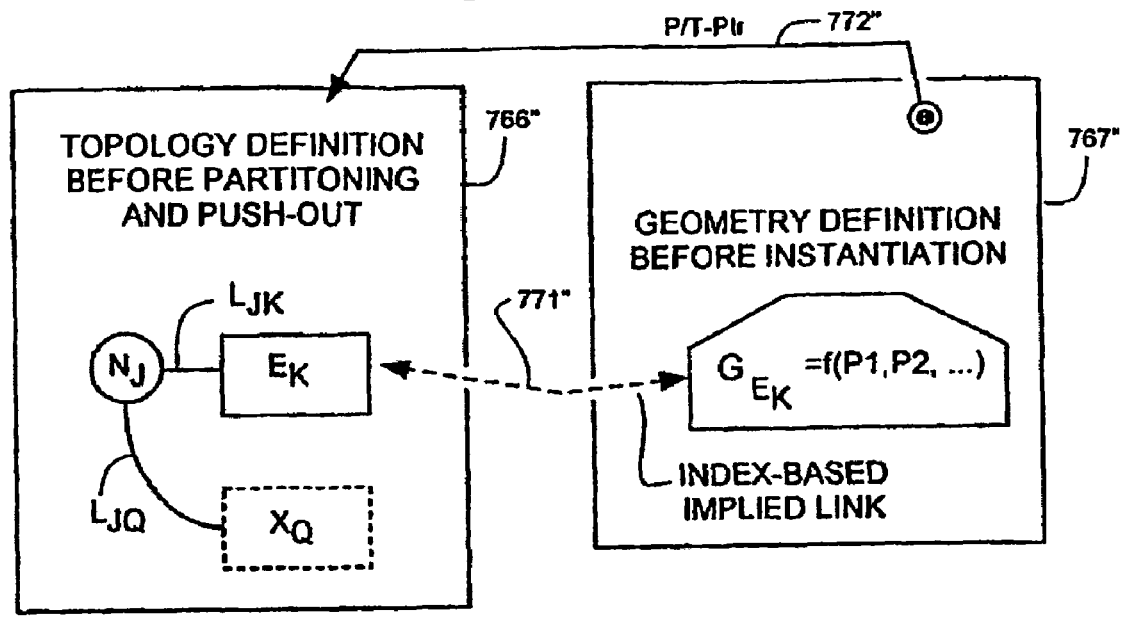
FIG. 7D is a schematic representation of interconnect topology and model/model-parameters interrelationships before geometry-instantiation takes place and before a partitioning and push-out operation is carried out on the topology-describing side.

In FIG. 7C, the concept and its supporting data structures are shown in more detail. An abstracted and instantiable T-circuit data structure is shown at 766'. A formula-based, instantiable G-card data structure is shown at 767'. The index-based, implied link between each K-th element-connection pointer of T-cir 766' and K-th element-instantiating pointer of G-card 767' is represented by dashed line 771'. As seen, each K-th element-instantiating pointer, such as 727.$m$1 for example, points to a formula-based, parameterized, element-geometry card (EG card) 728$f$. During a machine-implemented, expression compiling process, the formula-based, geometry-defining expressions of card 728$f$ are transformed into absolute, geometry-defining expressions which are recorded in card 728$a$. There is created, in correspondence with formula-based pointer 727.$m$1, a new pointer 727.$m$2 which points to corresponding absolute card 728$a$ rather than to formula-based card 728$f$. This transformation of pointers; from having one pointing to formula-based expressions (728$f$) to having another one pointing to absolute-value based expressions (728$a$), is repeated for the reminder of pointers K1-Km in table 727'. During this instantiation of geometry values, an automated search and merge mechanism 759 can scan the absolute value cards (e.g., 728$a$ and 728$c$) and determine if two or more of them are the same (which can happen even if their originating formula cards 728$f$ are not the same). If two or more such absolute value cards (e.g., 728$a$ and 728$c$) are the same, the search and merge mechanism 759 can eliminate the redundant ones and repoint all the corresponding, absolute pointers (e.g., 727.$k$2) to the remaining card 728$a$. Thus an iso-geometric set 727$p$ of elements may be found and their geometry definitions may be merged and thus simplified for purposes of finding iso-geometric sets of elements. Shortly, in FIG. 7B, we will see how G-cards such as 767' may be used to stamp out corresponding I-circuit cards such the one, 770$m$ shown in FIG. 7C. For the moment it is sufficient to understand that if two given I-circuit cards 770$m$ and 770$m$' (only one shown) point directly or indirectly to a same set of absolute G-cards (e.g., 728$a$-728$c$) and to a same T-circuit 766' (which T-cir is schematically shown to represent directed graph 768), then the two I-circuit cards 770$m$ and 770$m$' can be found to represent isomorphic instances of a given subcircuit definition and that these isomorphic representations 770$m$ and 770$m$' can be merged by a search and merge mechanism (e.g., 759) into a single representation 770$m/m$'. Also it may be noted that memory space may be conserved because geometry-wise same elements in a given I-card (770$m/m$') can be represented by pointers (e.g., mth-E and 2nd-E) that point to a shared, absolute EG-card 728$a$. Also, memory space may be conserved because geometry-wise same I-cards point to shared, absolute EG-cards even though their respective T-circuits might not be the same. Additionally, if the T-circuits are partitioned and budded-out (e.g., partition 768$a$ becomes new X-circuit X3), it may be found that what were initially determined to be anisomorphic I-circuits are afterwards found to be isomorphic because the respective T-circuits turn out to be provable as being equivalent after the budding-out process.

Referring to FIG. 7B, we now describe a building method for building the I-circuit cards of an IDB from the P-circuit cards (700A, 700B, etc.) of a PDB. A root PDB pointer 704' is provided in the machine memory to point to root P-card 700A. Internal items such as 705'-709' of the root P-card 700A have already been described to some extent for FIG. 7A and thus need not be redescribed here. One area of difference however is that the PDaughter pointers 709.1, 709.2, etc. are now seen more clearly in FIG. 7B to be pointing to respective PDaughter calling cards such as 731 and 732 instead of directly to daughter PsubCKT's such as 700B, 700C, etc. With each call within a mother PsubCKT (e.g., 700A) to a daughter PsubCKT (e.g., 700B) there will typically be a passing of parameter expressions from the calling to the called subcircuit. The respective PDaughter calling cards such as 731 are structured in one embodiment to comprise a multi-column table as is illustrated at 731$b$. Each row of table 731$b$ includes a first field identifying a parameter that is being defined (e.g., L=) and a second field setting forth an expression string (e.g., "a+b") that is to be evaluated in the instantiation of the corresponding parameter (e.g., L=). Each PDaughter calling card may optionally include a name field such as 731 a which identifies the X-circuit to which the card's parameters are being passed. Each PDaughter calling card (e.g., 731) of the illustrated embodiment further includes a linking pointer 731$c$ to the respective daughter PsubCKT data structure (e.g., 700B) that defines the called X-circuit. Plural linking pointers such as 731$c$ and 732$c$/732$c$.1 may point to a same daughter PsubCKT (e.g., 700B) thereby indicating a possibility that different parameters might be passed by different calls to a same X-circuit. On the other hand, linking pointer 732$c$ of calling card 732 may alternatively point, as indicated by alternate path 732$c$.2, to a different daughter PsubCKT 700C. Each called daughter PsubCKT such as 700B, 700C and 700D may itself define a set of hierarchically called further daughters as is indicated by daughter pointers B709.3 and C709.4. For example, B709.3 points to calling card 733 and the latter's linking pointer 733$c$ points to PsubCKT 700D. The linking pointer(s) 73$nc$ of yet other calling cards may simultaneously point to same PsubCKT 700D. Thus complex hierarchies of parent and child PsubCKT's may be established.

After, or as the respective PsubCKT's, 700A, 700B, 7000, etc., of the PDB are being built and sequentially linked together, corresponding I-circuit data structures 770A, 770B, etc. may be built and linked one to the other. It is shown in FIG. 7B that a root pointer 774 is provided in the machine memory to point to root I-card 770A, where the latter corresponds to root P-card 700A. Internally, the I-card (e.g., 770A) maybe much simpler than its corresponding PsubCKT (e.g., 700A). A P-pointer 772 is included for referencing the respective PsubCKT and through there (through pointer 706'), the underlying, T-circuit 766'. An N-pointer 775 may be optionally included for more quickly referencing the naming card 765', where the latter is also addressable by way of pointer 705' in the PsubCKT 700A. One reason why it may be desirable to include the N-Ptr 775 is so that during waveform observation, various nodes and elements may be more quickly identified by name as compared to having to trace back through pointers 772 and 705'. Another reason is safety and validity checking. If the primary backpointer 772 to the P-card 700A is corrupted for some reason, such corruption may be detected and optionally fixed by scanning for coherency between the destinations pointed to by pointers 705', 775 and for coherency between the numbers of nodes, elements, and X-circuits declared respectively by renaming card 765', T-circuit card 766', and soon-described arrays 776 and 779 of the allegedly corresponding I-circuit card 770A.

For each of the K1 through Km-th elements declared in T-circuit card 766', and formula-wise instantiated in G-card 767' of the corresponding PsubCKT 700A, there will be a corresponding K1 through Km-th element instantiating pointer (e.g., 776.i, 776.m) provided in an elements instantiating array 776 of the I-circuit 770A. The logical link between the instantiating pointers of I-circuit array 776 and the element-related pointers in PsubCKT 700A may be implied by the indexed positions of those pointers in their respective tables. (Alternative methods for expressly linking the various data objects, instead of impliedly linking them, may be used. But as explained above, this tends to add complexity and slow system performance speed.)

Formula-based element definitions (even if absolute in form) are converted into absolute element definitions as indicated by stamping process 777. As the formula-based expressions in G-card 767' (and optionally also in Variables card(s) 778) are evaluated during compilation; corresponding, absolute-valued geometry cards (AG-cards such as 781, 782) are created in shared pool region 780 of the simulation-supporting machine. Respective pointers in the I-circuit array 776, such as 776.1 and 776.m, are caused to point to respective AG-cards within shared pool region 780 in response to the instantiation of their respective G-formula card entries (767') into absolute values. As already explained, a machine-implemented and automatic search-and-merge mechanism 759 scans pool region 780, searching for identical element definitions. If such are found, they are preferably merged into a single AG-card and the I-circuit array pointers of the pre-merge cards are caused to all point to the merged AG-card. By way of example, pointers 776.i and 776.m may initially have pointed to separate AG-cards within region 780. The search-and-merge mechanism 759 may have recognized that those separate AG-cards define a same PMOS-type7 transistor with channel length of 1.0 and width of 2.0 and oxide thickness of 0.5 as does the post-merge card 781. After the merger, pointers 776.i and 776.m point to the same AG-card 781. Such joint pointing to a common AG-card allows the iso-geometry proving software to quickly determine that the underlying Ki-th and Km-th elements of array 776, and of the elements array (729' in FIG. C) are identical.

Because redundant AG-cards are merged in the shared pool 780, if two or more arrays of K1th through Km-th elements of corresponding I-circuit arrays (e.g., 776) in a set of compared I-circuit cards (compared set not shown but 770B can be one of them) respectively point to same ones of AG-cards such as 781, 782, etc., then the iso-geometry proving software of the machine can quickly determine that the underlying and respective elements of those compared I-circuit cards are identical. If the P-pointers (e.g., 772, 772B) of the compared I-circuit cards further point back to a same PsubCKT (e.g., 700A or PD calling card 731), then the isomorphism proving software of the machine can quickly determine that the compared I-circuit cards are isomorphic. Once that is done, the proven-to-be isomorphic I-circuit cards, and respective pointers to and from them, can be merged into single alike I-circuit card by a search-and-merge mechanism such-as 755, thereby urging the IDB to become comprised of only anisomorphic I-circuit cards; as was explained for IDB 530 of FIG. 5A. More later on why P-Ptr 772B goes to a calling card rather than directly to a PsubCKT.

During the build-up of each I-circuit card (e.g., 770A; which card is built by stamping process 777 and by the pointer merging activities of unit 759), it may be desirable to establish a temporary pointer 706a in the under-construction I-circuit card, directly back to the T-circuit card 766' of the corresponding PsubCKT card (e.g., 700A). Information obtained from the T-circuit may be used to verify that correct models are being pointed to by the respective pointers of the I-circuit array 776. For example, if pointer 776.m is caused to point to an AG-card for a transistor (e.g., 781) but the T-circuit card 766' indicates that the corresponding element has only two terminals or more than four terminals rather than 3 or 4 terminals required by the model-specifying card (e.g., 781), then the software can recognize that something has gone wrong and can seek automated or manual help for fixing the mis-point.

In addition to its EG's (element geometries) array 776, each I-circuit of the FIG. 7B embodiment should have an IDaughters array such as the one, 779 shown for the root I-cir. The IDaughters array 779 is index-wise matched with the corresponding PDaughters of array 709' of the co-related PsubCKT, where the latter PDaughters array 709' is further index-wise matched with non-leaf-members of declaring and calling region 587 of FIG. 5C. IDaughter pointers such as 779.1 and 779.2 point to respective daughter I-circuits of mother card 770A. One such daughter I-circuit is shown at 7-70B. It is understood that I-circuit 770B has an internal data structure similar to that of its mother 770A.

One difference however, is that instantiation pointer 772B points to a PD calling card such as 731 or 732 rather than directly to the correspondingly called, PsubCKT. The reason is because a different I-circuit card may be created for each respective PD calling card even though plural ones of such calling cards (e.g., 731, 732/732c.1) may point of a same PsubCKT (e.g., 700B). Each calling card can define a respectively different instantiation of the called PsubCKT. Thus, one version of I-circuit 770B may be built if its instantiation pointer 772B points to PD calling card 731 by way of option 772b.1. And a second and different version of I-circuit 770B may be built if its instantiation pointer 772B points to PD calling card 732 by way of option 772b.2. In one embodiment, search-and-merge mechanism 755 does not merge otherwise alike I-circuits if their instantiation pointers (e.g., 772B) point to different PD calling cards. In an alternate embodiment, search-and-merge mechanism 755 ignores the instantiation pointers (e.g., 772B) and does merge otherwise alike I-circuits, given that their absolute geometries (781, 782, etc.) are identical and their N-Ptr's 775 and/or optional TT-Ptr's respectively point to a same renaming card 765' and/or T-circuit card 766'. It is also within the contemplation of the disclosure to allow for selective switching between being responsive and nonresponsive to differences in the instantiation pointers (e.g., 772B) during search-and-merge (755).

In the illustrated example given for daughter I-circuit 770B, absolute EG-pointer 776B.1 points to AG-card 781 just as do pointers 776.i and 776.m. This indicates to the software that the K1-th element of I-cir 770B is the same as the Ki-th and Km-th elements of I-cir 770A.

Along the hierarchical chains of parent and child I-circuits, there will ultimately be leaf I-circuits that have no I-daughters. In one embodiment, the condition of being a leaf I-daughter is indicated by the all the pointers in the IDaughters array (779) being null or pointing to nulls. Such a condition is shown for purpose of example for IDaughters array D709.5 and its corresponding is-a-leaf signature, 795.

After, or as the respective I-circuits, 770A, 770B, 770C, etc., of the IDB are being built and sequentially, linked together, corresponding S-circuit data structures such as 790, 790A, etc. may be built and linked to their respective I-circuits. It is shown in FIG. 7B that a root pointer 794 is provided in the machine memory to point to root S-card 790, where the latter corresponds to root I-card 770A. Internally, the S-card (e.g., 790) can be significantly different from its corresponding I-cir card (e.g., 770A). It was already shown in FIG. 5C that the SH declarations (579 and 587) may be index-wise matched with leaf and nonleaf, daughter I-circuits. Similarly, external node declarations in each SH of FIG. 5B may be index-wise matched with node declarations in the corresponding T-circuit (e.g., 766' corresponds to I-circuit 790). An I-pointer 792 is included in each S-cir for referencing the respective I-circuit and through there (through P-pointer 772), the underlying, P and T-circuits, 700A and 766'. Accordingly, the pyramid view 550A which was introduced in FIG. 5A is again seen in FIG. 7B.

Figure 8A:
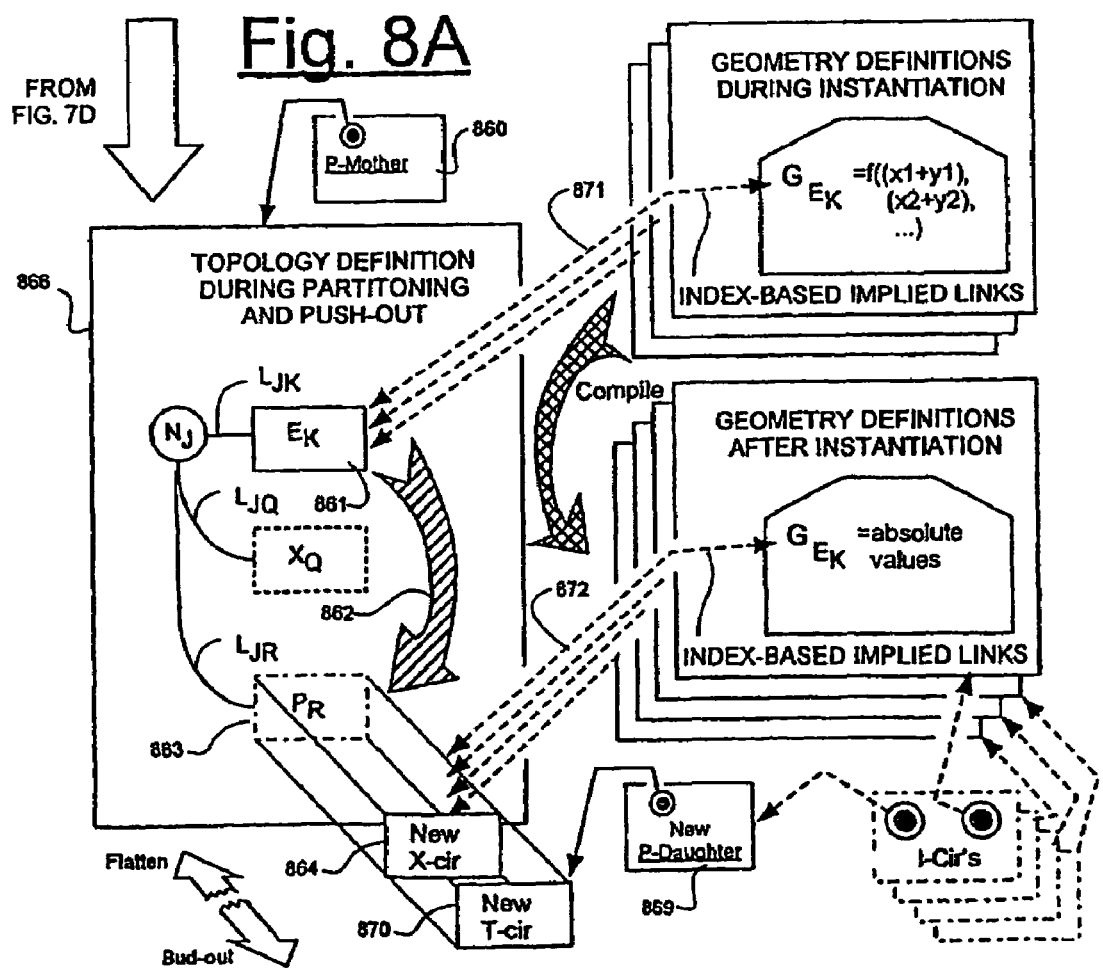
FIG. 8A is a schematic representation for understanding what changes in the interconnect topology-descriptors and what changes in the geometry-descriptors (model/model-parameters descriptors) may take place as respective operations of topology partitioning and push-out take place, and as geometry parameterization (formula development) and instantiation take place.

FIG. 8A re-iterates in simplified form, the concepts of allowing partitioning and push-out (862-864) as well as the opposite, of allowing reabsorption (flattening). FIG. 8A shows this however from the vantage point of starting in FIG. 7D so that we can better see how absolute geometry definitions break away from their spawning, formula-based definitions (767") and thereafter the absolute, instantiated geometry definitions automatically track their respective circuit elements ($E_K$'s) because the-I-circuits point to both the AG-cards and to the topology-describing P-cards (869).

During partitioning, a new entity may be created in a topology-describing, mother P-card 860, namely the partition (PR) 863 shown in schematic representation 866. $E_K$'S may be grouped according to a desired partitioning algorithm (e.g., a common-channel finding one) and respective such groups may be moved into respective partitions (PR's, only one shown at 863). The PR's may then be pushed-out of their home topology-describer 863 and placed in external X-circuits such as 864. The geometry definitions which used to track respective, individual elements in the home topology-describer are broken away and moved with the X-circuit-tracking, I-circuits that respectively reference the new daughter PsubCKT's 869 which have been created for the new X-circuits 864 and their respective T-circuits 870.

If all the elements ($E_K$'s, 861) of a given, parent T-circuit 866 are pushed-out (862) into respective, daughter T-circuits 870, the home topology-describer 866 will be simplified so as to have no internal $E_K$'S. Instead the eviscerated home topology-describer 866 will now have only calls to its original ($X_Q$'s) and new (864) X-circuits, as well as having some of its original nodes ($N_J$'S) and definitions of the links, $L_{JQ}$'s, $L_{JR}$'S that exist between its nodes and the respective terminals of the its called X-circuits. The element terminals ($L_{JK}$'S) have been removed and pushed-out into the new T-circuits 870. The new T-circuits 870 (only one shown) may thereafter be automatically examined and merged with iso-topological, other T-circuits to thereby reduce the complexity of the design definition and to thereby also increase the likelihood that isomorphic I-circuits will be found and merged. The merger of isomorphic I-circuits then increase the likelihood that isostatic S-circuits will be found and merged. The latter step can help to speed simulation because a same or common set of S-part/engine combination(s) 505"/508" (FIG. 5B) may be used to predict the behaviors of many, isostatic S-parts and/or S-circuits.

Figure 8B:
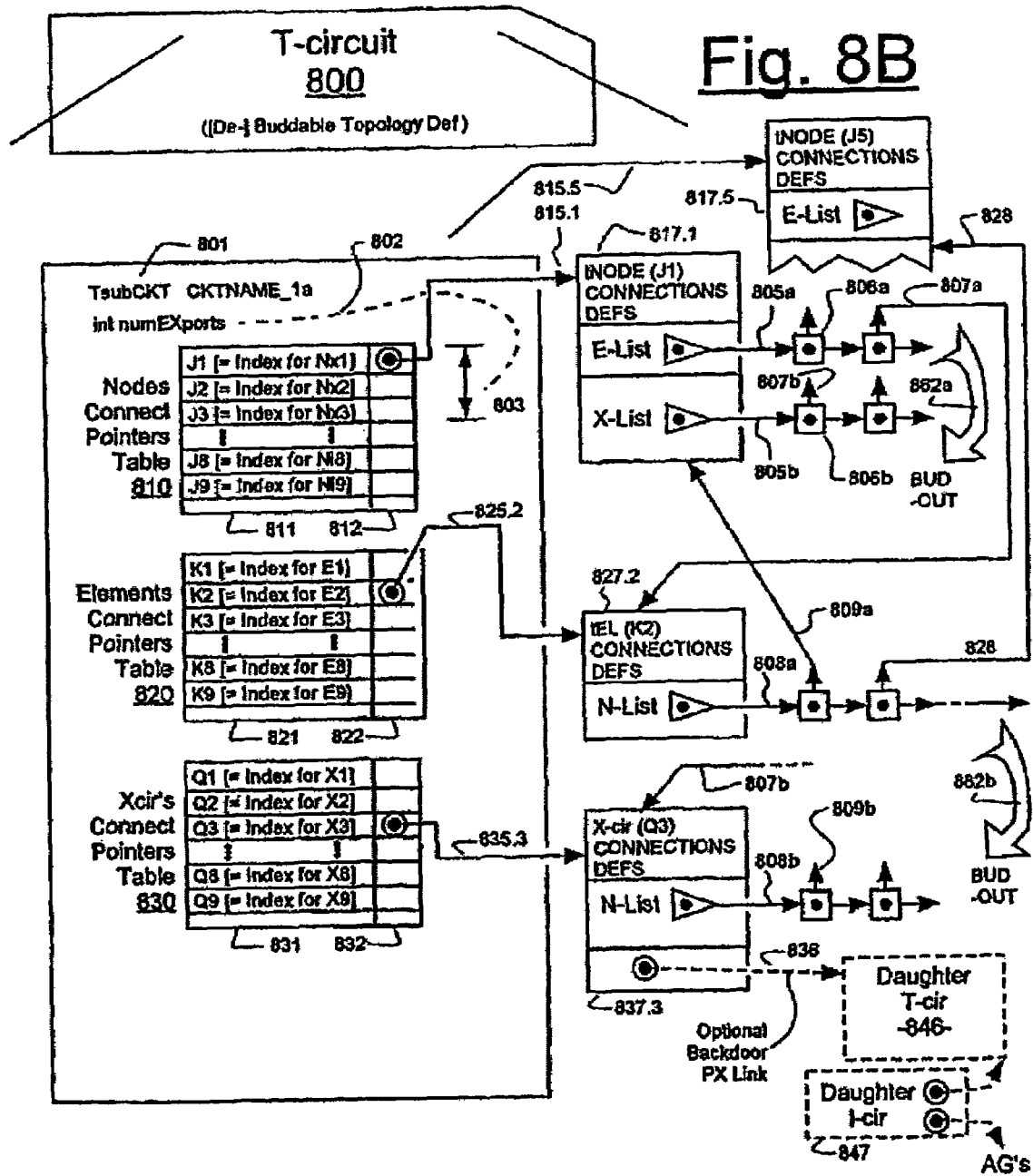
FIG. 8B illustrates a first topology-descriptor data structure (a T-circuit) that may be formed in accordance with the disclosure and shows how geometry-instantiating, other data structures (daughter I-circuits) may logically tie to the topology describing parts.

FIG. 8B illustrates a data structure 800 for representing a buddable and optionally de-buddable T-circuit in accordance with the disclosure. Like-numbered items 801, 802 and 803 correspond to items 701, 702 and 703 of FIG. 7A. As such, they need not be elaborated on.

Within table 810 of the T-circuit card 800, column 811 is optional since sequential row number can used to imply an index number. Alternatively, index numbers or other node-identifiers can be placed in column 811, thereby allowing sorting of table rows if that is desired. (And if such sorting is allowed, Exports item 802 will define a range of J numbers or symbols that constitute external nodes.) Each row of table 810 should constitute an index-based or an otherwise constituted identification of a respective external or internal node and each row of table 810 should further include a respective, connections-defining pointer such as 815.1 (corresponds to node Nx1 at table position J1) that points to a corresponding, node connections-defining header structure 817.1. Header structure 817.1 contains respective root pointers 805a and 805b for two respective linked-lists, one (the E-list) that identifies the elements connected to the node (e.g., node Nx1 of row J1) and the other (the X-list) that identifies the X-circuits connected to the same node (Nx1). Members of the 805a linked list (the E-List), such as member 806a, each have a pointer such as 807a that identifies a respective element coupled to that node (Nx1). In the illustrated example, 807a does so by pointing to an element connections-defining header structure 827.2 (described shortly). Members of the 805b linked list (the X-List), such as member 806b, each have a pointer such as 807b that identifies a respective X-circuit coupled to that node (Nx1). In the illustrated example, 807b does so by pointing to an X-circuit connections-defining header structure 837.3 (described shortly).

Within table 820 of the T-circuit card 800, column 821 is optional since row number can used to imply an index number. Alternatively, index numbers or other element-identifiers can be placed in column 821, thereby allowing sorting of table rows if that is desired. Each row of table 820 should constitute an index-based or an otherwise formed identification of a respective internal element of the T-circuit 800 and each such table row should further include a respective, connections-defining pointer such as 825.2 (corresponds to element E2 of row K2) that points to a corresponding, element connections-defining header structure 827.2. Header structure 827.2 contains a respective root pointer 808a for a respective linked-list (an N-list) that identifies the nodes connected to the given element (e.g., element E2). Members of the 808a linked list (N-List), each have a pointer such as 809a that identifies a respective node coupled to that element (E2). In the illustrated example, pointer 809a does so by pointing to the node connections-defining header structure 817.1. Note that a second member of N-List 808a has pointer 828 going to node connections-defining header structure 817.5, where the latter header is associate with node E5 of row J5 because of corresponding row pointer 815.5 of table 810. These are just examples. It should be apparent that table 810 will have plural row pointers 815.1, 815.2, etc. that respectively correspond with nodes Nx1, Nx2, . . . , Ni5, etc. and respectively point to node connections-defining header structures 817.1, 817.2, . . . , 817.5, etc. Similarly, table 820 will have plural row pointers 825.1, 825.2, etc. that respectively correspond with elements E1, E2, etc. and respectively point to element connections-defining header structures 827.1, 827.2, etc.

Within table 830 of the T-circuit card 800, column 831 is optional since row number can used to imply an index number. Alternatively, index numbers or other X-cir-identifiers can be placed in column 831, thereby allowing sorting of table rows if that is desired. Each row of table 830 should constitute an index-based or an otherwise constituted identification of a respective internal X-circuit of the T-circuit 800 and each such table row should further include a respective, connections-defining pointer such as 835.3 (corresponds to X-circuit X3 or row Q3) that points to a corresponding, X-cir connections-defining header structure 837.3. Header structure 837.3 contains a respective root pointer 808b for a respective linked-list (an N-list) that identifies the nodes connected to the given X-circuit (e.g., called circuit X3). Members of the 808b linked list (N-List), each have a pointer such as 809b that identifies a respective node coupled to that X-circuit (X3) by, for example, pointing to the header structure 817.n of that node Jn. As with the case of tables 810 and 820, it is understood that table 830 will have plural row pointers 835.1, 835.2, etc. that respectively correspond with X-cir's X1, X2, etc. and respectively point to X-circuit connections-defining header structures 837.1, 837.2, etc.

In one embodiment, each X-circuit connections-defining header structure such as 837.3 optionally includes a backdoor, parent-child linking pointer 836 that points to a daughter T-circuit 846, where the latter defines the internal interconnect topology of the called X3 subcircuit. The daughter T-circuit 846 is, of course, not explicitly-expressed inside mother T-circuit 800 (unless there a child absorption causes such) and is therefore shown in dashed box format. Similarly, the corresponding daughter I-circuit 847 is not explicitly-expressed inside mother T-circuit 800 and is therefore shown as a ghost image by way of dashed box format. As seen, I-circuit 847 points to a set of AG-cards and thereby instantiates a respective version of its corresponding T-circuit 846.

If a partitioning and push-out operation (bud-out operation) is carried out on T-circuit 800, those elements which are enclosed in a pushed-out partition (see 768a of FIG. 7C), say element E2 is one of the pushed-out ones, then those pushed-out elements will no longer be considered as being explicitly-expressed in T-circuit 800 but will instead be alternatively, expressed-explicitly in a newly-created daughter T-circuit that corresponds with a newly appended X-circuit, say X10, of the mother T-circuit 800. Internal nodes (e.g., N3 of FIG. 7C) will also no longer be considered as being explicitly-expressed in T-circuit 800 but will instead be alternatively, expressed-explicitly in the newly-created daughter T-circuit. Accordingly, the corresponding connections-defining pointer 825.2 of pushed-out E2 will be nulled or caused to point to an empty header structure 827.2 because E2 is no longer considered to be explicitly-expressed 'inside' T-cir 800. Connection pointers such as 807a will be either deleted or shifted to otherwise point, as indicated by symbol 862a, into X-list 805b—that is if the pushed-out element (e.g., E2) now connects to an external node (e.g., N2 in FIG. 7C) of the new T-circuit. Similarly, all connection pointers of the E2 N-list 808a, such as 809a and 828, will be either deleted or shifted to instead point, as indicated by symbol 862b, into the new N-list (not shown, but similar to 808b) of the newly created X-circuit (e.g., X10).

If all elements of T-circuit 800 are so pushed-out, it can be seen that table 820 of T-circuit 800 will point to either all nulls or to all empty header structures (e.g., 827.2) depending on embodiment. Similarly, the E-list 805a of each node will be emptied while the X-lists 805b of the nodes will generally grow. Additionally, table 830 will expand as new X-circuits are appended to it.

If, on the other hand, all the X-circuits (830) were reabsorbed (debudded), then it can be seen that table 830 of T-circuit 800 will point to either all nulls or to all empty header structures (e.g., 837.3) depending on embodiment. Similarly, the X-list 805b of each node will be emptied while the E-lists 805a of the nodes will generally grow. Additionally, table 820 will expand as new elements are appended to it. A "leaf" T-circuit may be seen in the context of FIG. 8B as one that has no explicitly-expressed X-circuits, but rather just nodes and elements.

FIG. 9A illustrates a machine-implementable method 901 that can be used for building PsubCKT cards in accordance with the disclosure. The routine may be entered at step 910. The first or a next one of sourced subcircuit cards such as 600 of FIG. 6A is fetched in step 911.

In subsequent step 912, table cells or rows for representing respective external nodes (e.g., 703) are created. Such table positions may be created in separate tables 710 and 719 of FIG. 7A. In step 914, further table cells or rows for representing respective external nodes are created, for example in separate tables 710 and 719 of FIG. 7A. It is within the contemplation of the disclosure to have a merged table in which items 765 (names), 766 (T-circuit) and 767 (formula-based G-card) are constituted by appropriately organized table columns or where various table entries are otherwise linked by organizing pointers. In step 916, further table cells or rows for representing respective elements are created, for example in separate tables 720, 729 and 727 of FIG. 7A. In step 918, further table cells or rows for representing respective X-circuits of the being-created PsubCKT, are created, for example in separate tables 730 and 739 of FIG. 7A. If debudding is to be supported, then step 920 may be carried out for creating further table cells or rows for representing respective ones of the flattened children of array 740 of FIG. 7A. If debudding does not have to be supported, then bypass path 919 may instead be taken to subsequent step 921.

In step 921, the now being-created PsubCKT (e.g., 700A, 700B, 700D of FIG. 7B) is linked any superior calling cards related to it by appropriately setting the linking pointers such as 731c and 732c/732c.1 that are supposed to point to it. The root PsubCKT 700A may be understood to have no or a null calling card to it. Daughter PsubCKT's such as 700B, on the other hand, may have many superior calling cards (e.g., 731, 732) relating to them. It is not important where in the sequence of steps 911-924 that step 921 is carried out.

In step 922, further table cells or rows for identifying respective PsubCKT daughters (e.g., 700B, 700Q) of the being-created PsubCKT, are created, for example in separate table 709 of FIG. 7A. In step 924, parameter-passing calling cards such as 731, 732, etc. are attached by way of linked listing (709.1, 709.2) or otherwise to the being-created PsubCKT (e.g., 700A of FIG. 7B). Other routine details for filling out the form of a PsubCKT card such as inserting pointers 705-708 and attaching the various variable relationship cards 758, and initializing the build up of the various linked list structures shown in FIG. 8B do not need to be spelled out here. An artisan of ordinary skill should now understand that item 700A of FIG. 7B has now been constructed with all its pointed-to ancillary structures such as renaming card 765', T-circuit card 766', formula-based G-cards 767', variable relationships describing cards 778, and the calling cards, 731, 732, etc. pointed to by the pointers of array 709'. In step 926 it is determined whether the last of the sourced subcircuit cards has been stamped as a corresponding PsubCKT card. If not, the routine loops back to step 911 to process the next sourced card. If yes, the routine exits at step 929.

FIG. 9B illustrates a machine-implementable method 902 that can be used for building I-circuit cards in accordance with the disclosure. The routine may be entered at step 930. The root or a next one of PsubCKT cards such as 700A, 700B of FIG. 7B is pointed to in step 931.

If the root PsubCKT was fetched then bypass path 933 is taken. Otherwise, in subsequent step 932, the first or next calling card that calls the current PsubCKT is fetched. In step 934, a P-pointer such as 772b.1 is created back to the PD calling card (e.g., 731). If the current PsubCKT is root 700A, then the created P-Ptr (772) instead can point directly back to the root PsubCKT or a dummy calling card thereof (not shown).

In step 936, further table cells or rows for representing respective, absolute-wise instantiated elements are created, for example in EG array 776 or 776B of FIG. 7B. In step 938, absolute value cards (AG's such as 781, 782) are created and filled based on parameters passed by the current calling card and on other values established according to the scoping rules of the simulation language.

In step 940, the pointers of the current EG array (e.g., 776, 776B) are set to point to respective ones of the AG-cards created for them. Search-and-merge mechanism 759 may be activated at this time to compress the number of AG cards used for instantiating alike elements.

In step 942, further table cells or rows for identifying respective I-circuit daughters (e.g., 770B) of the being-created, parent I-circuit (e.g., 770A) are created, for example in separate table 779 of FIG. 7B. In step 944, superior I-circuits are attached by way of linked listing (779.1, 779.2) or otherwise to the being-created I-circuit (e.g., 770B of FIG. 7B). Other routine details for filling out the form of an I-circuit card such as inserting pointers 775, 706a do not need to be spelled out here. An artisan of ordinary skill should now understand that items such as 770A and 770B of FIG. 7B have now been constructed with all their pointed-to ancillary structures linked accordingly. A new I-circuit may be initially created for each PD calling card (e.g., 731, 732, etc.). Step 946 shows this aspect of routine 902. During the phase of creating new I-circuit cards for each calling card, search-and-merge mechanism 755 may be activated to compress the number of I-circuit cards used for instantiating alike calls to alike PsubCKT's.

In step 948 it is determined whether the last called version of the last PsubCKT card has been stamped (777B) as a corresponding I-circuit card. If not, the routine loops back to step 931 to process the next PsubCKT card. If yes, the routine exits at step 939. 102541 The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of an example of possible variations, in FIG. 5B, the states that are recorded for each of the external (exterior) nodes, 501.1-501.5 through 505.1-505.4 of the follower SH's (501, 502, etc.) and the leader S-part 505 do not need to be single-time point values. Instead each can have a best-latest guess waveform recorded for that node, and covering an appropriate expanse of time, in accordance with known, waveform relaxation techniques. The plugged-in simulation driver 508 may then perform a prediction run for a next or the same time expanse, using the waveforms queued-up on each of the exterior nodes of S-part 505 (its waveforms are defined by appropriate voting amongst the followers) and the driver 508 may then produce and record a corresponding one or more response waveforms (505o) for responding ones of the S-part nodes. Those responsive waveforms may then be reflected out per lines 509.2, 592a, 592b of FIG. 5B to other parts of the overall circuit and the simulation run is continued in accordance with known waveform relaxation techniques. And of course, convergence and divergence detectors such as 554L and 554e would be modified in such a case to compare waveforms over appropriate expanses of time rather than comparing single time point states.

In view of the disclosure herein of general concepts and specific embodiments, the scope of protection sought is to be defined by the claims appended hereto.

What is claimed is:

1. A method for building a hierarchical representation of a circuit for simulation, comprising:
    receiving a source file, wherein the source file comprises SPICE-like netlist descriptions of the circuit in a flattened representation;
    generating a primitive database using the source file, wherein the primitive database comprises a geometries-describing section for storing a plurality of primitive subcircuit blocks;
    generating an instance database using the geometries-describing section, wherein the instances database comprises instance subcircuit blocks corresponding to explicitly-expressed primitive subcircuit blocks with predefined geometric values;
    generating a simulation database using the instance database, wherein the simulation database comprises simulation subcircuit blocks corresponding to fully-flattened instance subcircuit blocks, wherein the simulation database comprises simulation subcircuit blocks from different hierarchical branches across a hierarchical structure of the circuit, and wherein the simulation database is generated and maintained on-the-fly;
    simulating the circuit using the simulation database, the instance database, and the primitive database; and
    storing simulation results in a memory device.

2. The method of claim 1, wherein the primitive database further comprises a topologies-describing section and a naming-describing section; wherein the topologies-describing section is separated from the geometries-describing section; and wherein the naming-describing section is separated from the topologies-describing section and the geometries-describing section.

3. The method of claim 1, wherein the primitive database further comprises a plurality of primitive subcircuit blocks, each primitive subcircuit block comprising a primitive connectivity graph describing relationships with respect to other primitive subcircuit blocks, and each primitive subcircuit block is duplicable for generating instance subcircuit blocks having different geometry parameters and/or different state values.

4. The method of claim 1, wherein generating the instance database comprises:
   instantiating instance subcircuit blocks from corresponding primitive subcircuit blocks; and
   converting implicit primitive subcircuit definitions into a corresponding set of instance subcircuit definitions having geometry information associated with the instance subcircuit definitions.

5. The method of claim 4, wherein generating the instance database further comprises:
   merging, on an element-by-element basis, the geometrically instantiated elements of the instance database.

6. The method of claim 1, wherein the instance database further comprises multiple sets of instance subcircuit blocks, each set of instance subcircuit blocks comprises a plurality of instance subcircuit blocks and a connectivity graph describing relationships between the set of instance subcircuit blocks.

7. The method of claim 1, wherein the simulation subcircuit blocks comprise:
   references to corresponding instance subcircuit blocks for storing geometric information of the circuit; and
   references to corresponding topology subcircuit blocks for storing topology information of the circuit.

8. The method of claim 7, wherein the instance subcircuit blocks receive topology information from the topology subcircuit blocks and the simulation subcircuit blocks receive geometric information from the instance subcircuit blocks.

9. The method of claim 1, wherein simulating the circuit comprises:
   selecting an appointed leader for representing behavior of the simulation subcircuit blocks having states substantially close to one another, wherein the appointed leader conforms to a set of predefined criteria, and wherein the remaining simulation subcircuit blocks having, states substantially close to one another are deemed followers;
   simulating the appointed leader; and
   replicating simulation results of the appointed leader to the followers.

10. A system for building a hierarchical representation of a circuit for simulation, comprising:
    at least one processing unit for executing computer programs;
    a user interface for performing at least one of the functions selected from the group consisting of entering a netlist representation of the circuit, viewing representations of the circuit on a display, and observing simulation results of the circuit;
    a memory for storing simulation databases and simulation results;
    means for receiving a source file, wherein the source file comprises SPICE-like netlist descriptions of the circuit in a flattened representation;
    means for generating a primitive database using the source file, wherein the primitive database comprises a geometries-describing section for storing a plurality of primitive subcircuit blocks;
    means for generating an instance database using the geometries-describing section, wherein the instances database comprises instance subcircuit blocks corresponding to explicitly-expressed primitive subcircuit blocks with predefined geometric values;
    means for generating a simulation database using the instance database, wherein the simulation database comprises simulation subcircuit blocks corresponding to fully-flattened instance subcircuit blocks, wherein the simulation database comprises simulation subcircuit blocks from different hierarchical branches across a hierarchical structure of the circuit, and wherein the simulation database is generated and maintained on-the-fly;
    means for simulating the circuit using the simulation database, the instance database, and the primitive database; and
    means for storing simulation results in a memory device.

11. The system of claim 10, wherein the primitive database further comprises a topologies-describing section and a naming-describing section; wherein the topologies-describing section is separated from the geometries-describing section; and wherein the naming-describing section is separated from the topologies-describing section and the geometries-describing section.

12. The system of claim 10, wherein the primitive database further comprises a plurality of primitive subcircuit blocks, each primitive subcircuit block comprising a primitive connectivity graph describing relationships with respect to other primitive subcircuit blocks, and each primitive subcircuit block is duplicable for generating instance subcircuit blocks having different geometry parameters and/or different state values.

13. The system of claim 10, wherein means for generating the instance database comprise:
    means for instantiating instance subcircuit blocks from corresponding primitive subcircuit blocks; and
    means for converting implicit primitive subcircuit definitions into a corresponding set of instance subcircuit definitions having geometry information associated with the instance subcircuit definitions.

14. The system of claim 13, wherein means for generating the instance database further comprise:
    means for merging, on an element-by-element basis, the geometrically instantiated elements of the instance database.

15. The system of claim 10, wherein the instance database further comprises multiple sets of instance subcircuit blocks, each set of instance subcircuit blocks comprises a plurality of instance subcircuit blocks and a connectivity graph describing relationships between the set of instance subcircuit blocks.

16. The system of claim 10, wherein the simulation subcircuit blocks comprise:
    references to corresponding instance subcircuit blocks for storing geometric information of the circuit; and
    references to corresponding topology subcircuit blocks for storing topology information of the circuit.

17. The system of claim 16, wherein the instance subcircuit blocks receive topology information from the topology subcircuit blocks and the simulation subcircuit blocks receive geometric information from the instance subcircuit blocks.

18. The system of claim 10, wherein the means for simulating the circuit comprise:
    means for selecting an appointed leader for representing behavior of the simulation subcircuit blocks having states substantially close to one another, wherein the appointed leader conforms to a set of predefined criteria, and wherein the remaining simulation subcircuit blocks having states substantially close to one another are deemed followers;

means for simulating the appointed leader; and means for replicating simulation results of the appointed leader to the followers.

19. A computer program product, comprising a medium storing computer programs for execution by one or more computer systems, the computer program product comprising:

a simulation module for building a hierarchical representation of a circuit for simulation, wherein the simulator module is used in conjunction with at least a processing unit, a user interface and a memory, and the simulator module includes one or more computer programs containing instructions for:

receiving a source file, wherein the source file comprises SPICE-like netlist descriptions of the circuit in a flattened representation;

generating a primitive database using the source file, wherein the primitive database comprises a geometries-describing section for storing a plurality of primitive subcircuit blocks;

generating an instance database using the geometries-describing section, wherein the instances database comprises instance subcircuit blocks corresponding to explicitly-expressed primitive subcircuit blocks with predefined geometric values;

generating a simulation database using the instance database, wherein the simulation database comprises simulation subcircuit blocks corresponding to fully-flattened instance subcircuit blocks, wherein the simulation database comprises simulation subcircuit blocks from different hierarchical branches across a hierarchical structure of the circuit, and wherein the simulation database is generated and maintained on-the-fly;

simulating the circuit using the simulation database, the instance database, and the primitive database; and storing simulation results in a memory device.

20. The computer program product of claim 19, wherein the primitive database further comprises a topologies-describing section and a naming-describing section; wherein the topologies-describing section is separated from the geometries-describing section; and wherein the naming-describing section is separated from the topologies-describing section and the geometries-describing section.

21. The computer program product of claim 19, wherein the primitive database further comprises a plurality of primitive subcircuit blocks, each primitive subcircuit block comprising a primitive connectivity graph describing relationships with respect to other primitive subcircuit blocks, and each primitive subcircuit block is duplicable for generating instance subcircuit blocks having different geometry parameters and/or different state values.

22. The computer program product of claim 19, wherein the instructions for generating the instance database comprise:

instantiating instance subcircuit blocks from corresponding primitive subcircuit blocks; and converting implicit primitive subcircuit definitions into a corresponding set of instance subcircuit definitions having geometry information associated with the instance subcircuit definitions.

23. The computer program product of claim 22, wherein the instructions for generating the instance database further comprise:

merging, on an element-by-element basis, the geometrically instantiated elements of the instance database.

24. The computer program product of claim 19, wherein the instance database further comprises multiple sets of instance subcircuit blocks, each set of instance subcircuit blocks comprises a plurality of instance subcircuit blocks and a connectivity graph describing relationships between the set of instance subcircuit blocks.

25. The computer program product of claim 19, wherein the simulation subcircuit blocks comprise:

references to corresponding instance subcircuit blocks for storing geometric information of the circuit; and references to corresponding topology subcircuit blocks for storing topology information of the circuit.

26. The computer program product of claim 25, wherein the instance subcircuit blocks receive topology information from the topology subcircuit blocks and the simulation subcircuit blocks receive geometric information from the instance subcircuit blocks.

27. The computer program product of claim 19, wherein the instructions for simulating the circuit comprise:

selecting an appointed leader for representing behavior of the simulation subcircuit blocks having states substantially close to one another, wherein the appointed leader conforms to a set of predefined criteria, and wherein the remaining simulation subcircuit blocks having states substantially close to one another are deemed followers;

simulating the appointed leader; and replicating simulation results of the appointed leader to the followers.

* * * * *